US012622130B2

(12) United States Patent
Bae et al.

(10) Patent No.: US 12,622,130 B2
(45) Date of Patent: May 5, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Sungsoo Bae, Yongin-si (KR); Tsuyoshi Naijo, Yongin-si (KR); Hojung Syn, Yongin-si (KR); Hyosup Shin, Yongin-si (KR); Jiyoung Lee, Yongin-si (KR); Changwoong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 325 days.

(21) Appl. No.: 18/465,294

(22) Filed: Sep. 12, 2023

(65) Prior Publication Data

US 2024/0298457 A1 Sep. 5, 2024

(30) Foreign Application Priority Data

Feb. 24, 2023 (KR) ........................ 10-2023-0025286

(51) Int. Cl.
*H10K 50/12* (2023.01)
*H10K 50/15* (2023.01)
(Continued)

(52) U.S. Cl.
CPC ............. *H10K 50/12* (2023.02); *H10K 50/15* (2023.02); *H10K 50/181* (2023.02); *H10K 85/342* (2023.02); *H10K 85/346* (2023.02)

(58) Field of Classification Search
CPC ...... H10K 50/12; H10K 50/15; H10K 50/181; H10K 85/342
See application file for complete search history.

(56) References Cited

U.S. PATENT DOCUMENTS 6,274,980 B1 8/2001 Burrows et al.
7,045,952 B2 5/2006 Lu
(Continued)

FOREIGN PATENT DOCUMENTS

CN 117915677 A * 4/2002 ........... H10K 50/155
CN 113964275 A * 1/2022 ............. H10K 50/19
(Continued)

*Primary Examiner* — Laura M Menz
(74) *Attorney, Agent, or Firm* — Womble Bond Dickinson (US) LLP

(57) ABSTRACT

Embodiments provide a light-emitting device that include a first electrode, a second electrode facing the first electrode, and an interlayer between the first electrode and the second electrode. The interlayer includes an emission layer, and the emission layer includes a first emission layer and a second emission layer. The first emission layer includes a first host and a first-first dopant, or a first host, a first-first dopant, and a first-second dopant. The second emission layer includes a second host and a second-first dopant, or a second host, a second-first dopant, and a second-second dopant. The emission layer includes the first-second dopant and/or the second-second dopant, the first emission layer and the second emission layer directly contact each other, and a thickness of the second emission layer is greater than a thickness of the first emission layer.

20 Claims, 9 Drawing Sheets

(51) Int. Cl.
*H10K 50/18* (2023.01)
*H10K 85/30* (2023.01)

(56) References Cited

U.S. PATENT DOCUMENTS

| | | | | |
|---|---|---|---|---|
| 7,906,226 | B2 | 3/2011 | Matsuura et al. | |
| 11,158,831 | B2 * | 10/2021 | Lee | H10K 50/13 |
| 11,832,467 | B2 * | 11/2023 | Shin | H10K 50/121 |
| 12,274,117 | B2 * | 4/2025 | Naijo | H10K 85/346 |
| 12,356,792 | B2 * | 7/2025 | Lee | H10K 50/13 |
| 2020/0266374 | A1 * | 8/2020 | Ko | H10K 85/6574 |
| 2020/0274087 | A1 * | 8/2020 | Lee | H10K 50/11 |
| 2021/0066596 | A1 * | 3/2021 | Haruyama | C09K 11/06 |
| 2021/0151691 | A1 | 5/2021 | Yoon et al. | |
| 2021/0184135 | A1 * | 6/2021 | Kim | H10K 85/6576 |
| 2021/0284906 | A1 | 9/2021 | Nam et al. | |
| 2022/0029136 | A1 * | 1/2022 | Song | H10K 50/19 |
| 2022/0077416 | A1 * | 3/2022 | Shin | H10K 50/13 |
| 2022/0115619 | A1 * | 4/2022 | Lee | H10K 50/13 |
| 2022/0149293 | A1 * | 5/2022 | Kim | H10K 85/615 |
| 2022/0190276 | A1 * | 6/2022 | Naijo | H10K 85/346 |
| 2022/0199917 | A1 * | 6/2022 | Syn | H10K 85/654 |
| 2022/0209156 | A1 * | 6/2022 | Kim | H10K 85/40 |
| 2022/0223814 | A1 * | 7/2022 | Choi | H10K 85/6574 |
| 2022/0255011 | A1 * | 8/2022 | Lee | H10K 85/633 |
| 2022/0278294 | A1 * | 9/2022 | Kim | H10K 50/11 |
| 2022/0278296 | A1 * | 9/2022 | Hur | C07F 9/5765 |
| 2022/0344609 | A1 * | 10/2022 | Kim | H10K 85/631 |
| 2023/0113852 | A1 * | 4/2023 | Lee | H10K 50/171<br>257/40 |
| 2023/0135170 | A1 * | 5/2023 | Song | H10K 85/6572<br>257/40 |
| 2023/0200213 | A1 * | 6/2023 | Hur | H10K 50/12<br>257/40 |
| 2023/0209852 | A1 * | 6/2023 | Lee | H10K 50/11<br>428/690 |
| 2023/0209860 | A1 * | 6/2023 | Jung | C09K 11/64<br>257/40 |
| 2023/0225145 | A1 * | 7/2023 | Kim | H10K 85/346<br>257/40 |
| 2023/0225185 | A1 * | 7/2023 | Kim | H10K 85/654<br>257/40 |
| 2023/0225191 | A1 * | 7/2023 | Lee | H10K 85/652<br>257/40 |
| 2023/0225198 | A1 * | 7/2023 | Cho | H10K 50/844<br>257/40 |
| 2023/0301134 | A1 * | 9/2023 | Choi | C09K 11/06 |
| 2024/0023361 | A1 * | 1/2024 | Kim | H10K 50/16 |
| 2024/0074310 | A1 * | 2/2024 | Ye | H10K 85/6574 |
| 2024/0147752 | A1 * | 5/2024 | Sung | H10K 50/171 |
| 2024/0155861 | A1 * | 5/2024 | Naijo | C07F 15/0086 |
| 2024/0172471 | A1 * | 5/2024 | Park | H10K 50/858 |
| 2024/0268221 | A1 * | 8/2024 | Kang | H10K 50/00 |
| 2024/0298457 | A1 * | 9/2024 | Bae | H10K 85/654 |
| 2025/0143170 | A1 * | 5/2025 | Kim | H10K 85/6572 |
| 2025/0176354 | A1 * | 5/2025 | Hwang | H10K 85/657 |
| 2025/0194335 | A1 * | 6/2025 | Song | H10K 50/12 |
| 2025/0204246 | A1 * | 6/2025 | Lee | H10K 50/11 |
| 2025/0326730 | A1 * | 10/2025 | Kim | C07D 213/74 |

FOREIGN PATENT DOCUMENTS

| | | | | | |
|---|---|---|---|---|---|
| CN | 114156417 | A | * | 3/2022 | H10K 50/121 |
| CN | 114975811 | A | * | 8/2022 | C09K 11/06 |
| CN | 117998887 | A | * | 5/2024 | H10K 85/30 |
| CN | 118265335 | A | * | 6/2024 | H10K 85/6572 |
| CN | 118555851 | A | * | 8/2024 | H10K 50/165 |
| CN | 119899208 | A | * | 4/2025 | H10K 85/6574 |
| EP | 4064380 | A2 | * | 9/2022 | C09K 11/06 |
| EP | 4203646 | A1 | * | 6/2023 | C09K 11/06 |
| EP | 4203647 | A1 | * | 6/2023 | H10K 50/11 |
| EP | 4210450 | A2 | * | 7/2023 | H10K 50/858 |
| EP | 4284147 | A1 | * | 11/2023 | H10K 85/346 |
| EP | 3859809 | B1 | * | 12/2023 | H10K 85/658 |
| EP | 4358676 | A1 | * | 4/2024 | H10K 99/00 |
| KR | 10-1159374 | | | 6/2012 | |
| KR | 102100620 | B1 | * | 5/2020 | C09K 11/06 |
| KR | 10-2021-0059153 | | | 5/2021 | |
| KR | 10-2021-0076220 | | | 6/2021 | |
| KR | 20210076220 | A | * | 6/2021 | H10K 33/02 |
| KR | 10-2021-0101056 | | | 8/2021 | |
| KR | 10-2022-0033610 | | | 3/2022 | |
| KR | 20220122817 | A | * | 9/2022 | C09K 11/06 |
| KR | 20230027337 | A | * | 2/2023 | H10K 50/19 |
| KR | 20230065431 | A | * | 5/2023 | H10K 85/6576 |
| KR | 102583478 | B1 | * | 9/2023 | H05B 33/02 |
| KR | 102726074 | B1 | * | 11/2024 | H10K 50/865 |

* cited by examiner

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2023-0025286 under 35 U.S.C. § 119, filed on Feb. 24, 2023, in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Light-emitting devices are self-emissive devices that, as compared with devices of the related art, have wide viewing angles, high contrast ratios, short response times, and excellent characteristics in terms of luminance, driving voltage, and response speed.

In an example, a light-emitting device may have a structure in which a first electrode is arranged on a substrate, and a hole transport region, an emission layer, an electron transport region, and a second electrode are sequentially formed on the first electrode. Holes provided from the first electrode move toward the emission layer through the hole transport region, and electrons provided from the second electrode move toward the emission layer through the electron transport region. Carriers, such as holes and electrons, recombine in the emission layer to produce light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include a light-emitting device having improved efficiency and lifespan.

Additional aspects will be set forth in part in the description which follows and, in part, will be apparent from the description, or may be learned by practice of the embodiments of the disclosure.

According to embodiments, a light-emitting device may include a first electrode, a second electrode facing the first electrode, and an interlayer between the first electrode and the second electrode, wherein the interlayer may include an emission layer, the emission layer may include a first emission layer and a second emission layer, the first emission layer may include: a first host and a first-first dopant; or a first host, a first-first dopant, and a first-second dopant, the second emission layer may include: a second host and a second-first dopant; or a second host, a second-first dopant, and a second-second dopant, the emission layer may include the first-second dopant and/or the second-second dopant, the first emission layer and the second emission layer directly contact each other, the first-first dopant and the second-first dopant may each independently include an organometallic compound, the first-second dopant and the second-second dopant may each independently include a delayed fluorescence dopant including boron and nitrogen, and a thickness of the second emission layer may be greater than a thickness of the first emission layer.

In an embodiment, a hole-trapping ability of the second emission layer may be greater than a hole-trapping ability of the first emission layer.

In an embodiment, a metal of the organometallic compound may be Pt or Ir.

In an embodiment, the first electrode may be an anode; the second electrode may be a cathode; the interlayer may further include a hole transport region between the first electrode and the emission layer; and the hole transport region may include a hole injection layer, a hole transport layer, an electron-blocking layer, or any combination thereof.

In an embodiment, the first electrode may be an anode; the second electrode may be a cathode; the interlayer may further include an electron transport region between the second electrode and the emission layer; and the electron transport region may include a hole-blocking layer, an electron transport layer, an electron injection layer, or any combination thereof.

In an embodiment, the emission layer may emit green light.

In an embodiment, the first host and the second host may each independently be a single host or a mixed host.

In an embodiment the first host and the second host may each independently be a hole-transporting host, an electron-transporting host, or a bipolar host.

In an embodiment, a thickness of the first emission layer may be in a range of about 1 nm to about 20 nm; and a thickness of the second emission layer may be in a range of about 20 nm to about 35 nm.

In an embodiment, a weight ratio of the first host to the second host may be in a range of about 1:9 to about 9:1.

In an embodiment, an amount of the first-second dopant and an amount of the second-second dopant may each independently be in a range of about 0.1 wt % to about 2.5 wt %.

In an embodiment, the first host and the second host each independently comprise a compound represented by Formula 301, Formula 301-1, or Formula 301-2, which are explained below.

In an embodiment, an amount of the first-first dopant and an amount of the second-first dopant may each independently be in a range of about 5.0 wt % to about 15.0 wt %.

In an embodiment, the first-first dopant and the second-first dopant may each independently include an organometallic compound represented by Formula 401, which is explained below.

In an embodiment, the first-second dopant and the second-second dopant may each independently include the following moiety:

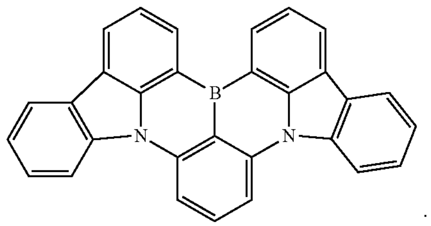 [SMILES: c1cc2c3c(c1)-n1c4ccccc4c4cccc(c41)B3c1cccc3c4ccccc4n-2c13]

In an embodiment, the first-second dopant and the second-second dopant may each independently include a t-butyl group.

According to embodiments, an electronic apparatus may include the light-emitting device.

In an embodiment, the electronic apparatus may further include a thin-film transistor, wherein the thin-film transistor may include a source electrode and a drain electrode; and the first electrode of the light-emitting device may be electrically connected to the source electrode or the drain electrode.

In an embodiment, the electronic apparatus may further include a color filter, a color conversion layer, a touch screen layer, a polarizing layer, or any combination thereof.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will be more apparent by describing in detail embodiments thereof with reference to the accompanying drawings, in which.

DETAILED DESCRIPTION OF THE EMBODIMENTS

Figure 1:
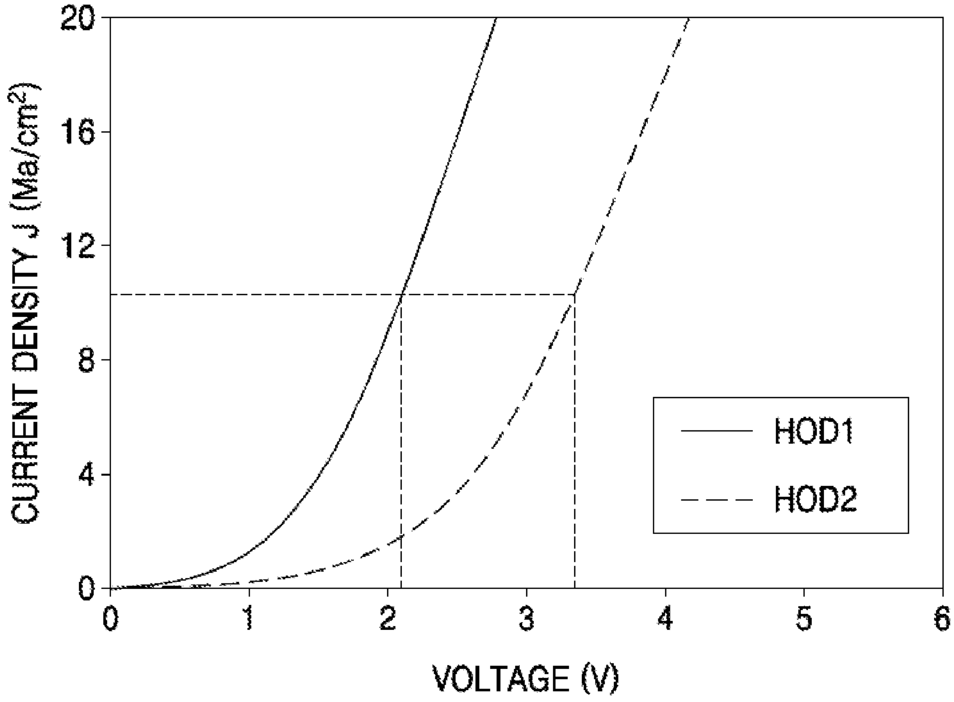
FIG. 1 is a graph showing current and voltage of hole-only devices (HODs)

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like reference numbers and/or like reference characters refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group consisting of" for the purpose of its meaning and interpretation. For example, "at least one of A, B, and C" may be understood to mean A only, B only, C only, or any combination of two or more of A, B, and C, such as ABC, ACC, BC, or CC. When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An embodiment provides a light-emitting device which may include:

- a first electrode;
- a second electrode facing the first electrode; and
- an interlayer between the first electrode and the second electrode, wherein
- the interlay may include an emission layer,
- the emission layer may include a first emission layer and a second emission layer,
- the first emission layer may include: a first host and a first-first dopant; or a first host, a first-first dopant, and a first-second dopant,
- the second emission layer may include: a second host and a second-first dopant; or a second host, a second-first dopant, and a second-second dopant,
- the emission layer may include the first-second dopant and/or the second-second dopant,
- the first emission layer and the second emission layer may directly contact each other,
- the first-first dopant and the second-first dopant may each independently include an organometallic compound,
- the first-second dopant and the second-second dopant may each independently include a delayed fluorescence dopant including boron and nitrogen, and
- a thickness of the second emission layer may be greater than a thickness of the first emission layer.

Green light-emitting devices of the related art include Ir-based or Pt-based dopants. When an Ir-based dopant is applied, there may be advantages in terms of color purity and white angle difference (WAD), but there also may be disadvantages such as high driving voltage and limitations in improving efficiency and lifespan. When a Pt-based dopant is applied, there may be advantages such as low driving voltage, high efficiency, and long lifespan, but there may be disadvantages in terms of color purity and WAD.

In the light-emitting device according to an embodiment, the emission layer may include a first emission layer and a second emission layer, the first emission layer may include a first host, a first-first dopant, and a first-second dopant, and the second emission layer may include a second host, a second-first dopant, and a second-second dopant,

- the first emission layer and the second emission layer may directly contact with each other,
- the first-first dopant and the second-first dopant may each independently include an organometallic compound,
- the first-second dopant and the second-second dopant may each independently include a delayed fluorescence dopant including boron and nitrogen, and
- a thickness of the second emission layer may be greater than a thickness of the first emission layer.

An organometallic complex of a phosphorescent emission layer may have hole-trapping characteristics. As a result, it may be confirmed that a current-voltage graph of a hole-only device (HOD) shifts to the right, as compared with a case in which an HOD includes only a host. For example, a voltage of an HOD including an emission layer including a host and an organometallic complex may be higher than a voltage of an HOD including an emission layer including only a host (at the same current). Accordingly, when an emission zone is concentrated at an interface between a hole transport layer and an emission layer, the lifespan of a device may be affected.

To resolve the above issue, by doping an emission layer (for example, the first emission layer) adjacent to the hole transport layer with an organometallic complex having relatively weak hole-trapping characteristics, and by doping an emission layer (for example, the second emission layer) adjacent to the electron transport layer with an organometallic complex having relatively strong hole-trapping characteristics, an emission zone may be formed at an interface between the first emission layer and the second emission layer, and as a result of moving the emission zone to the center, device performance, for example, lifespan and efficiency, may be improved.

When the thickness of the first emission layer is greater than the thickness of the second emission layer, the efficiency and lifespan of the light-emitting device may be poor.

In an embodiment, the hole-trapping ability of the second emission layer may be greater than the hole-trapping ability of the first emission layer.

The relative ability of an emission layer to trap holes may be evaluated by manufacturing an HOD and measuring the current-voltage thereof. For example, a voltage of an HOD including the second emission layer may be higher than a voltage of an HOD including the first emission layer by 0.5 V (at 10 $mA/cm^2$). When a voltage difference is less than or equal to about 0.5 V, due to weak hole-trapping characteristics, the broad emission zone from an interface between the first emission layer and the second emission layer to the center may move to the electron transport region, thereby reducing device lifespan and increasing driving voltage.

Details of the measurement and evaluation of the current-voltage of an HOD will be described below.

In an embodiment, a metal of the organometallic compound may be Pt or Ir. For example, the first emission layer may include a Pt-based dopant, and the second emission layer may include an Ir-based dopant. For example, the first emission layer may include an Ir-based dopant, and the second emission layer may include a Pt-based dopant. The hole-trapping characteristics of Ir may be relatively greater than the electron-trapping characteristics of Pt. Accordingly, in the light-emitting device according to an embodiment, a Pt-based dopant having relatively weak hole-trapping characteristics may be used in the first emission layer, and an Ir-based dopant having relatively strong hole-trapping characteristics may be used in the second emission layer.

In an embodiment, the first electrode may be an anode, the second electrode may be a cathode, and the interlayer may further include a hole transport region between the first electrode and the emission layer, and the hole transport region may include a hole injection layer, a hole transport layer, an electron-blocking layer, or any combination thereof.

In an embodiment, the first electrode may be an anode, the second electrode may be a cathode, and the interlayer may further include an electron transport region between the second electrode and the emission layer, and the electron transport region may include a hole-blocking layer, an electron transport layer, an electron injection layer, or any combination thereof.

In an embodiment, the emission layer may emit green light. For example, the first emission layer and the second emission layer may each independently emit green light.

In an embodiment, the first host and the second host may each independently be a single host or a mixed host.

In an embodiment, the first host and the second host may each independently be a hole-transporting host, an electron-transporting host, or a bipolar host. A bipolar host may be a host that has both hole-transporting and electron-transporting characteristics. The host will be described below.

In an embodiment, a thickness of the first emission layer may be in a range of about 1 nm to about 20 nm, and a thickness of the second emission layer may be in a range of about 20 nm to about 35 nm. When the thickness of each emission layer is within the above respective ranges, the light-emitting device may have excellent performance.

In an embodiment, a weight ratio of the first host to the second host may be in a range of about 1:9 to about 9:1. For example, the weight ratio of the first host to the second host may be in a range of about 3:7 to about 7:3. For example, the weight ratio of the first host to the second host may be in a range of about 4:6 to about 6:4.

In an embodiment, an amount of the first-second dopant and an amount of the second-second dopant may each independently be in a range of about 0.1 wt % to about 2.5 wt %. The term "wt %" is a ratio that is based on a weight of a host compound included in the emission layer. For example, the amount of the first-second dopant and the amount of the second-second dopant may each independently be in a range of about 0.5 wt % to about 2.0 wt %. When the amount of the first-second dopant and the amount of the second-second dopant are within the above ranges, the light-emitting device may have excellent performance.

In an embodiment, an amount of the first-first dopant and an amount of the second-first dopant may each independently be in a range of about 5.0 wt % to about 15.0 wt %. The term "wt %" is a ratio that is based on a weight of a host compound included in the emission layer. For example, the amount of the first-first dopant and the amount of the second-first dopant may each independently be in a range of about 7.0 wt % to about 11.0 wt %. When the amount of the first-second dopant and the amount of the second-second dopant are within the above ranges, the light-emitting device may have excellent performance.

In an embodiment, a highest occupied molecular orbital (HOMO) energy of the first-first dopant and a HOMO energy of the second-first dopant may respectively have greater values than those of the HOMO energy of the first-second dopant and/or the HOMO energy of the second-second dopant (here, the HOMO energy may be negative). When the relationships between the HOMO energy values are as described above, direct trapping of holes into the first-second dopant and/or the second-second dopant may be suppressed.

Another embodiment provides an electronic apparatus including the light-emitting device.

In an embodiment, the electronic apparatus may further include a thin-film transistor, the thin-film transistor may include a source electrode and a drain electrode, and the first electrode of the light-emitting device may be electrically connected to the source electrode or the drain electrode.

In an embodiment, the electronic apparatus may further include a color filter, a color conversion layer, a touch screen layer, a polarizing layer, or any combination thereof.

The term "interlayer" as used herein refers to a single layer and/or all layers between the first electrode and the second electrode of the light-emitting device.

Figure 2:
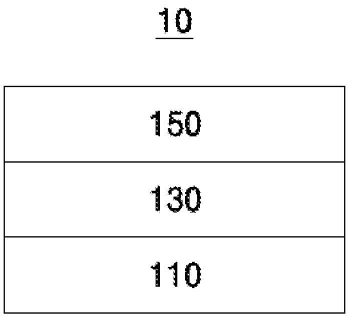
FIG. 2 is a schematic cross-sectional view of a light-emitting device according to an embodiment.

[Description of FIG. 2]

FIG. 2 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described with reference to FIG. 2.

[First Electrode 110]

In FIG. 2, a substrate may be further included under the first electrode 110 or above the second electrode 150. In an embodiment, the substrate may be a glass substrate or a plastic substrate. In embodiments, the substrate may be a flexible substrate, and may include plastic with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In an embodiment, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layer structure of ITO/Ag/ITO.

[Interlayer 130]

The interlayer 130 may be arranged on the first electrode 110. The interlayer 130 may include an emission layer.

The interlayer 130 may further include a hole transport region between the first electrode 110 and the emission layer, and an electron transport region between the emission layer and the second electrode 150.

In an embodiment, the interlayer 130 may further include, in addition to various organic materials, a metal-containing compound such as an organometallic compound, an inorganic material such as a quantum dot, and the like.

In embodiments, the interlayer 130 may include two or more emission layers stacked between the first electrode 110 and the second electrode 150, and at least one charge generation layer which may be each between adjacent units among the two or more emission layers. When the interlayer 130 includes the two or more emission layers and the at least one charge generation layer as described above, the light-emitting device 10 may be a tandem light-emitting device.

[Hole Transport Region in Interlayer 130]

The hole transport region may have a structure consisting of a layer consisting of a single material, a structure consisting of a layer including different materials, or a structure including multiple layers including different materials.

The hole transport region may include a hole injection layer, a hole transport layer, an emission auxiliary layer, an electron-blocking layer, or any combination thereof.

For example, the hole transport region may have a multilayer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein the layers of each structure may be stacked from the first electrode 110 in its respective stated order, but the structure of the hole transport region is not limited thereto.

The hole transport region may include a compound represented by Formula 201, a compound represented by Formula 202, or any combination thereof:

[Formula 201]

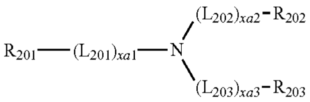

[Formula 202]

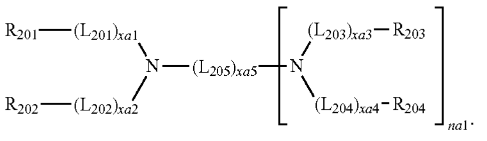

In Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group, etc.) unsubstituted or substituted with at least one $R_{10a}$ (for example, Compound HT16, etc.), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, the compound represented by Formula 201 and the compound represented by Formula 202 may include at least one of groups represented by Formulae CY201 to CY217:

CY201

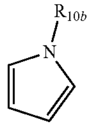

CY202

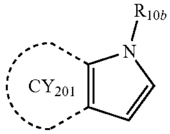

CY203

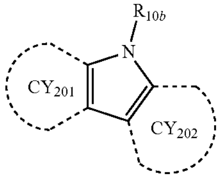

CY204

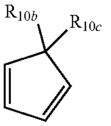

CY205

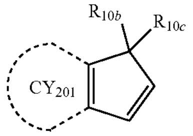

CY206

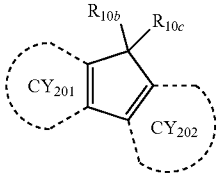

CY207

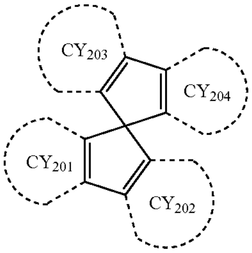

-continued

CY208

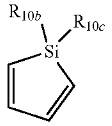

CY209

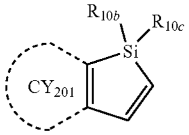

CY210

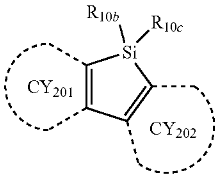

CY211

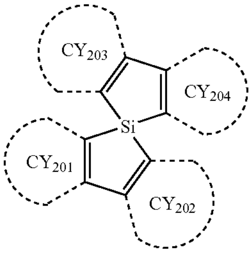

CY212

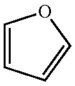

CY213

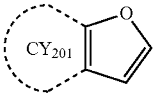

CY214

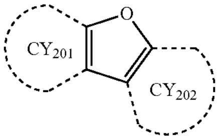

CY215

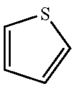

-continued

CY216

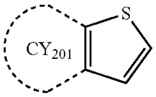

CY217

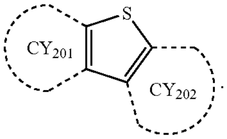

In Formulae CY201 to CY217, $R_{10b}$ and $R_{10c}$ may each be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, ring CY201 to ring CY204 may each independently be a benzene group, a naphthalene group, a phenanthrene group, or an anthracene group.

In embodiments, the compound represented by Formula 201 and the compound represented by Formula 202 may include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, in Formula 201, xa1 may be 1, $R_{201}$ may be one of groups represented by Formulae CY201 to CY203, xa2 may be 0, and $R_{202}$ may be one of groups represented by Formulae CY204 to CY207.

In embodiments, the compound represented by Formula 201 and the compound represented by Formula 202 may each not include groups represented by Formulae CY201 to CY203.

In embodiments, the compound represented by Formula 201 and the compound represented by Formula 202 may each not include groups represented by Formulae CY201 to CY203, and may include at least one of groups represented by Formulae CY204 to CY217.

In embodiments, the compound represented by Formula 201 and the compound represented by Formula 202 may each not include groups represented by Formulae CY201 to CY217.

In an embodiment, the hole transport region may include one of Compounds HT1 to HT47, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
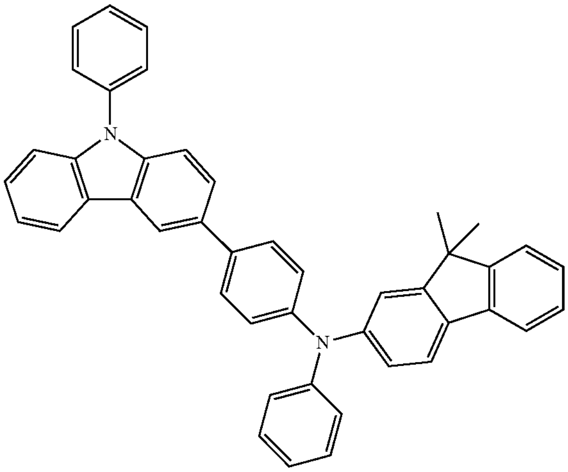
HT2
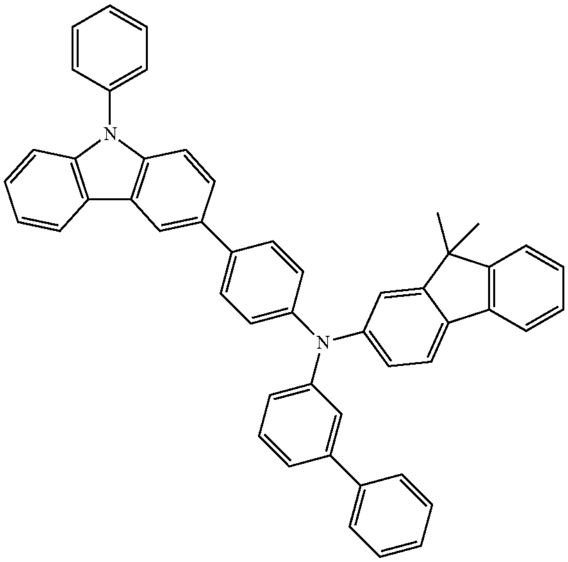
HT3
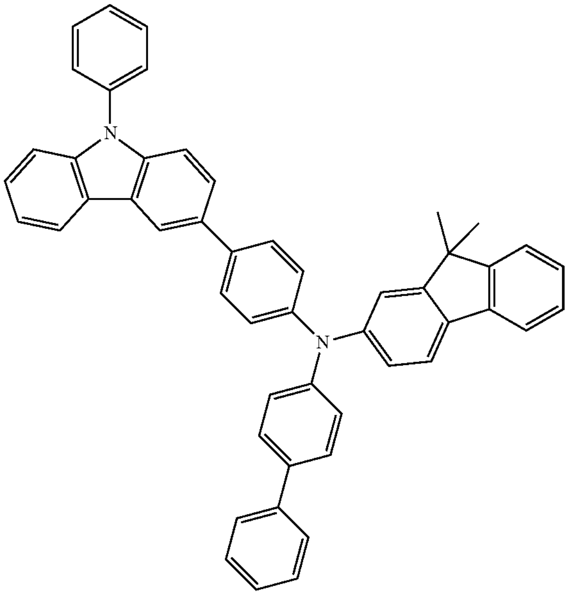
HT4
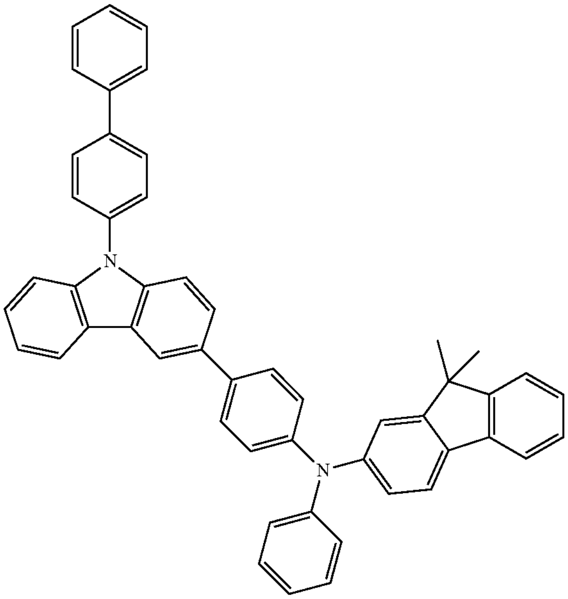

-continued
HT5
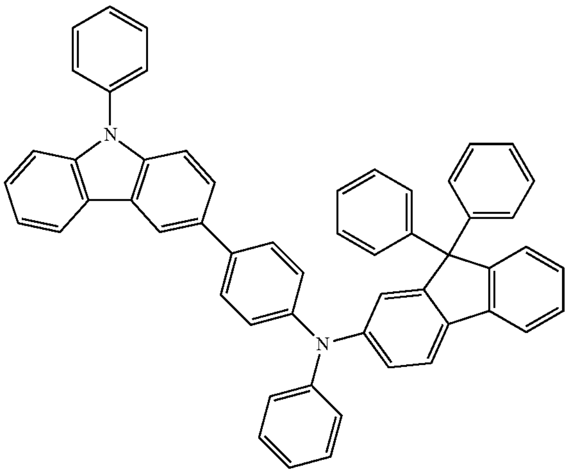
HT6
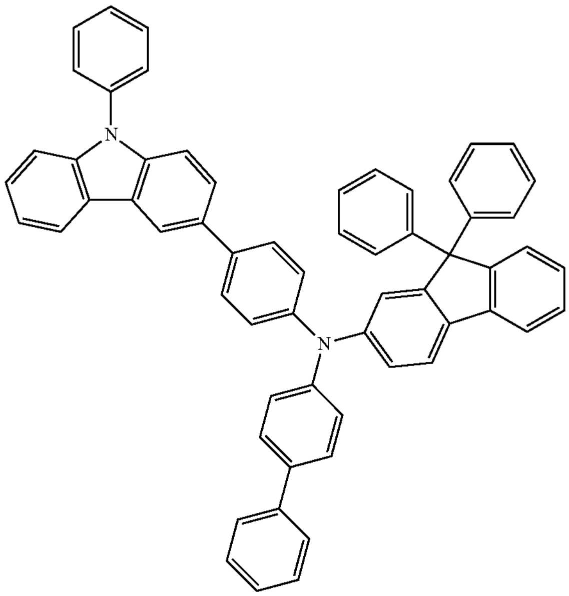
HT7
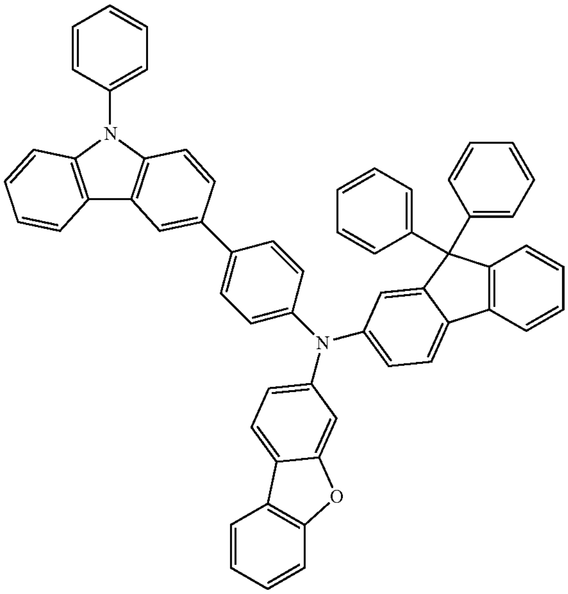
HT8
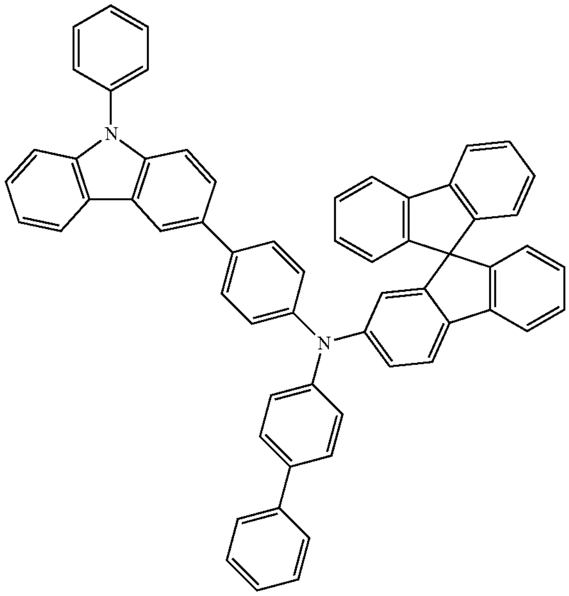

-continued
HT9
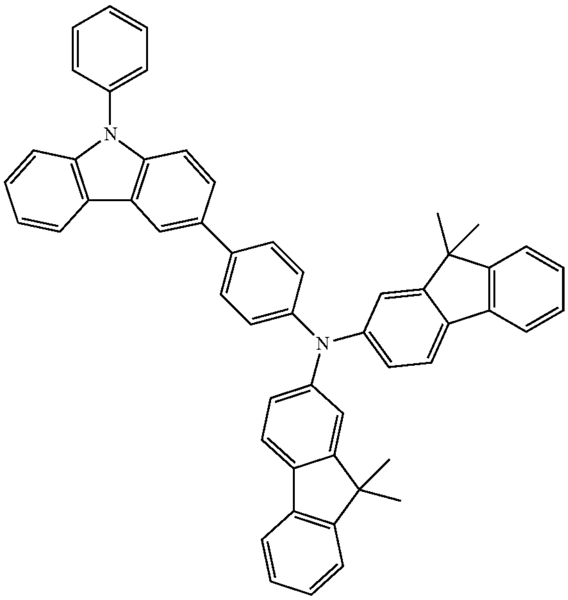
HT10
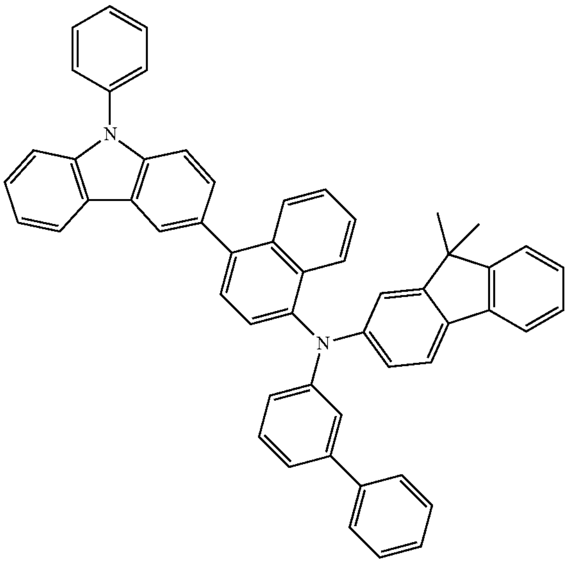
HT11
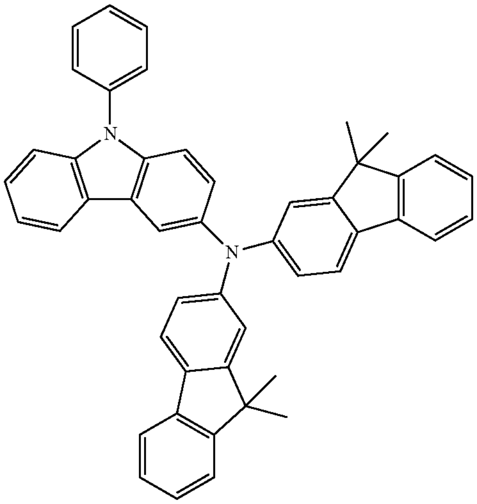
HT12
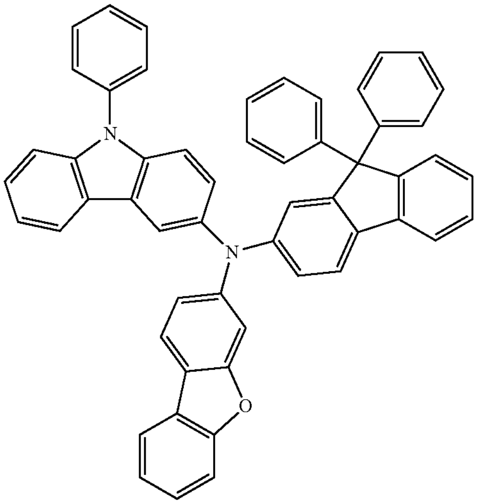

-continued
HT13
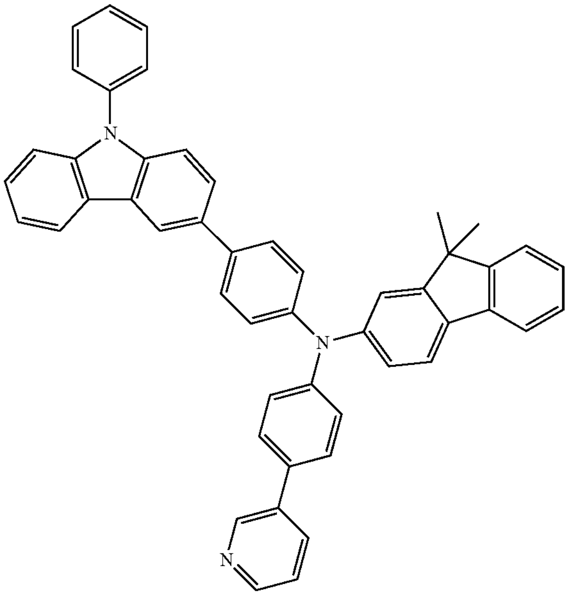
HT14
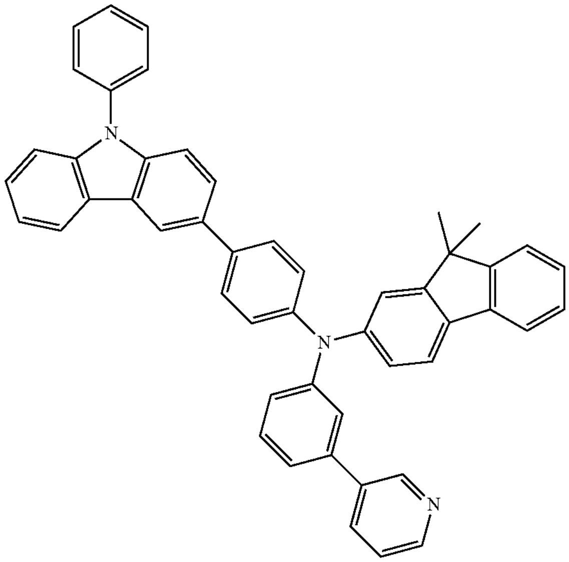
HT15
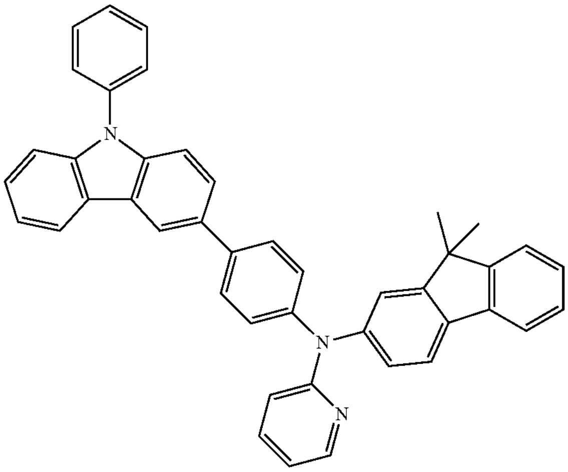
HT16
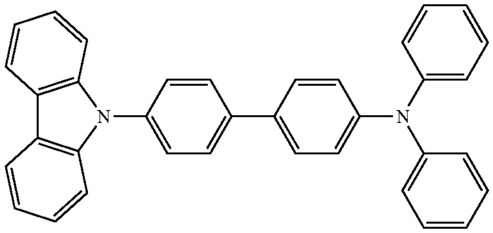
HT17
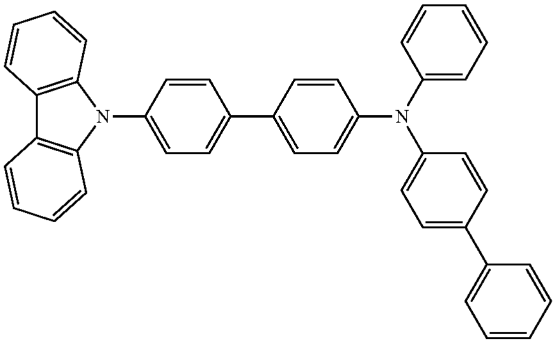
HT18
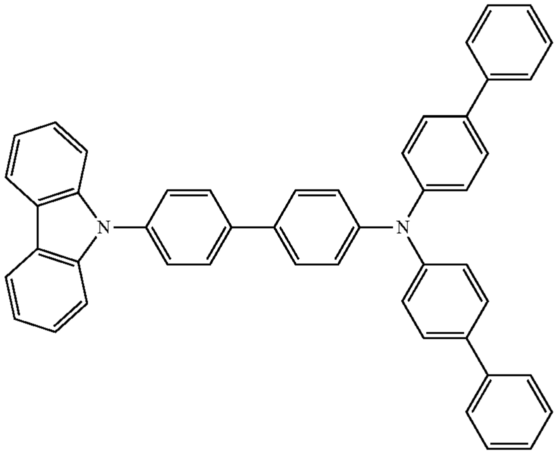

-continued
HT19
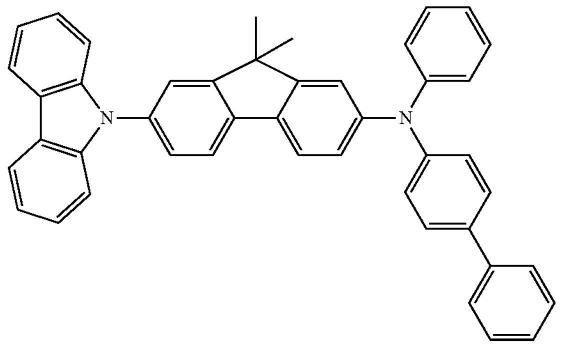
HT20
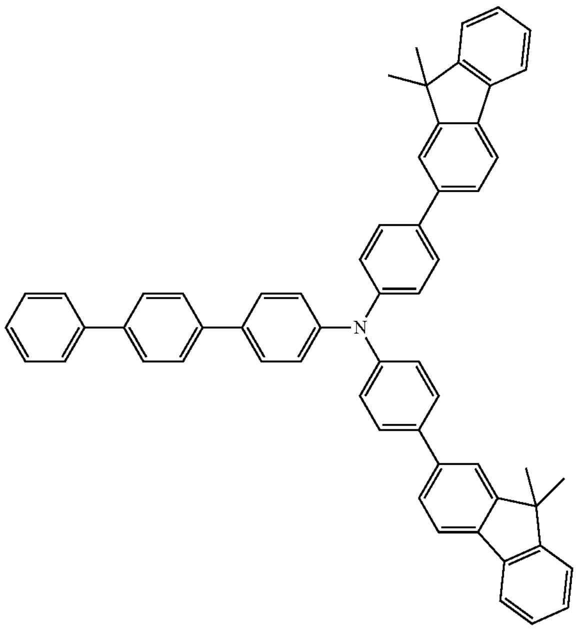
HT21
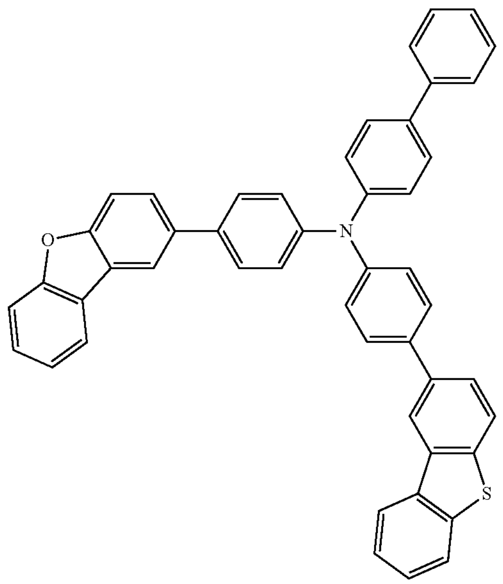
HT22
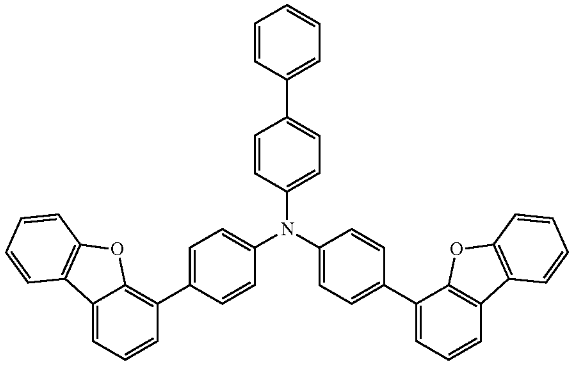

-continued
HT23
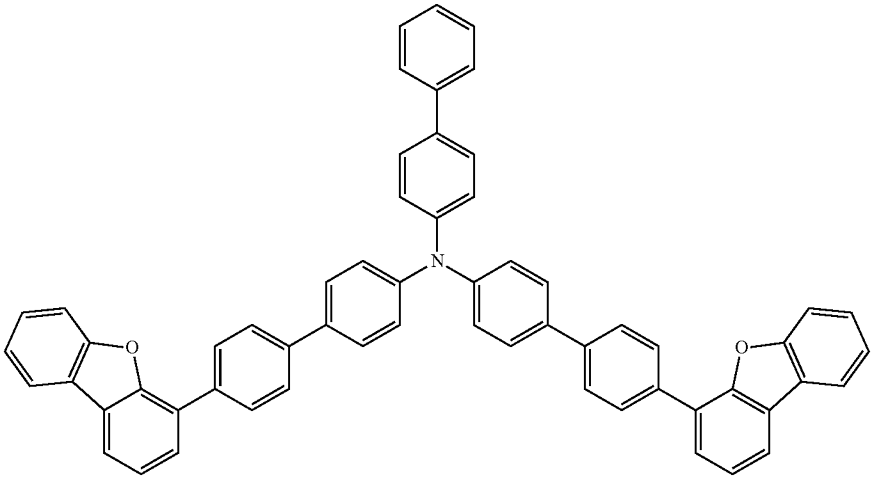
HT24
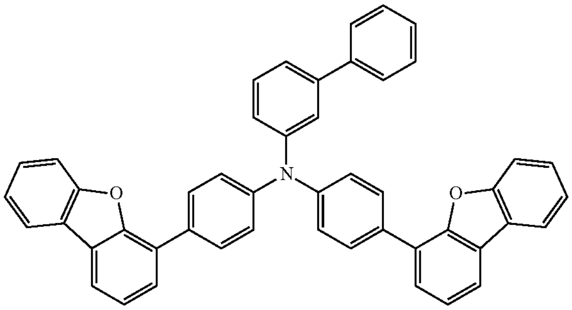
HT25
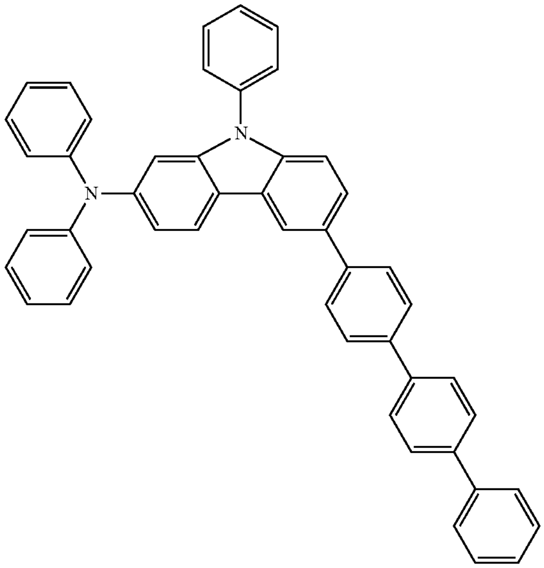
HT26
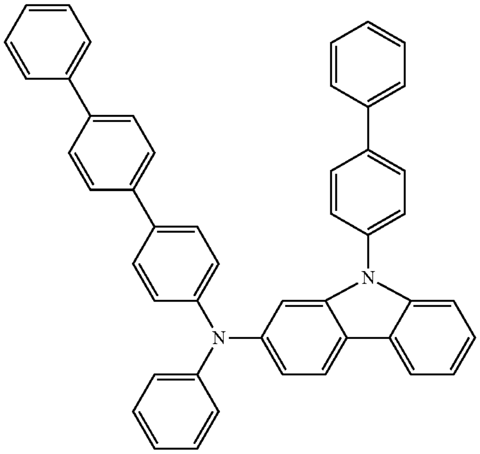
HT27
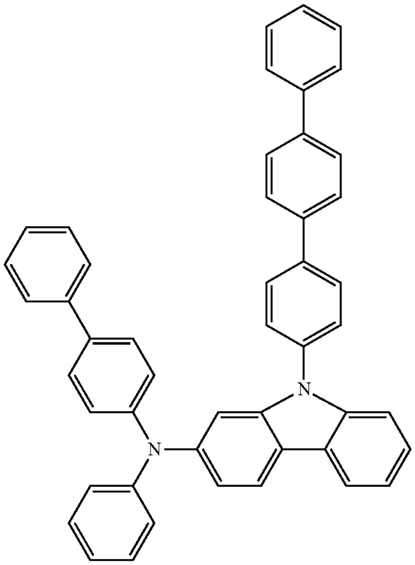

-continued
HT28
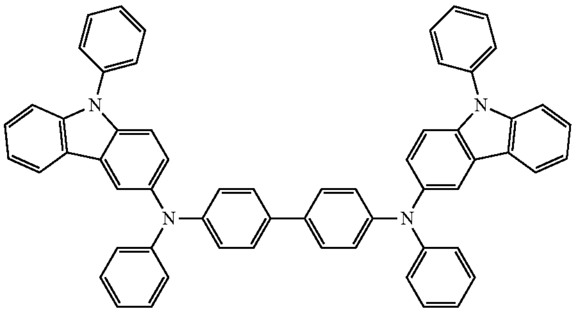
HT29
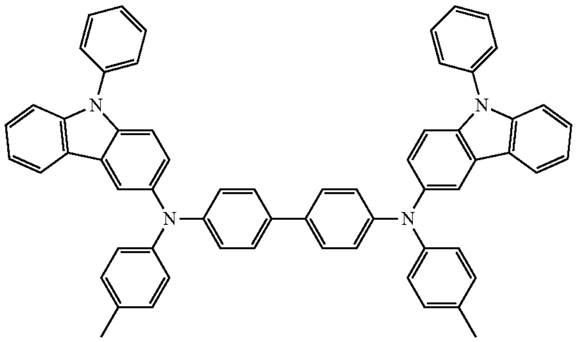
HT30
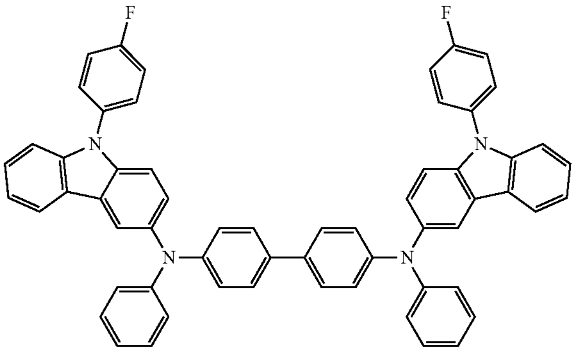
HT31
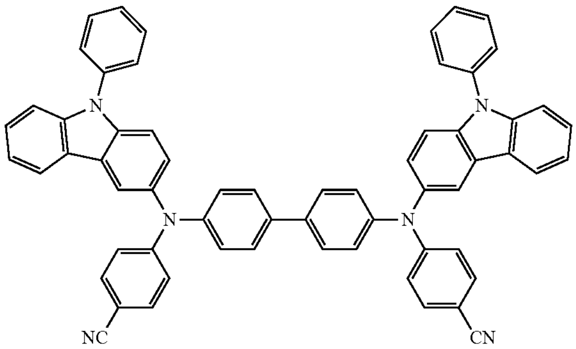
HT32
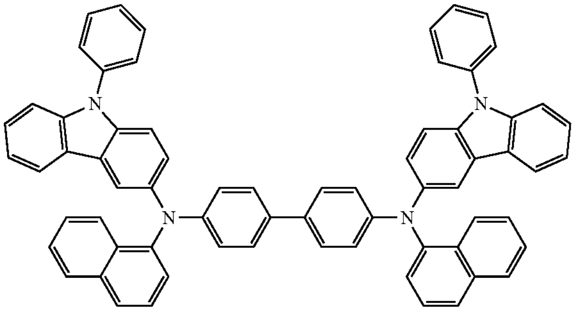
HT33
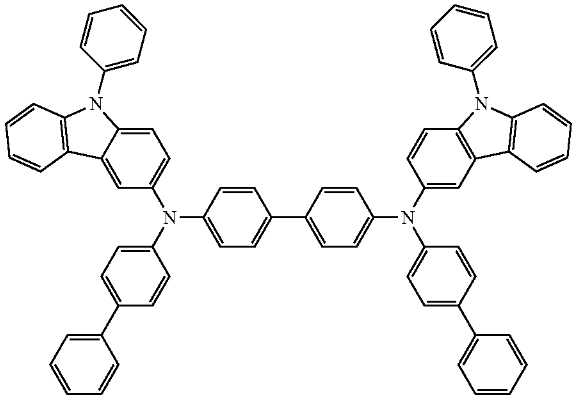

-continued
HT34
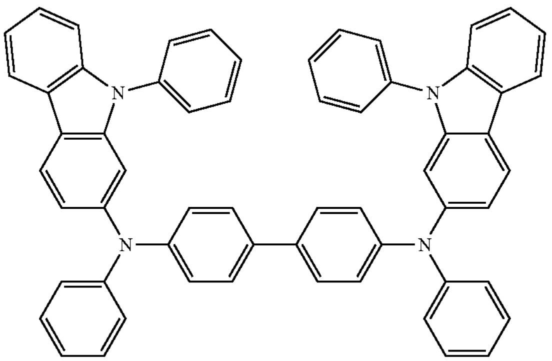
HT35
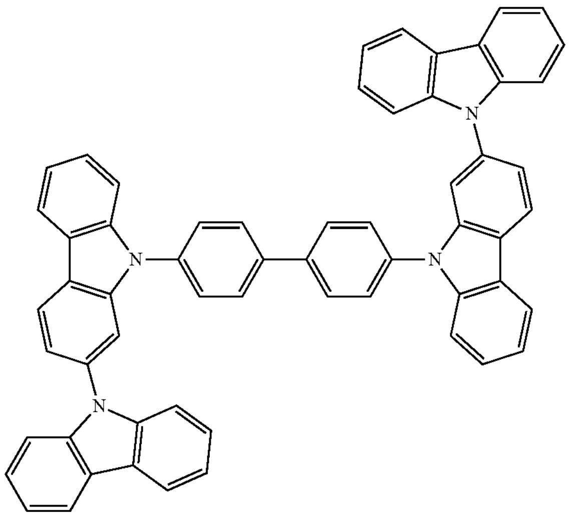
HT36
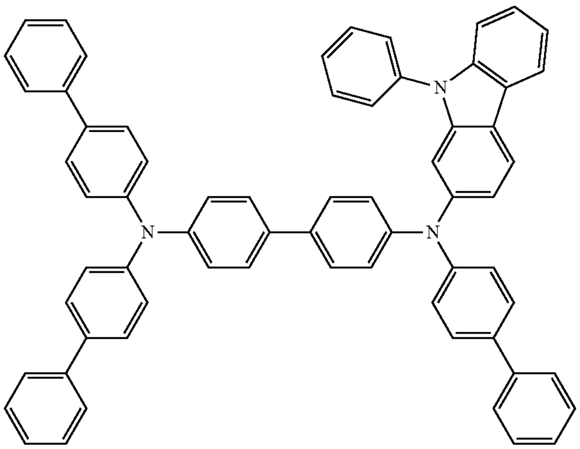
HT37
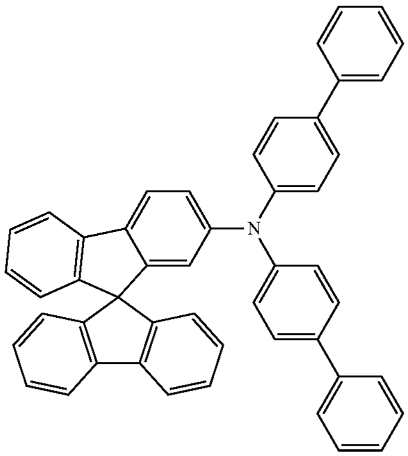
HT38
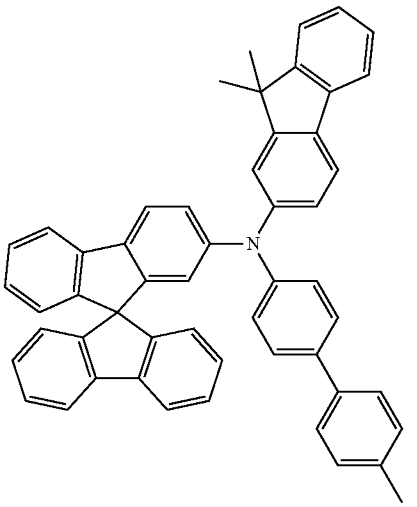
HT39
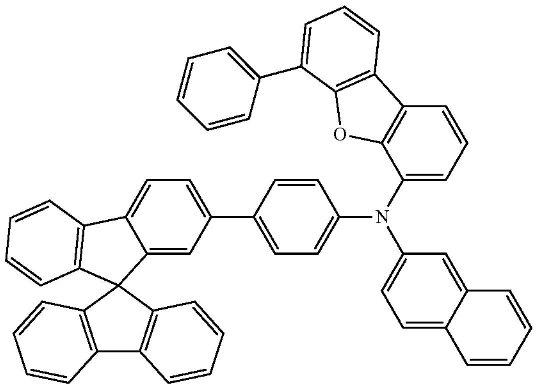

-continued
HT40
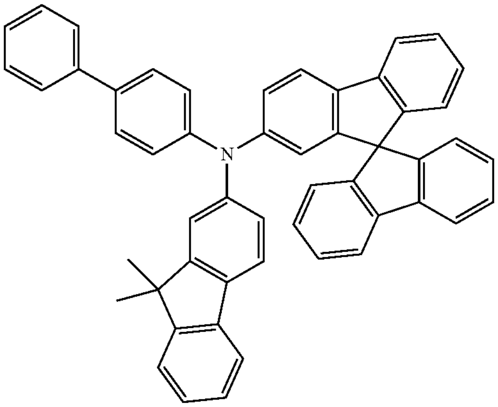
HT41
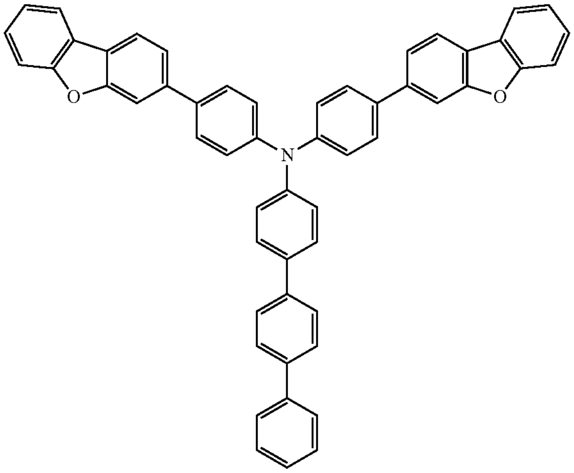
HT42
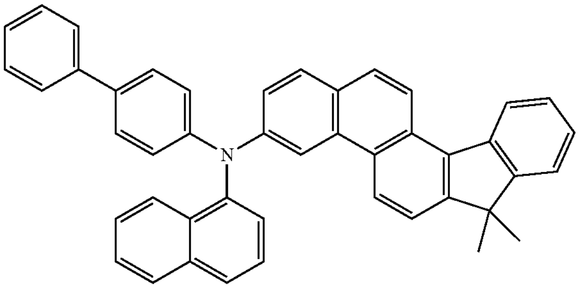
HT43
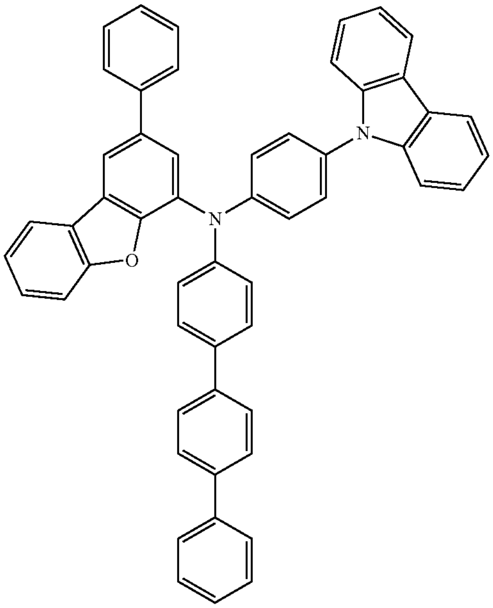
HT44
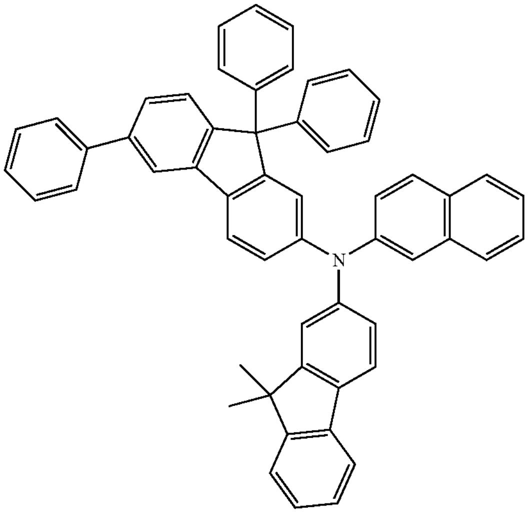
HT45
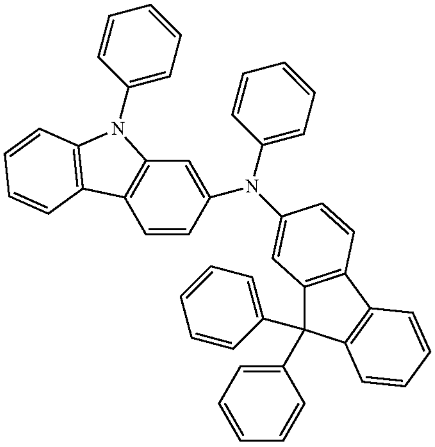

-continued
HT46
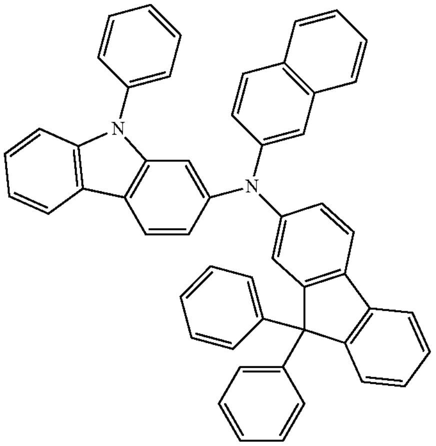
HT47
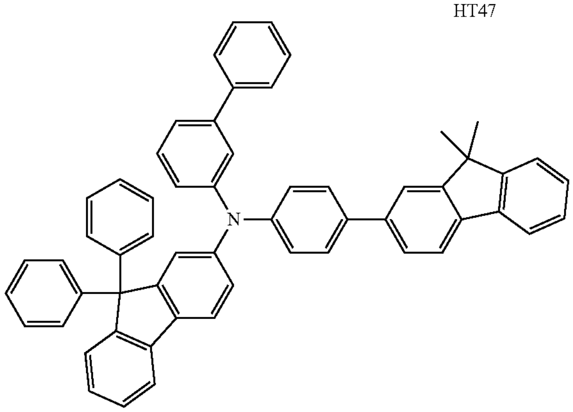
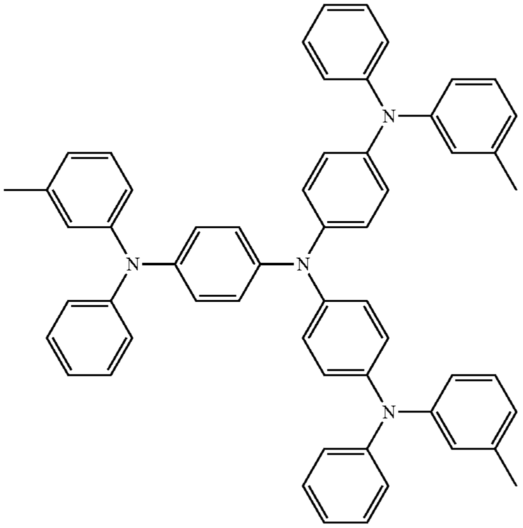
m-MTDATA
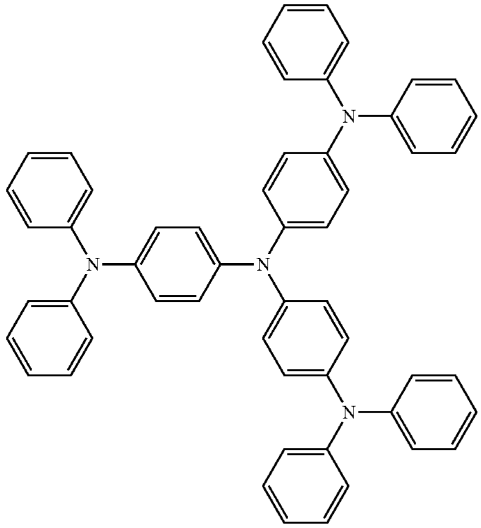
TDATA
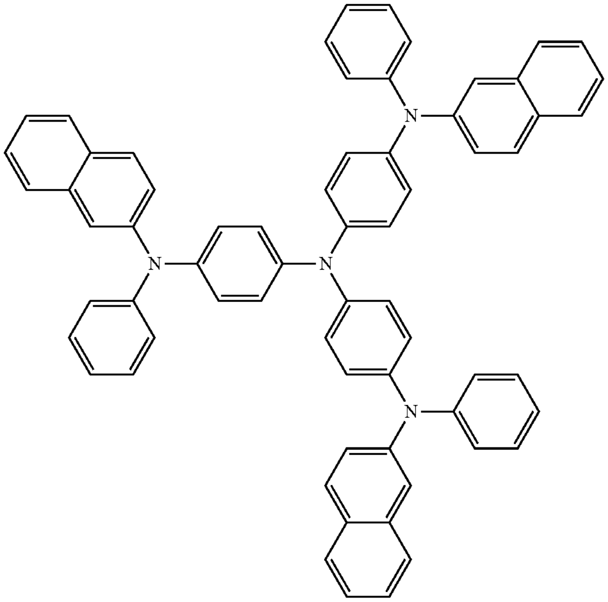
2-TNATA
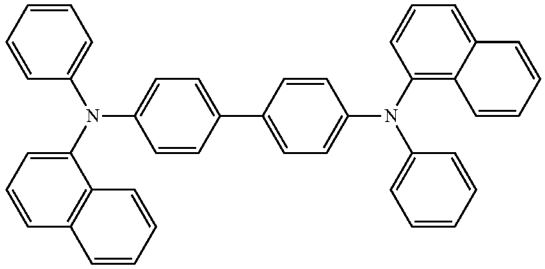
NPB -continued

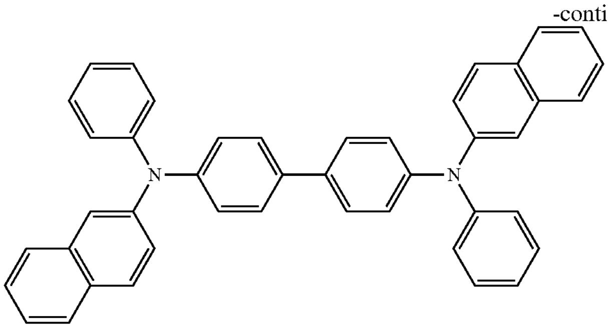

β-NPB

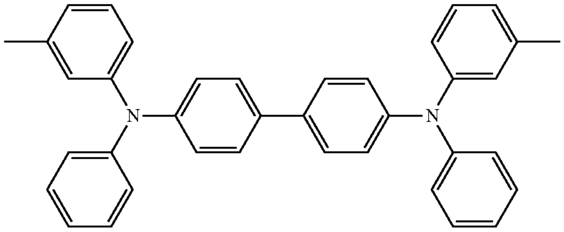

TPD

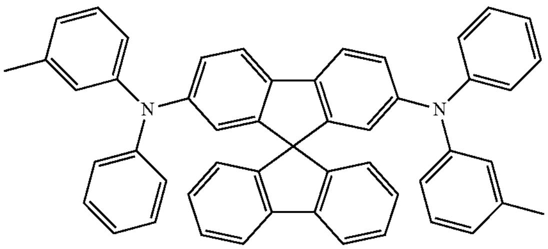

Spiro-TPD

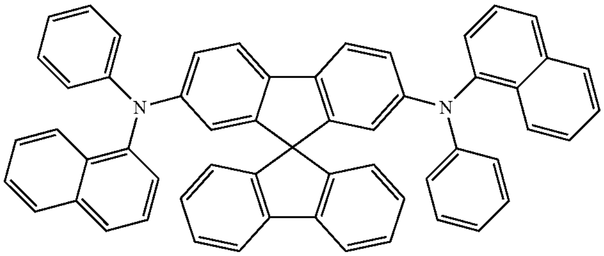

Spiro-NPB

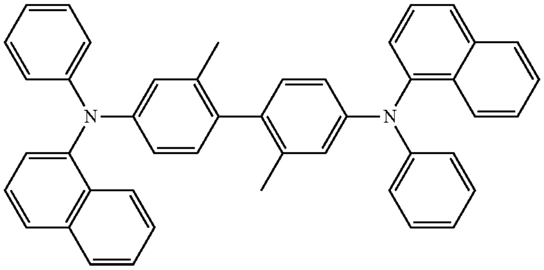

methylated NPB

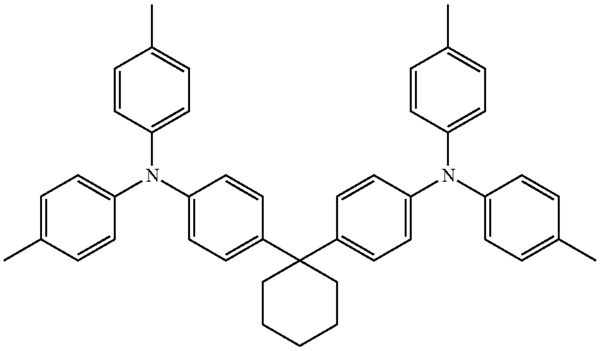

TAPC

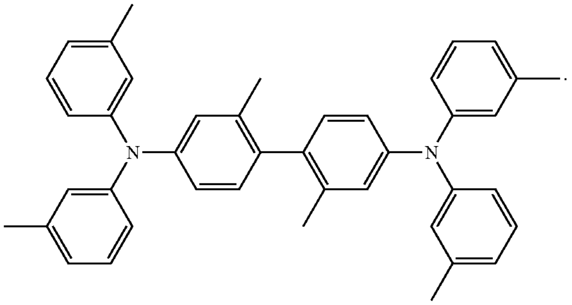

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å and the thickness of the hole transport layer may be in a range of about 100 Å to about 1,500 Å. When the thicknesses of the hole transport region, the hole injection layer, and the hole transport layer are within the ranges described above, satisfactory hole-transporting characteristics may be obtained without a substantial increase in driving voltage.

The emission auxiliary layer may increase light-emission efficiency by compensating for an optical resonance distance according to the wavelength of light emitted from the emission layer, and the electron-blocking layer may block the leakage of electrons from the emission layer to the hole transport region. Materials that may be included in the hole transport region may be included in the emission auxiliary layer and the electron-blocking layer.

[p-Dopant]

The hole transport region may further include, in addition to the materials described above, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, a lowest unoccupied molecular orbital (LUMO) energy level (or a work function) of the p-dopant may be less than or equal to about −3.5 eV.

In an embodiment, the p-dopant may include a quinone derivative, a cyano group-containing compound, a compound including element EL1 and element EL2, or any combination thereof.

Examples of a quinone derivative may include TCNQ, F4-TCNQ, and the like.

Examples of a cyano group-containing compound may include HAT-CN, a compound represented by Formula 221, and the like:

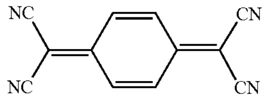

TCNQ

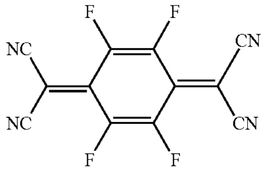

F4-TCNQ

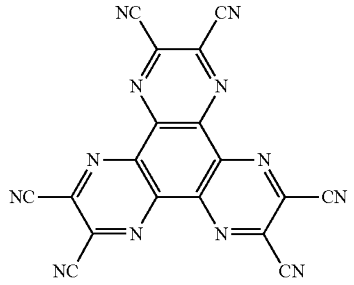

HAT-CN

[Formula 221]

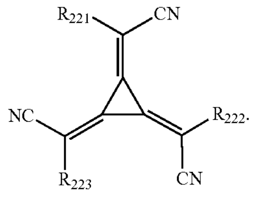

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of a metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.); and the like.

Examples of a metalloid may include silicon (Si), antimony (Sb), tellurium (Te), and the like.

Examples of a non-metal may include oxygen (O), halogen (for example, F, Cl, Br, I, etc.), and the like.

Examples of the compound including element EL1 and element EL2 may include a metal oxide, a metal halide (for example, a metal fluoride, a metal chloride, a metal bromide, a metal iodide, etc.), a metalloid halide (for example, a metalloid fluoride, a metalloid chloride, a metalloid bromide, a metalloid iodide, etc.), a metal telluride, or any combination thereof.

Examples of a metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), a rhenium oxide (for example, $ReO_3$, etc.), and the like.

Examples of a metal halide may include an alkali metal halide, an alkaline earth metal halide, a transition metal halide, a post-transition metal halide, a lanthanide metal halide, and the like.

Examples of an alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of an alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of a transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, TaIs, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), a gold halide (for example, AuF, AuCl, AuBr, AuI, etc.), and the like.

Examples of a post-transition metal halide may include a zinc halide (for example, $ZnF_2$, $ZnCl_2$, $ZnBr_2$, $ZnI_2$, etc.), an indium halide (for example, $InI_3$, etc.), a tin halide (for example, $SnI_2$, etc.), and the like.

Examples of a lanthanide metal halide may include YbF, $YbF_2$, $YbF_3$, $SmF_3$, YbCl, $YbCl_2$, $YbCl_3SmCl_3$, YbBr, $YbBr_2$, $YbBr_3SmBr_3$, YbI, $YbI_2$, $YbI_3$, $SmI_3$, and the like.

Examples of a metalloid halide may include an antimony halide (for example, $SbCl_5$, etc.) and the like.

Examples of a metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, CuzTe, CuTe, $Ag_2Te$, AgTe, $Au_2Te$, etc.), a post-transition metal telluride (for example, ZnTe, etc.), a lanthanide metal telluride (for example, LaTe, CeTe, PrTe, NdTe, PmTe, EuTe, GdTe, TbTe, DyTe, HoTe, ErTe, TmTe, YbTe, LuTe, etc.), and the like.

[Emission Layer in Interlayer 130]

When the light-emitting device 10 is a full-color light-emitting device, the emission layer may be patterned into a red emission layer, a green emission layer, and/or a blue emission layer, according to a subpixel. In an embodiment, the emission layer may have a stacked structure of two or more layers of a red emission layer, a green emission layer, and a blue emission layer, in which the two or more layers may contact each other or may be separated from each other, to emit white light. In embodiments, the emission layer may include two or more materials of a red light-emitting material, a green light-emitting material, and a blue light-emitting material, in which the two or more materials may be mixed with each other in a single layer, to emit white light.

In an embodiment, the emission layer may include a host and a dopant. The dopant may include a phosphorescent dopant, a fluorescent dopant, or any combination thereof.

The emission layer may include the first emission layer and the second emission layer as described above, and an amount of each dopant in the emission layer may be as described above.

In embodiments, the emission layer may include a quantum dot.

In embodiments, the emission layer may include a delayed fluorescence material. The delayed fluorescence material may serve as a host or as a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within the ranges described above, excellent luminescence characteristics may be obtained without a substantial increase in driving voltage.

[Host]

The hole-transporting host may be a compound having strong hole characteristics. The expression "a compound having strong hole characteristics" refers to a compound that readily accepts holes, and such characteristics may be obtained by including a hole-receiving moiety (also referred to as a hole-transporting moiety).

The hole-receiving moiety may include, for example, a π electron-rich heteroaromatic compound (for example, a carbazole derivative or an indole derivative), or an aromatic amine compound.

The electron-transporting host may be a compound having strong electron characteristics. The expression "a compound having strong electron characteristics" refers to a compound that readily accepts electrons, and such characteristics may be obtained by including an electron-receiving moiety (also referred to as an electron-transporting moiety).

The electron-receiving moiety may include, for example, a TT-electron-deficient heteroaromatic compound. For example, the electron-receiving moiety may include a nitrogen-containing heteroaromatic compound.

The first emission layer and the second emission layer of the light-emitting device according to an embodiment may respectively only include a first host and a second host that are capable of transporting both holes and electrons (as a single host). The first host and the second host may each include both a hole-transporting moiety and an electron-transporting moiety, and thus may be referred to as having hole-transporting characteristics and electron-transporting characteristics at the same time (for example, as a bipolar host). The hole-transporting characteristics and the electron-transporting characteristics of the first host and the second host may be of a same magnitude, the hole-transporting characteristics may be greater than the electron-transporting characteristics, or the electron-transporting characteristics may be greater than the hole-transporting characteristics.

The first emission layer and the second emission layer of the light-emitting device according to an embodiment may respectively include the first host and the second host as a mixed host. The first host may be a pre-mixed host of a hole-transporting host and an electron-transporting host, and the second host may also be a pre-mixed host of a hole-transporting host and an electron-transporting host.

In the light-emitting device according to an embodiment, the first emission layer may include a first host that is capable of transporting both holes and electrons (for example, a bipolar host), and the second emission layer may include a pre-mixed host of a hole-transporting host and an electron-transporting host.

When a compound includes only a hole-transporting moiety or only an electron-transporting moiety, it is clear whether the nature of the compound has hole-transporting characteristics or electron-transporting characteristics.

In an embodiment, a compound may include both a hole-transporting moiety and an electron-transporting moiety. A simple comparison between the total number of the hole-transporting moieties and the total number of the electron-transporting moieties in the compound may be a criterion for predicting whether the compound is a hole-transporting compound or an electron-transporting compound, but may not necessarily be an absolute criterion. One of the reasons why such a simple comparison may not necessarily be an absolute criterion is that one hole-transporting moiety and one electron-transporting moiety may not respectively have exactly the same ability to attract holes and electrons.

Accordingly, a relatively reliable way to determine whether a compound having a certain structure may be a hole-transporting compound or an electron-transporting compound is to directly implement the compound in a device.

In an embodiment, the first host and the second host may each independently include a compound represented by Formula 301:

$[Ar_{301}]_{xb11}$-$[(L_{301})_{xb1}$-$R_{301}]_{xb21}$. [Formula 301]

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each be the same as described in connection with $Q_1$.

For example, in Formula 301, when xb11 is 2 or more, two or more of $Ar_{301}$ may be linked to each other via a single bond.

In embodiments, the first host and the second host may each independently include a compound represented by Formula 301-1, a compound represented by Formula 301-2, or any combination thereof:

[Formula 301-1]

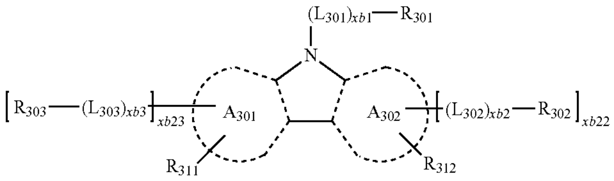

[Formula 301-2]

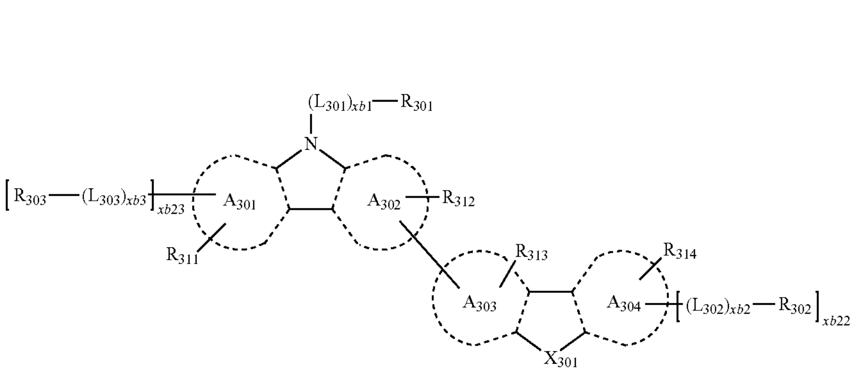

.

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$) ($R_{305}$), or Si($R_{304}$) ($R_{305}$), xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In an embodiment, the host may include an alkaline earth-metal complex. In embodiments, the host may include a Be complex (for example, Compound H55), a Mg complex, a Zn complex, or any combination thereof.

In embodiments, the host may include: one of Compounds H1 to H124; one of Compounds H_01 to H_35; 9,10-di(2-naphthyl)anthracene (ADN); 2-methyl-9,10-bis (naphthalen-2-yl)anthracene (MADN); 9,10-di-(2-naphthyl)-2-t-butyl-anthracene (TBADN); 4,4'-bis(N-carbazolyl)-1,1'-biphenyl (CBP); 1,3-di-9-carbazolylbenzene (mCP); 1,3,5-tri(carbazol-9-yl)benzene (TCP); or any combination thereof:

H1

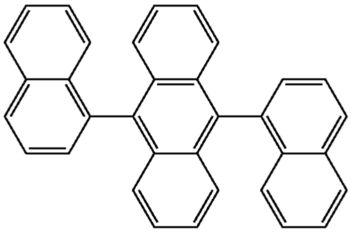

H2

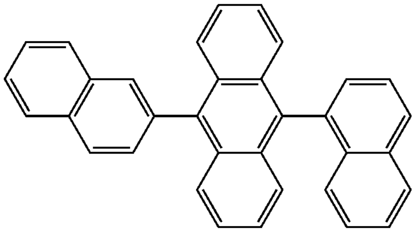

H3

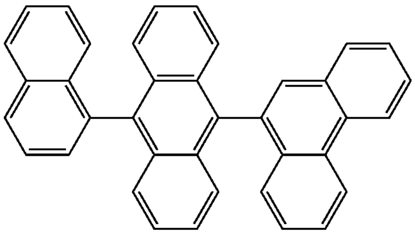

-continued

H4

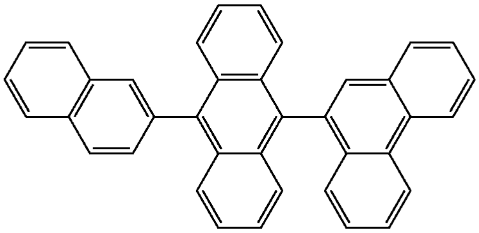

H5

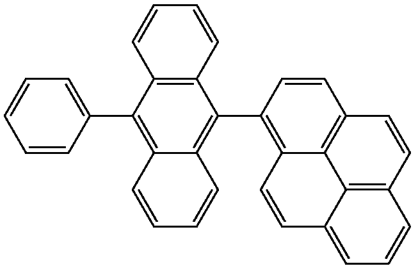

H6

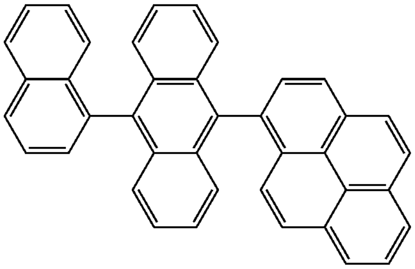

H7

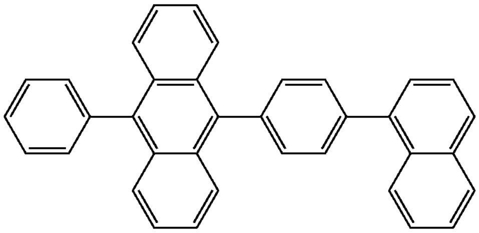

H8

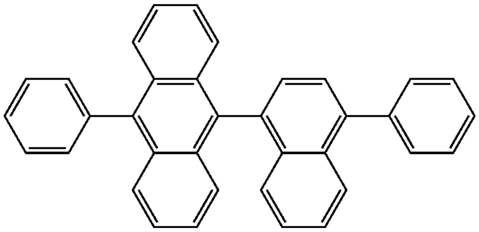

H9

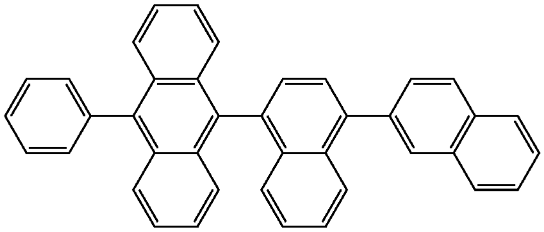

-continued
H10
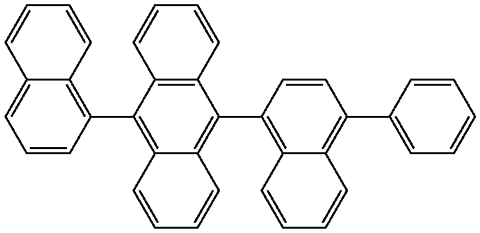
H11
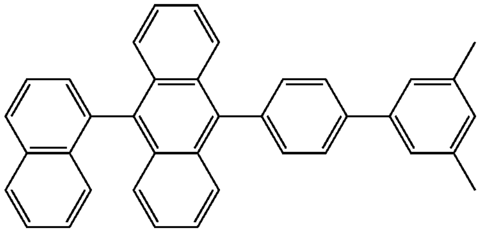
H12
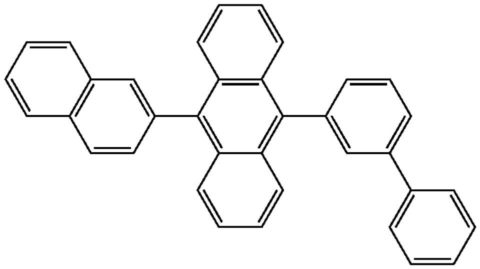
H13
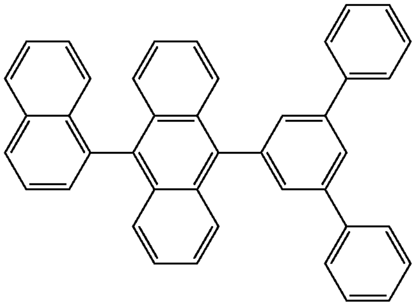
H14
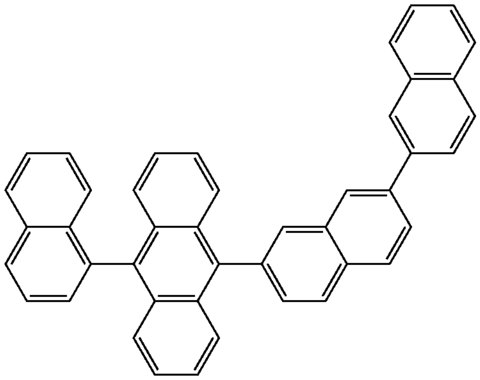
-continued
H15
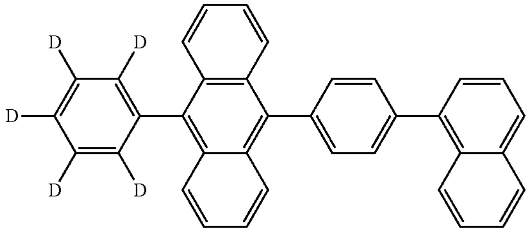
H16
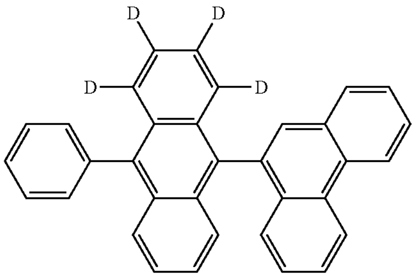
H17
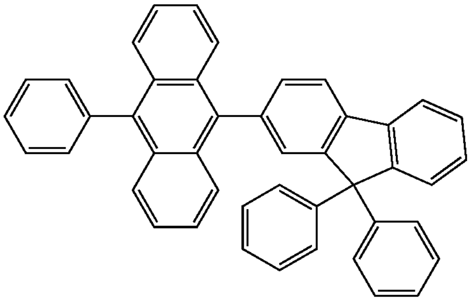
H18
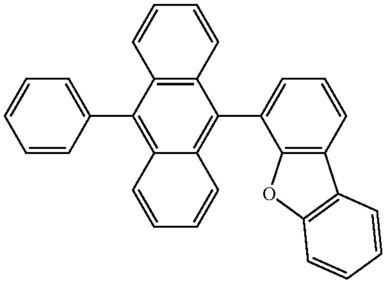
H19
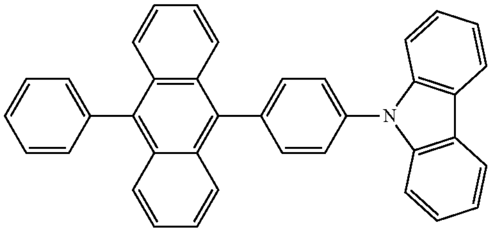

-continued
H20
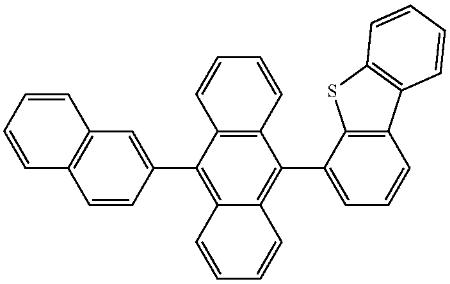
H21
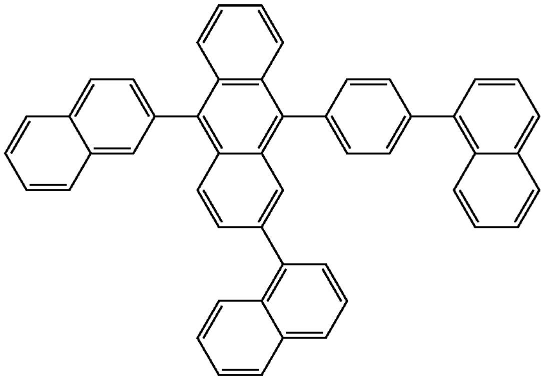
H22
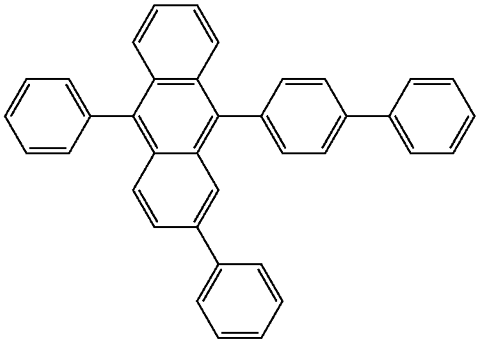
H23
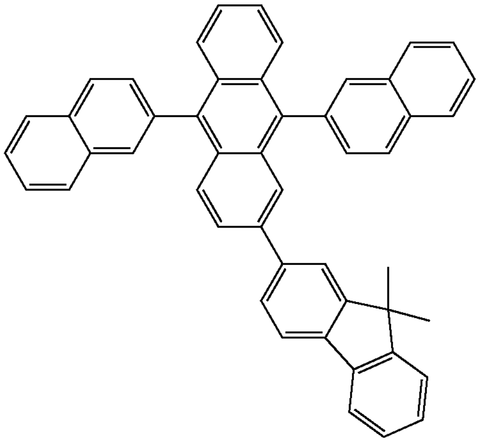
-continued
H24
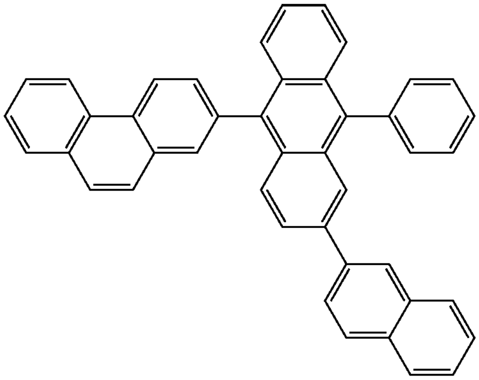
H25
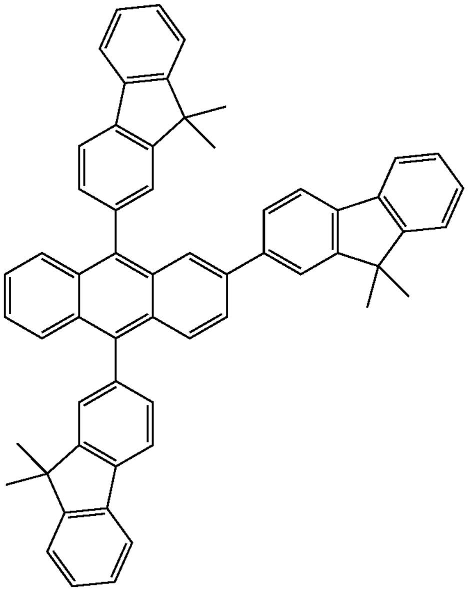
H26
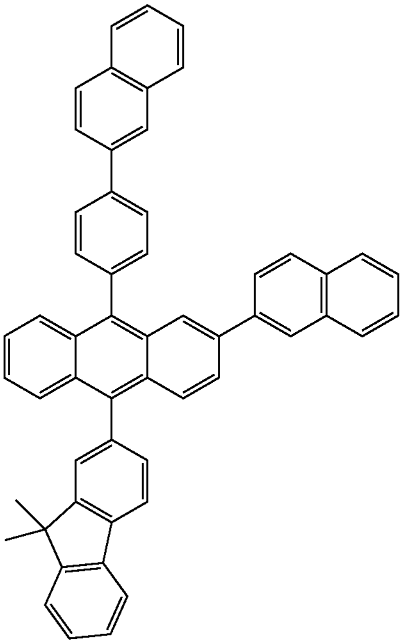

-continued
H27
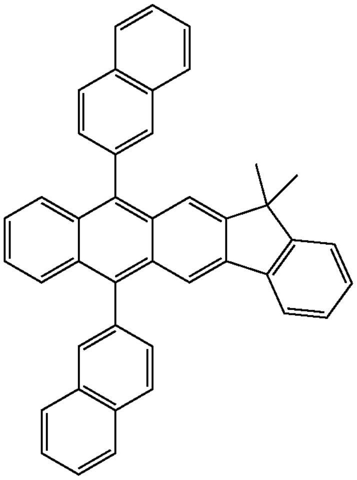
H28
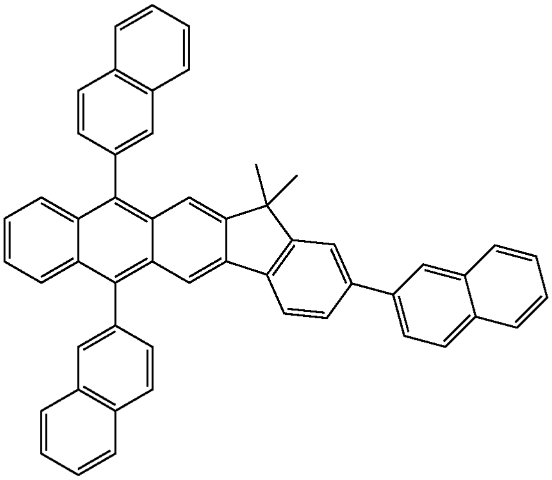
H29
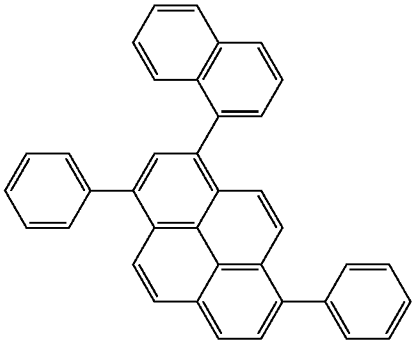
-continued
H30
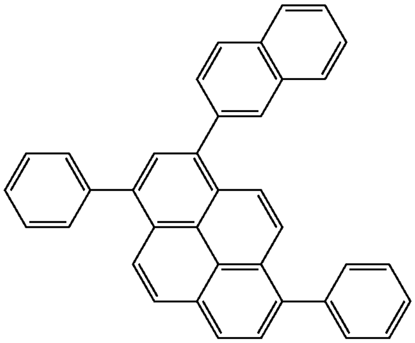
H31
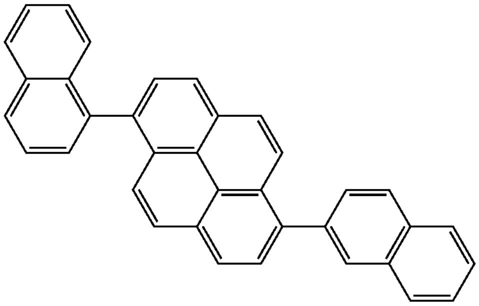
H32
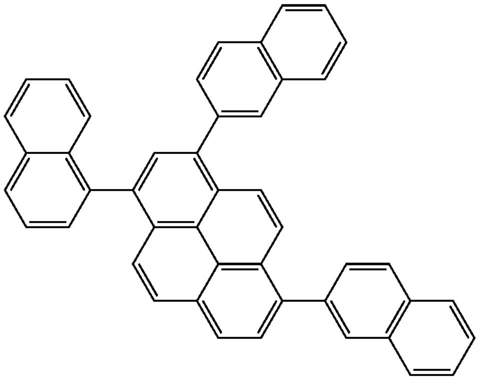
H33
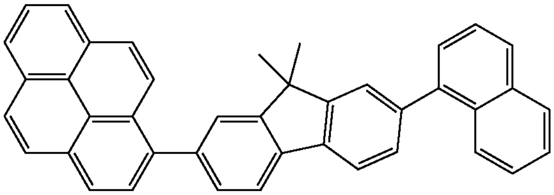
H34
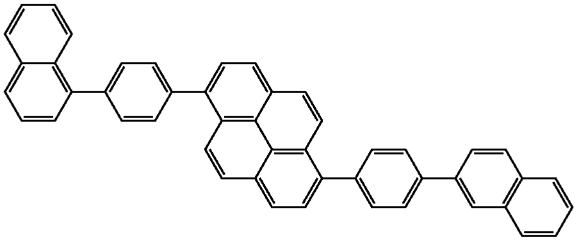

-continued
H35
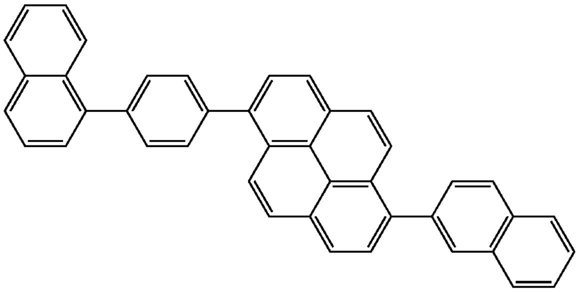
H36
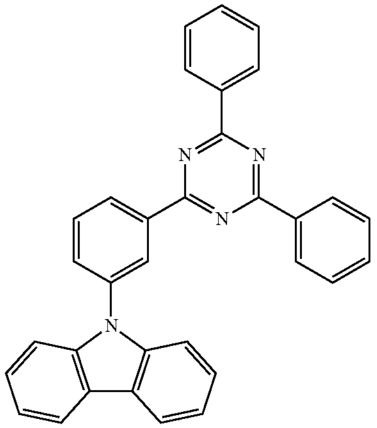
H37
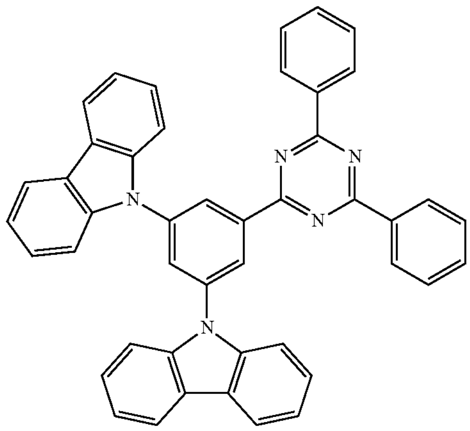
H38
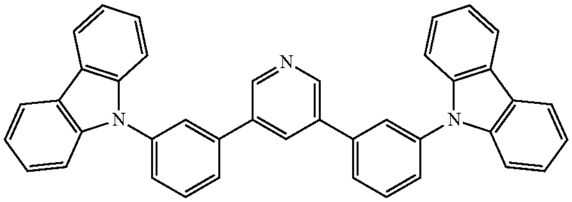
-continued
H39
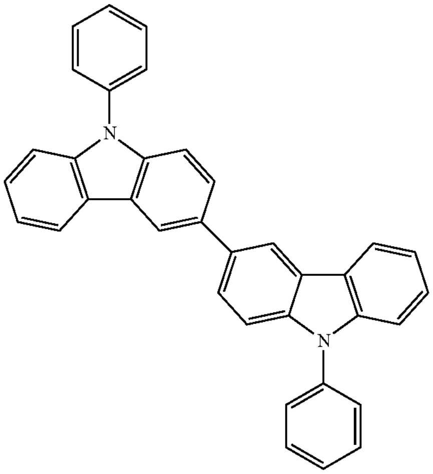
H40
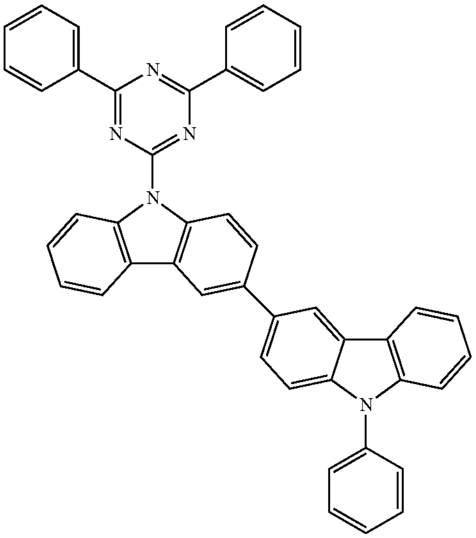
H41
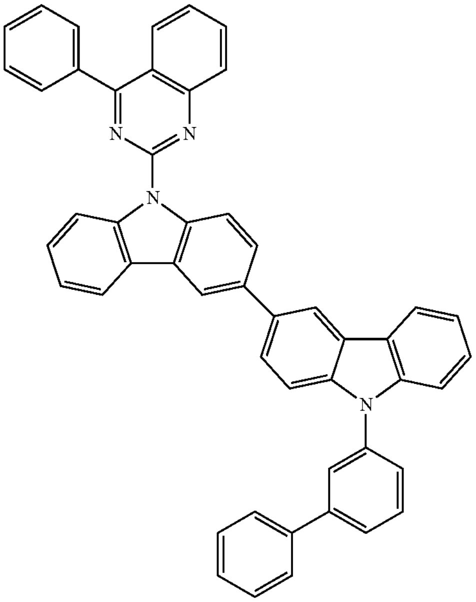

-continued
H42
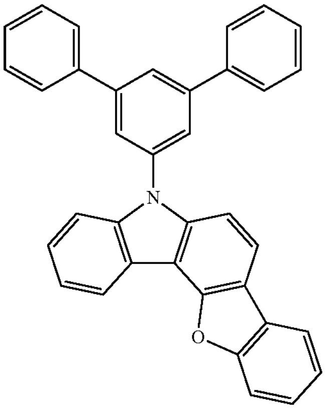
H43
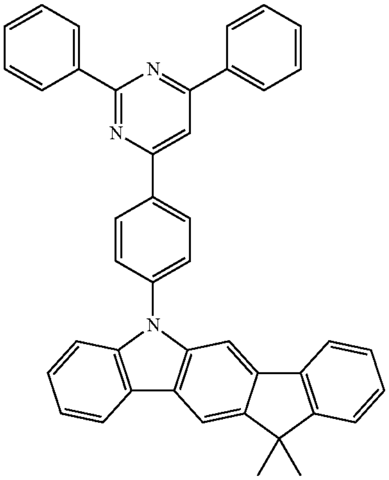
H44
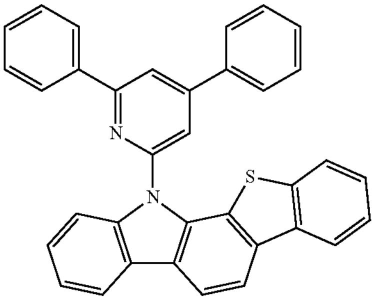
H45
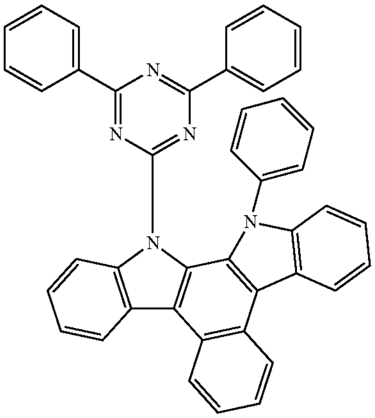
-continued
H46
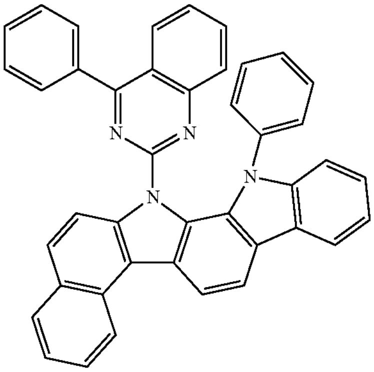
H47
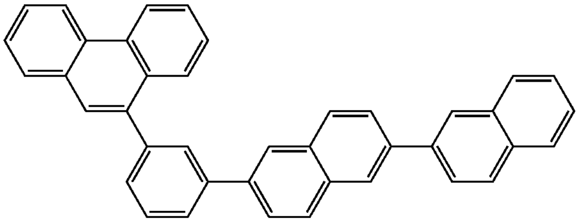
H48
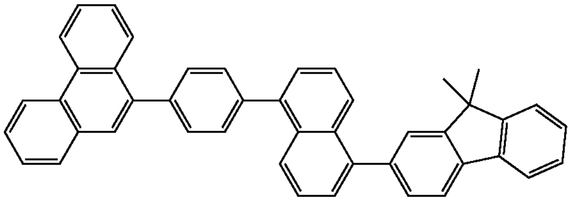
H49
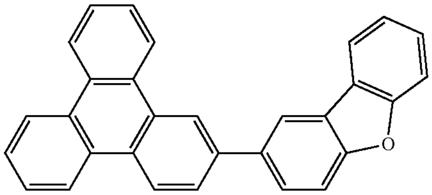
H50
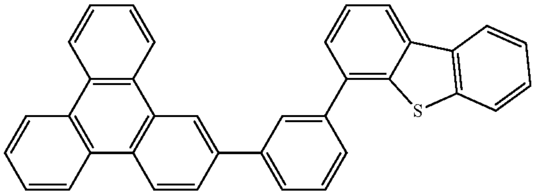
H51
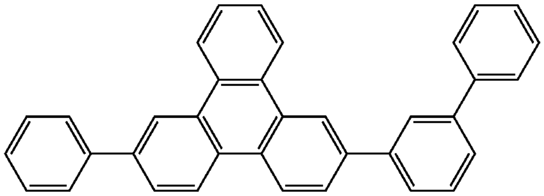

-continued
H52
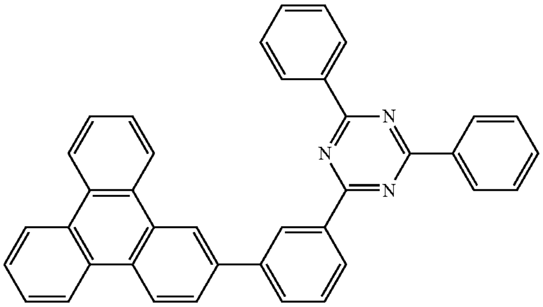
H53
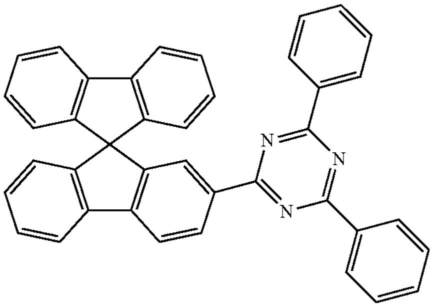
H54
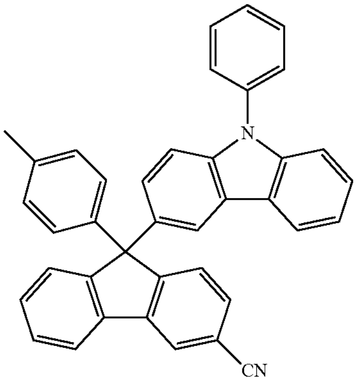
H55
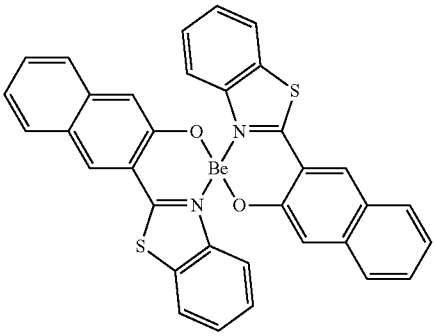
-continued
H56
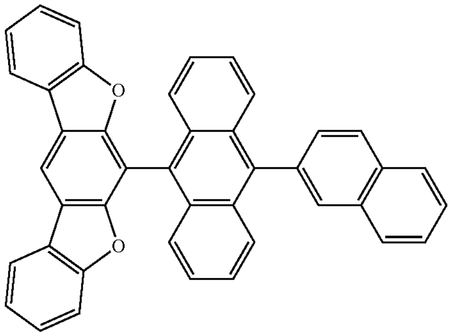
H57
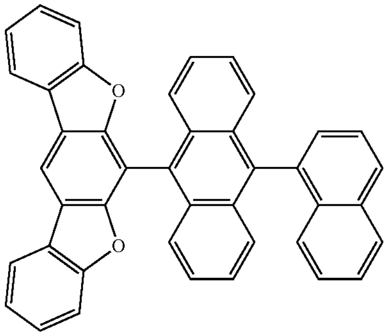
H58
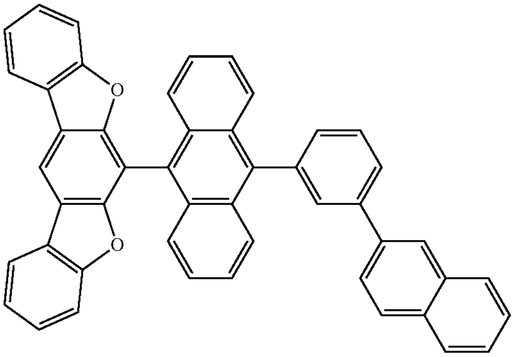
H59
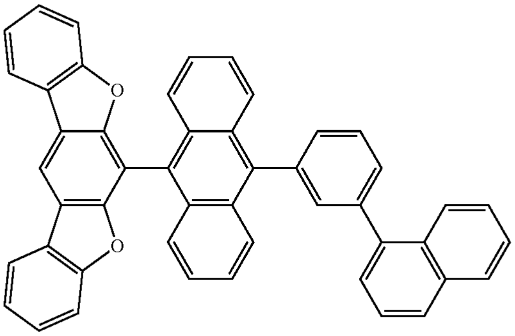

-continued
H60
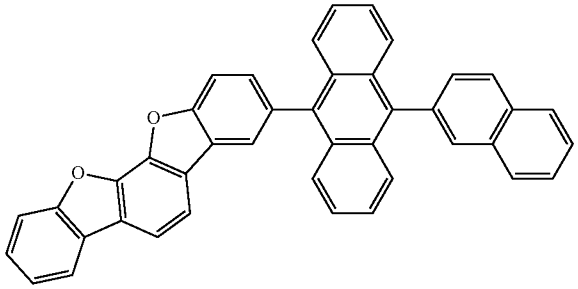
H61
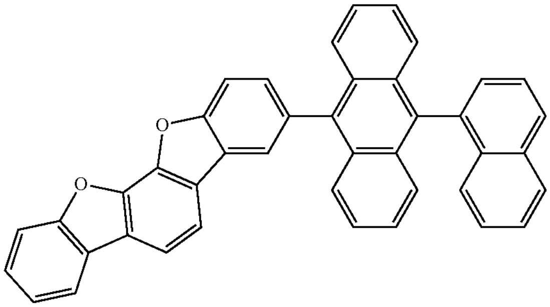
H62
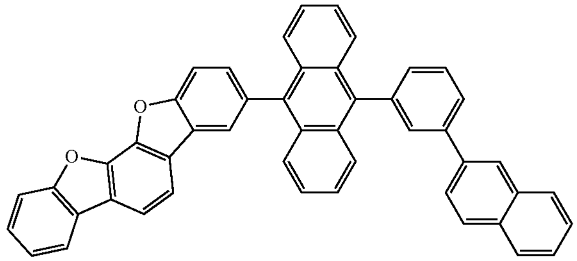
H63
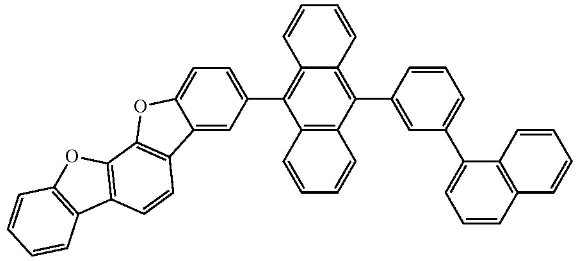
H64
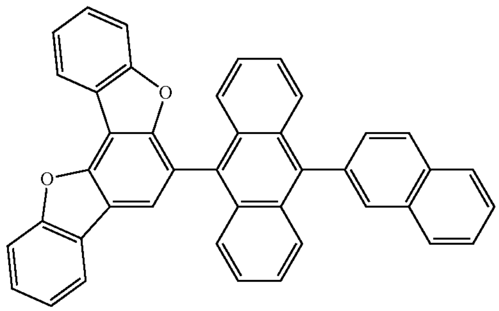
-continued
H65
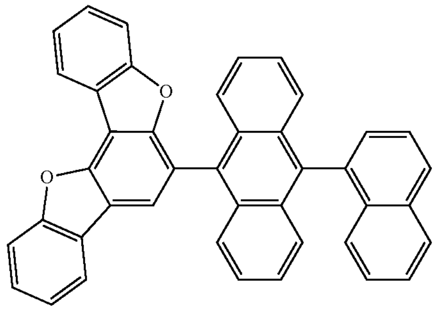
H66
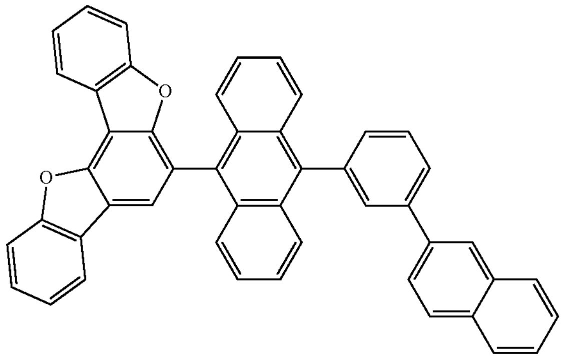
H67
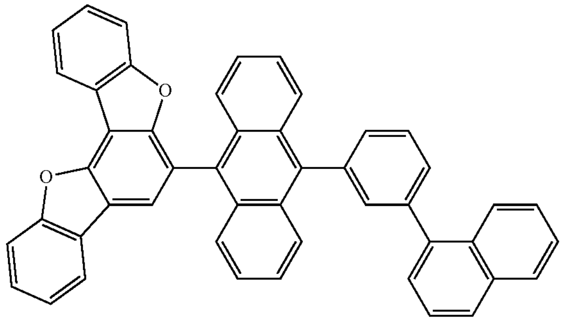
H68
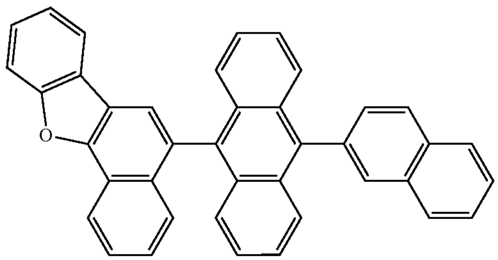
H69
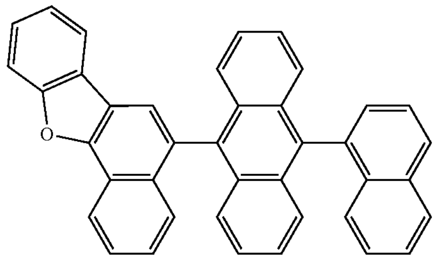

-continued
H70
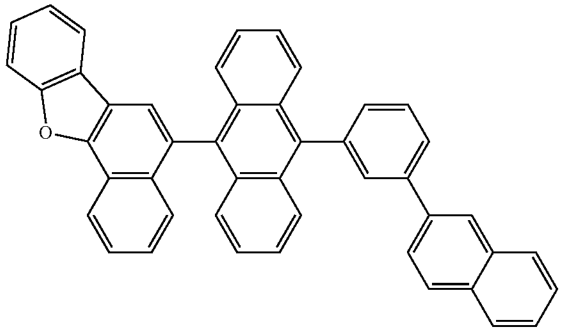
H71
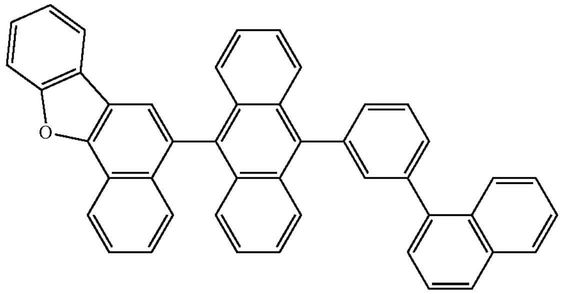
H72
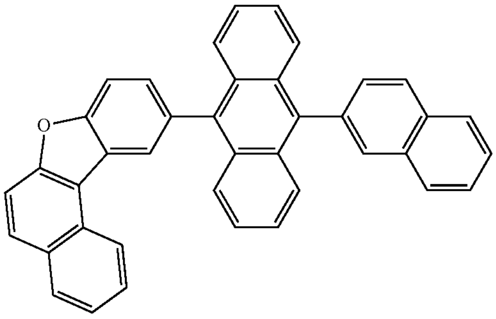
H73
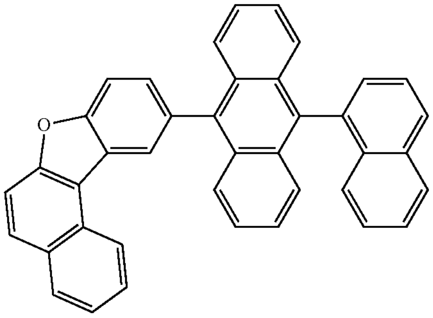
-continued
H74
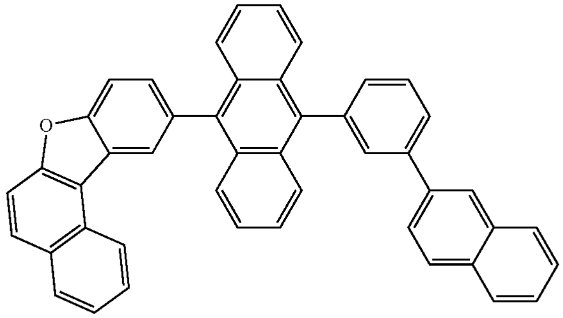
H75
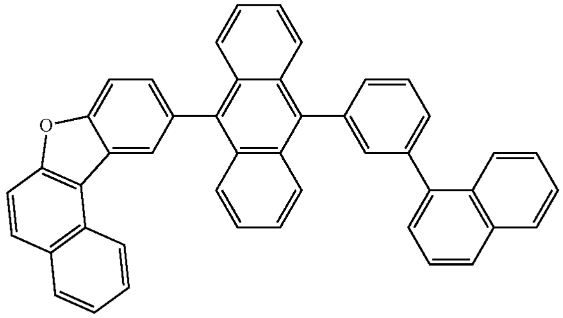
H76
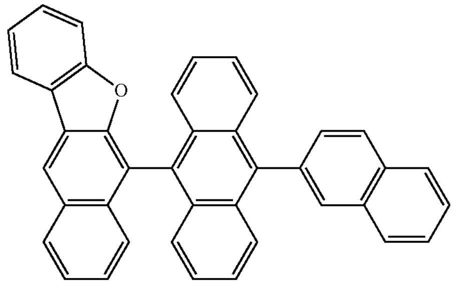
H77
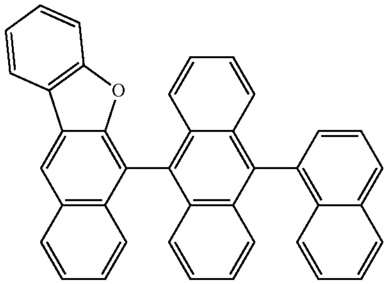
H78
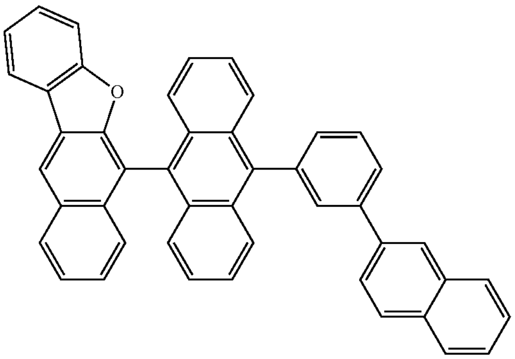

-continued
H79
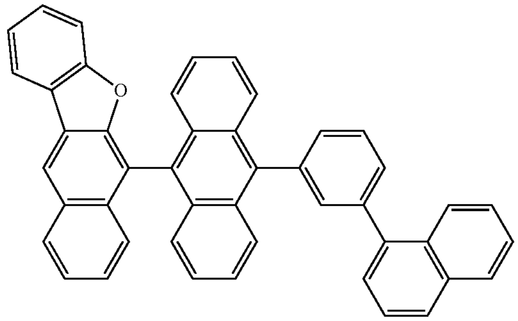
H80
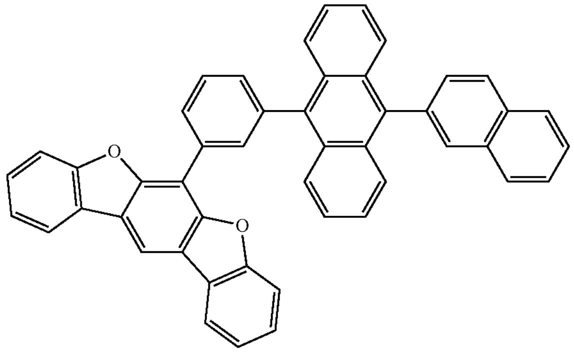
H81
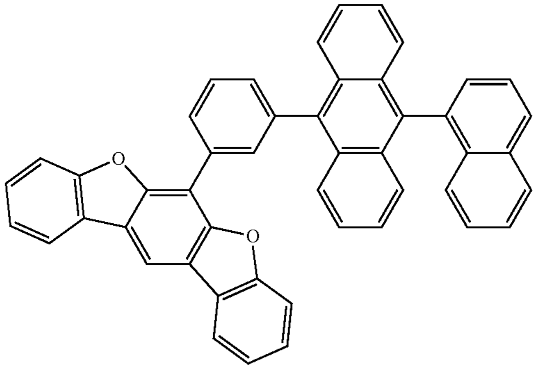
H82
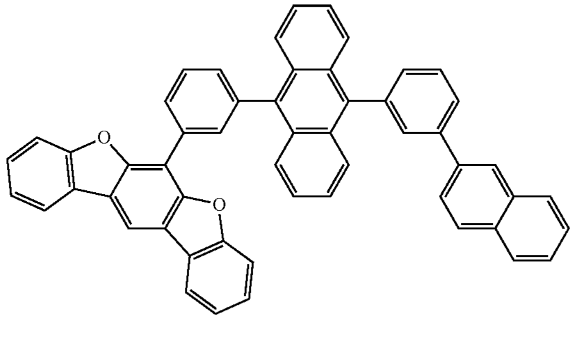
-continued
H83
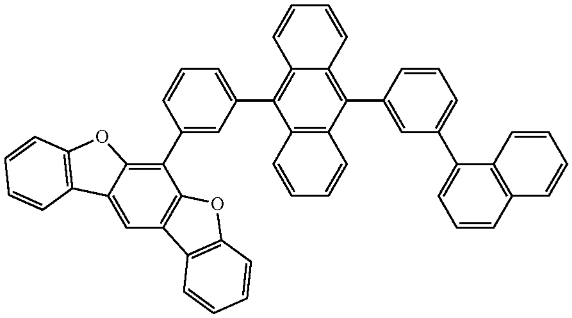
H84
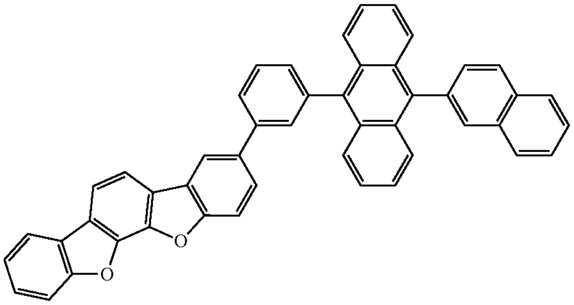
H85
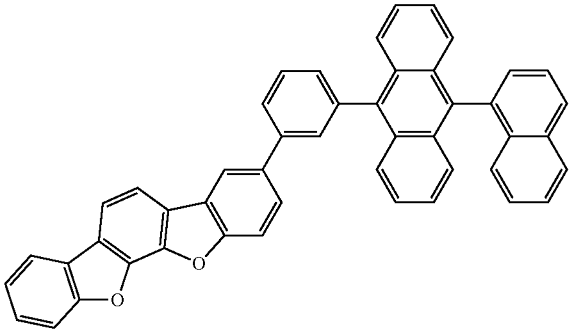
H86
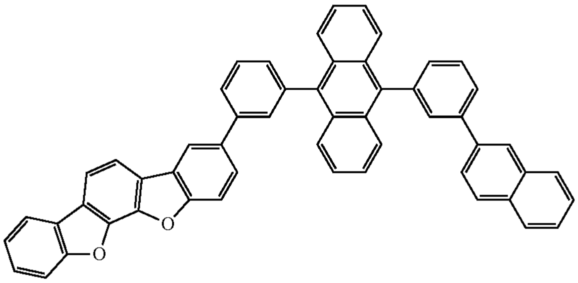
H87
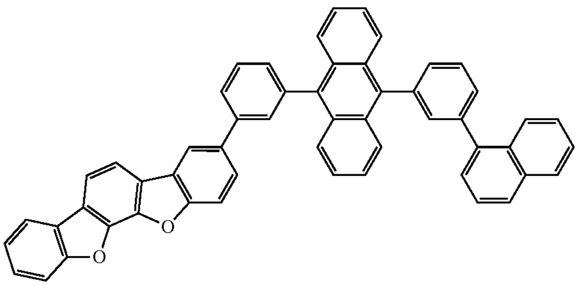

-continued
H88
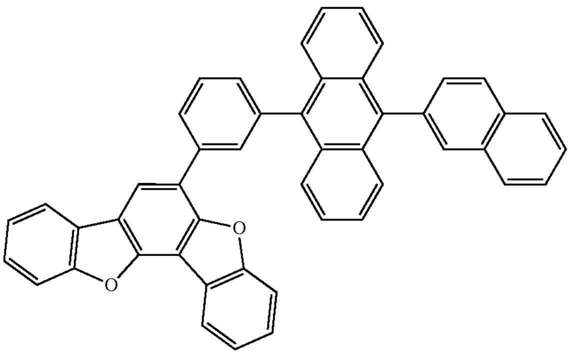
H89
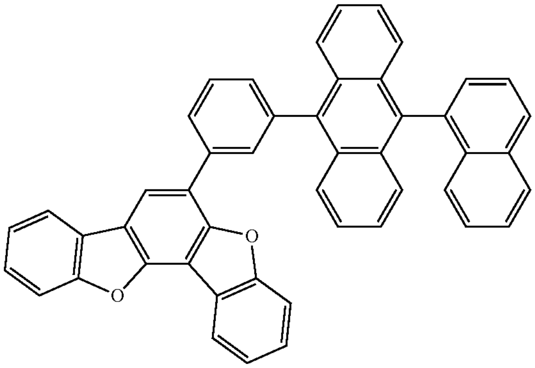
H90
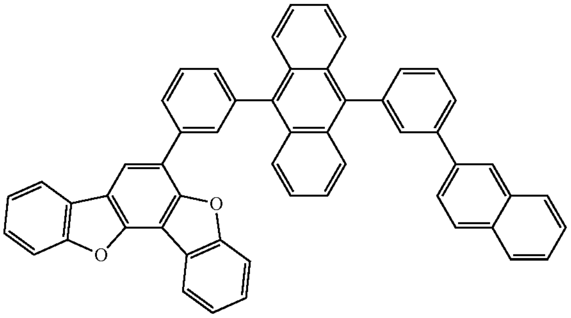
H91
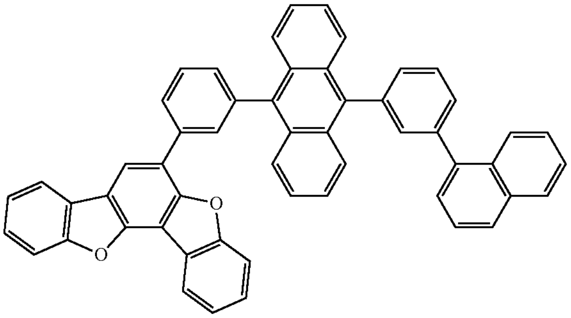
-continued
H92
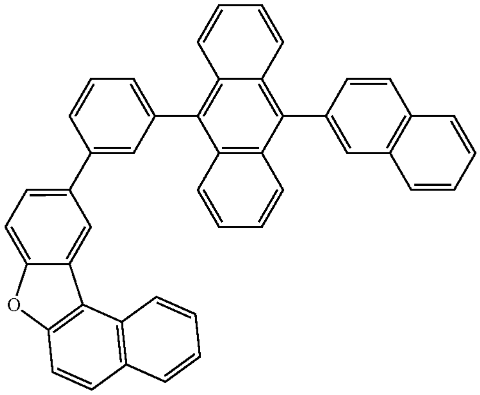
H93
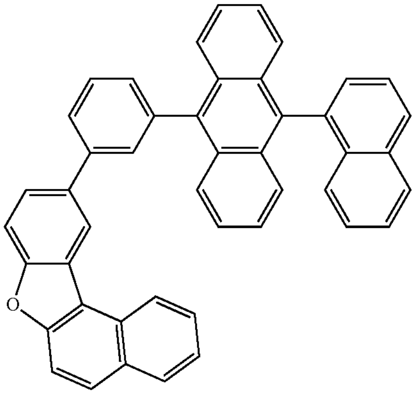
H94
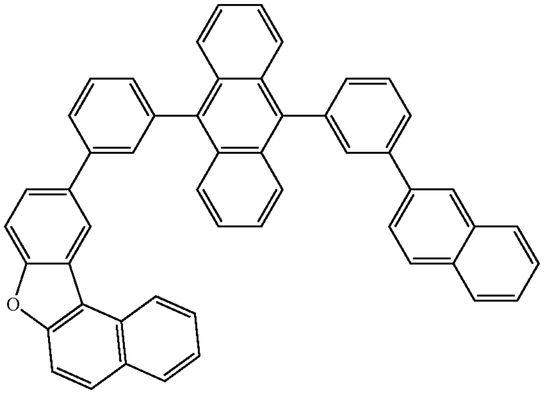
H95
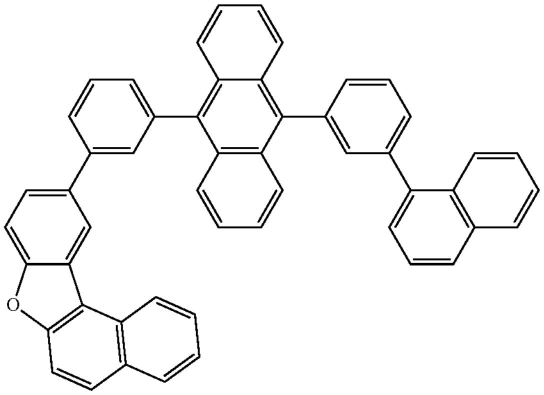

-continued
H96
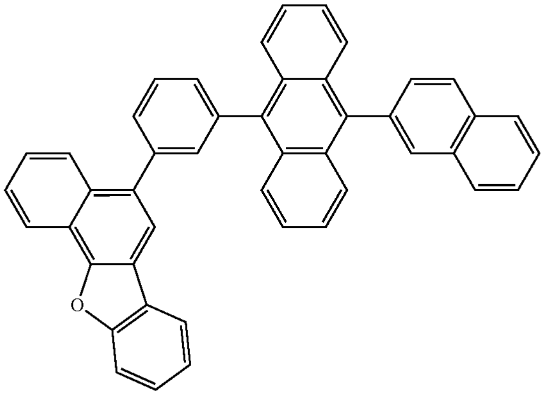
H97
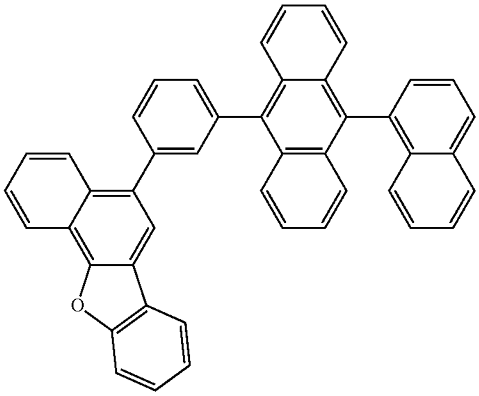
H98
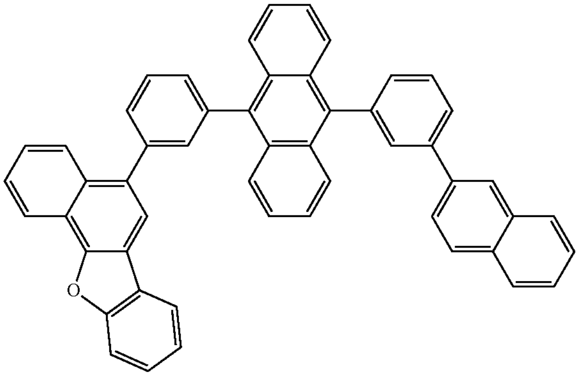
H99
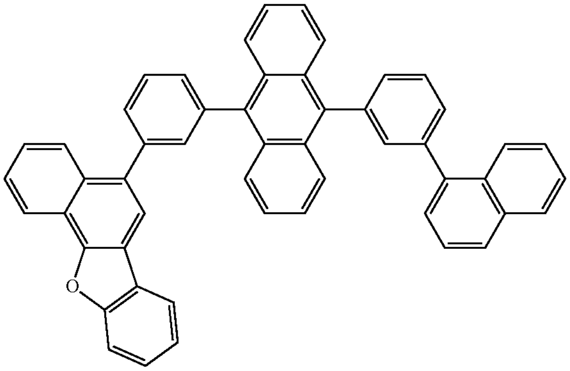
-continued
H100
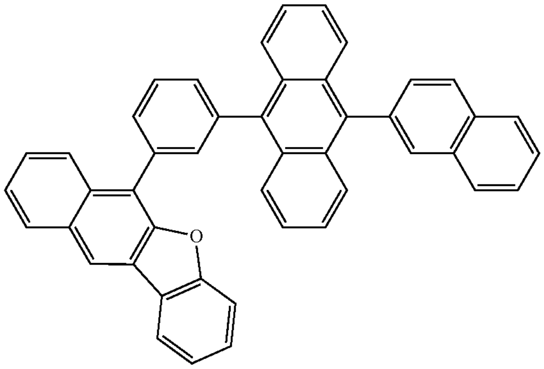
H101
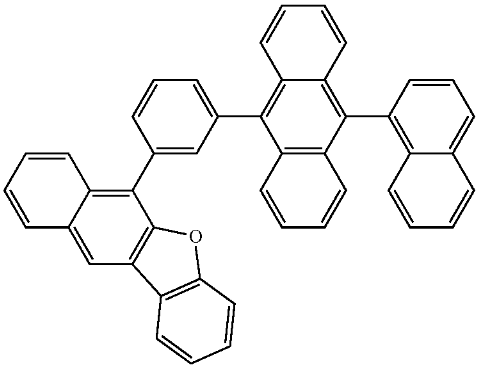
H102
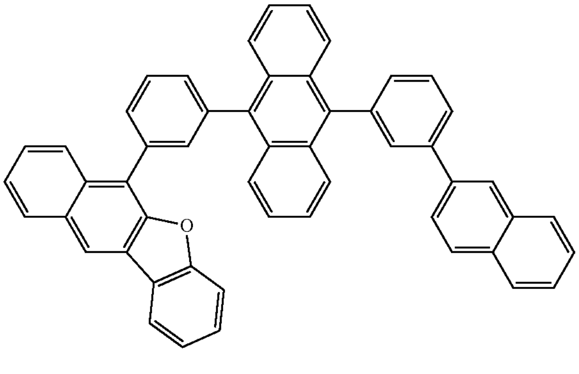
H103
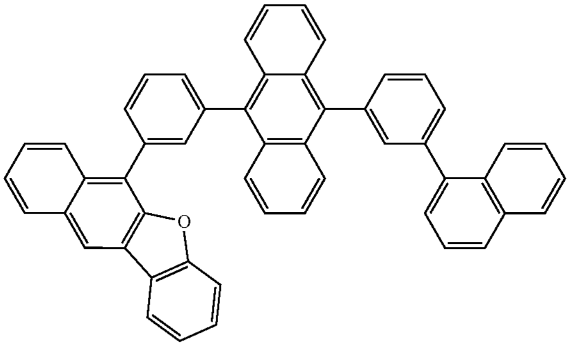

-continued
H104
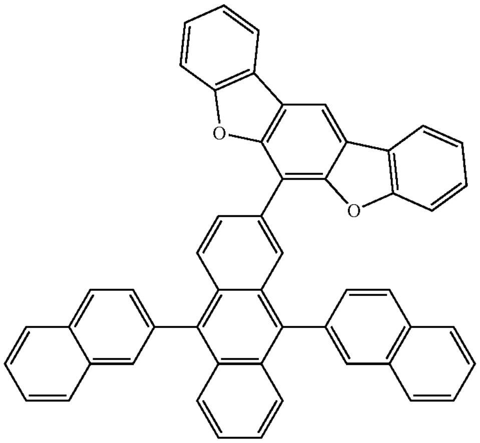
H105
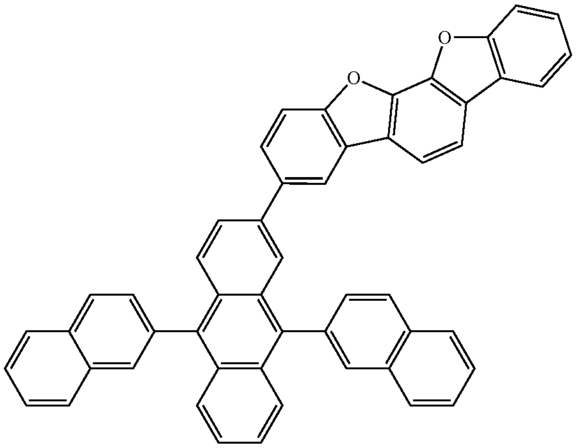
H106
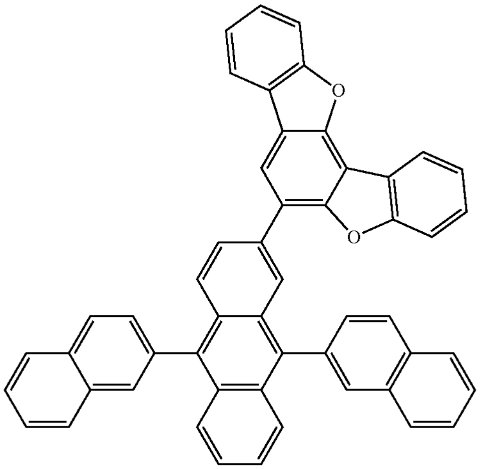
-continued
H107
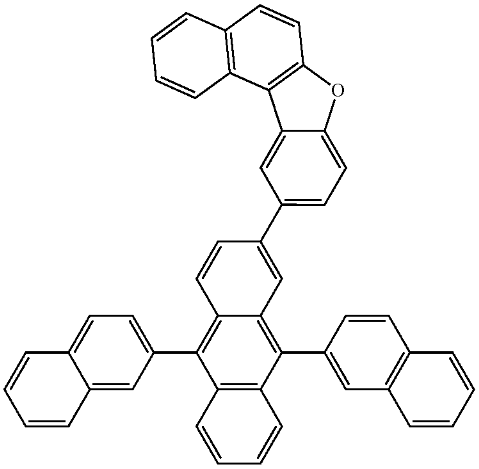
H108
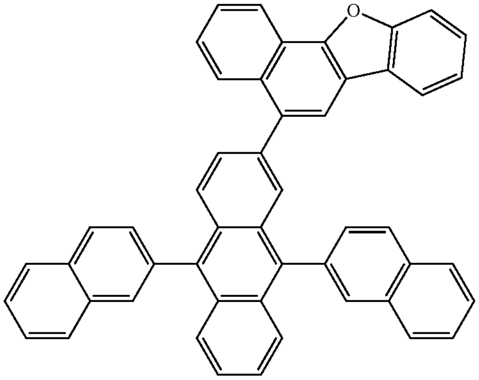
H109
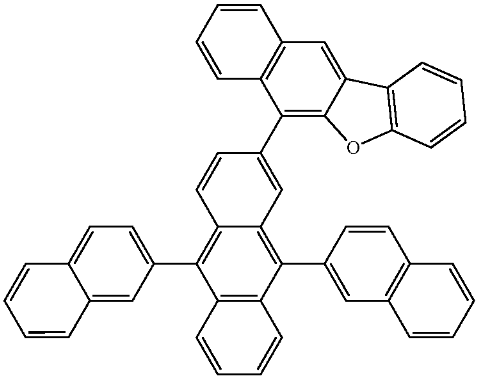
H110
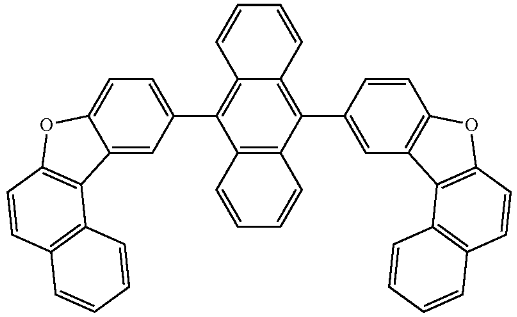

-continued
H111
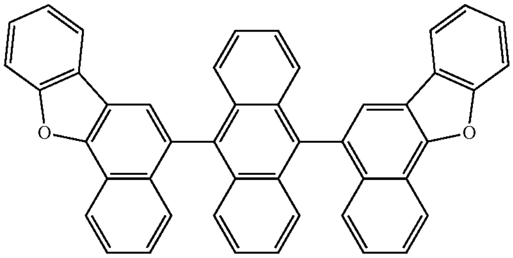
H112
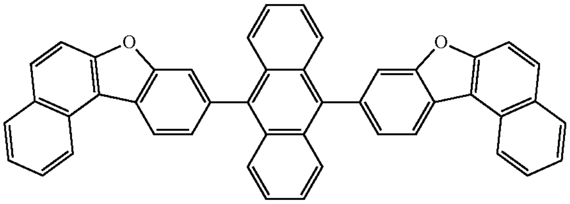
H113
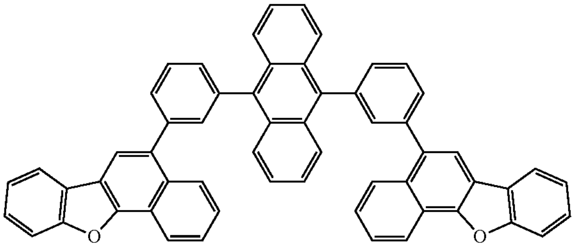
H114
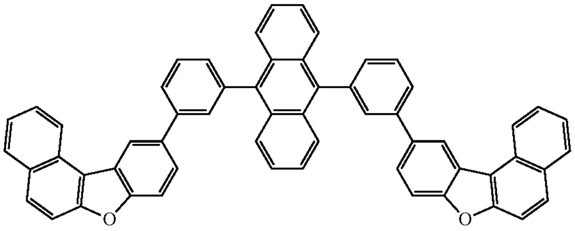
H115
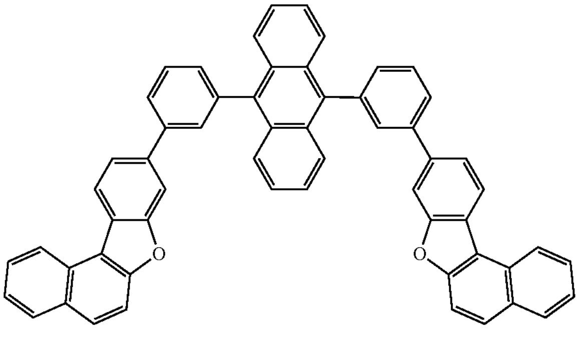
-continued
H116
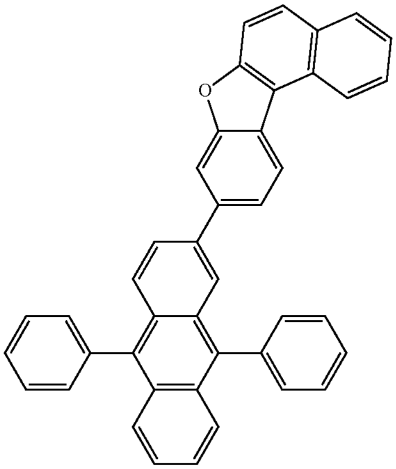
H117
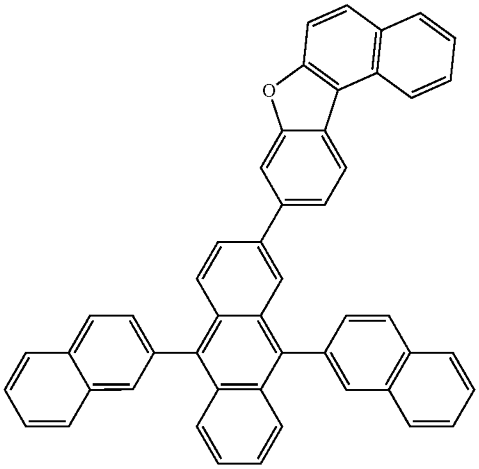
H118
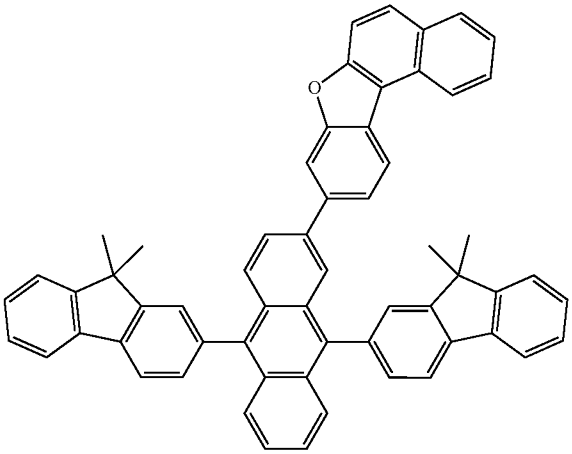

-continued
H119
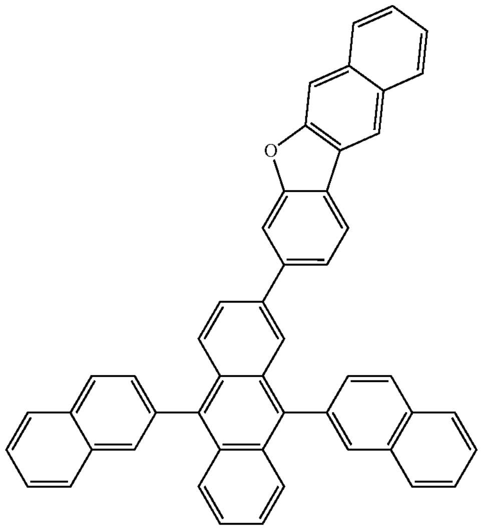
H120
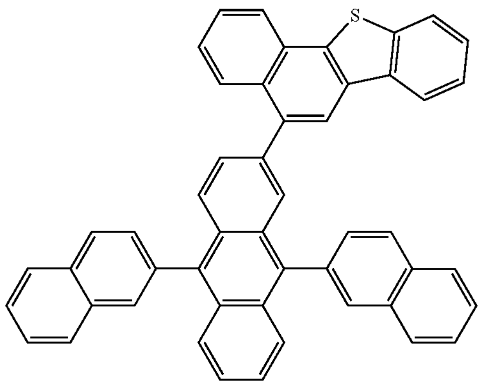
H121
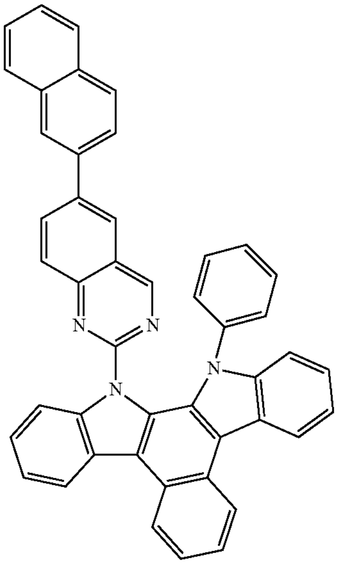
-continued
H122
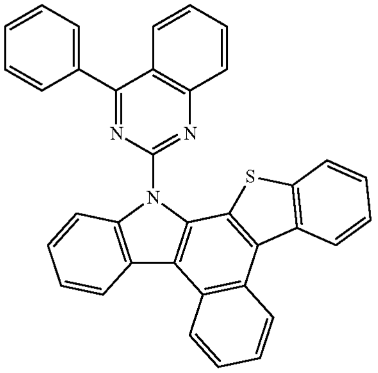
H123
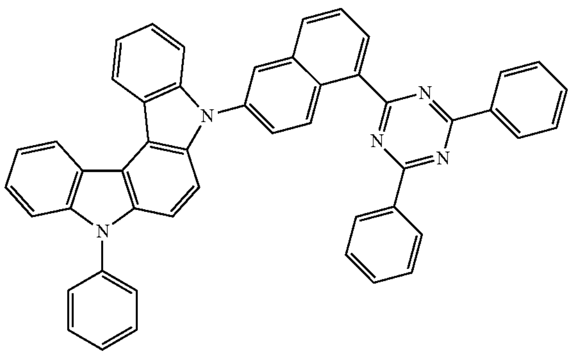
H124
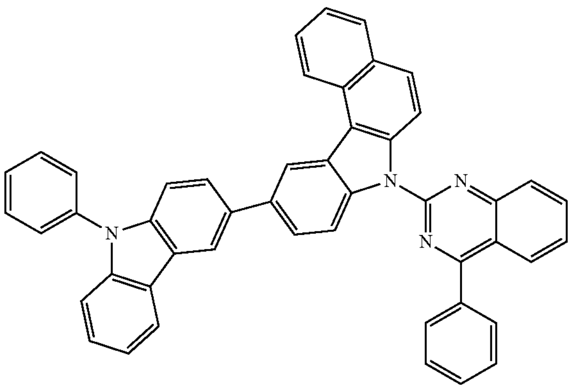
H_01
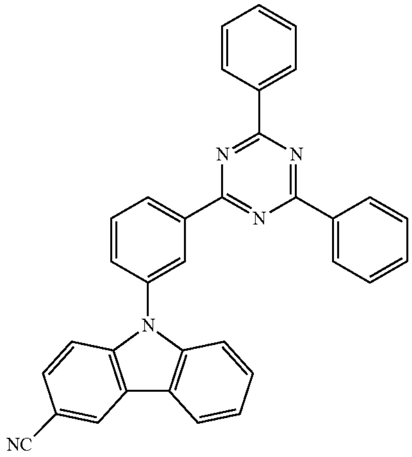

-continued
H_02
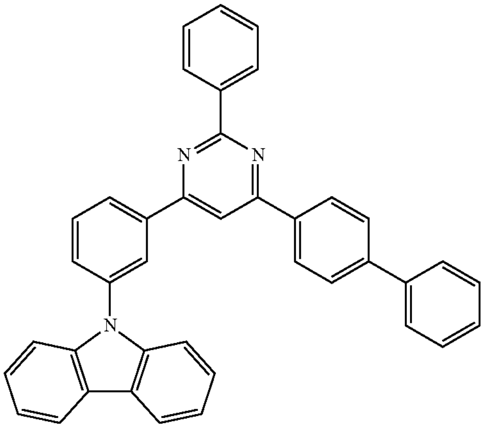
H_03
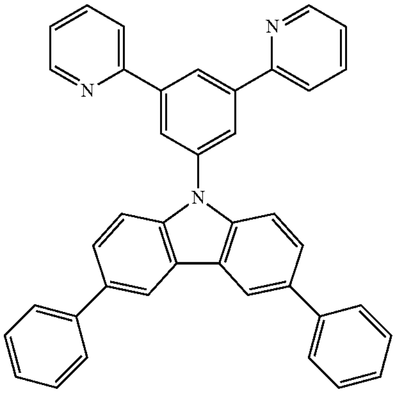
H_04
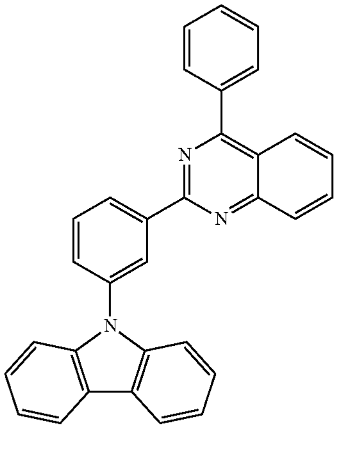
-continued
H_05
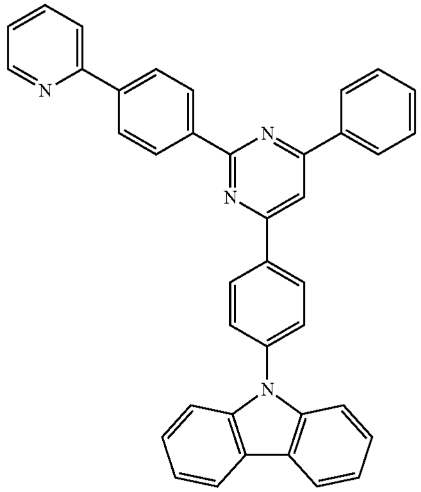
H_06
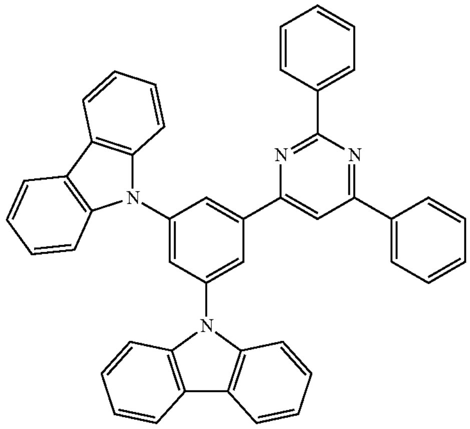
H_07
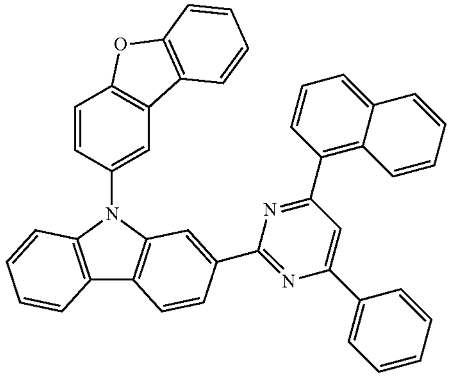

-continued
H_08
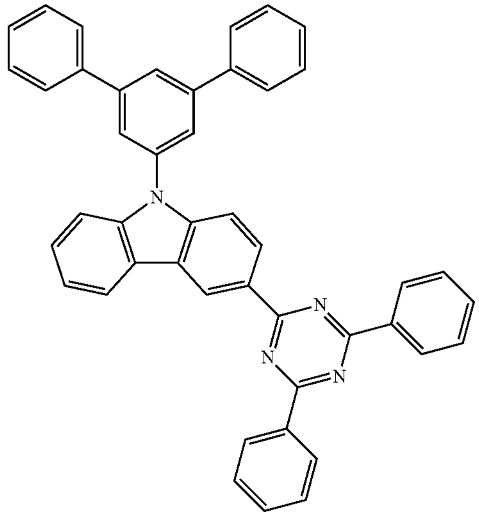
H_09
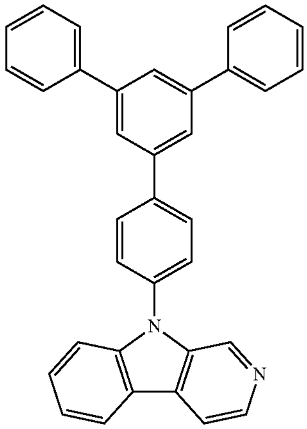
H_10
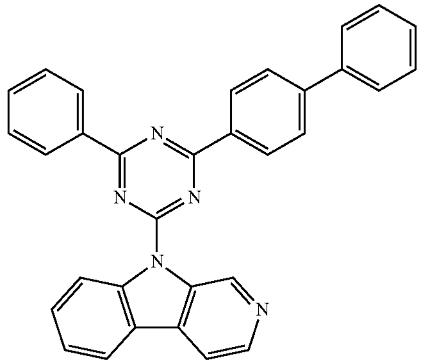
-continued
H_11
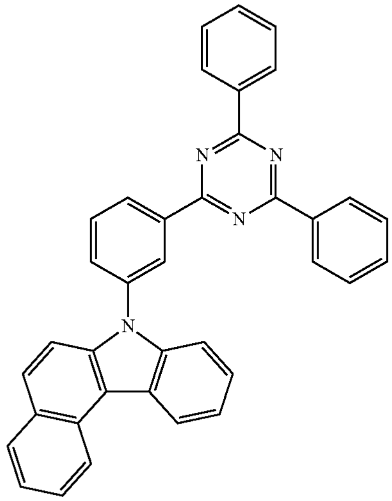
H_12
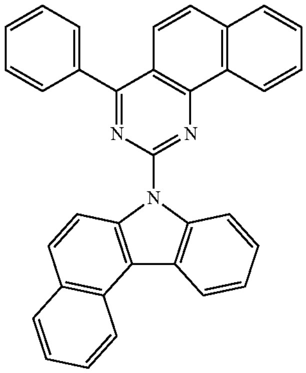
H_13
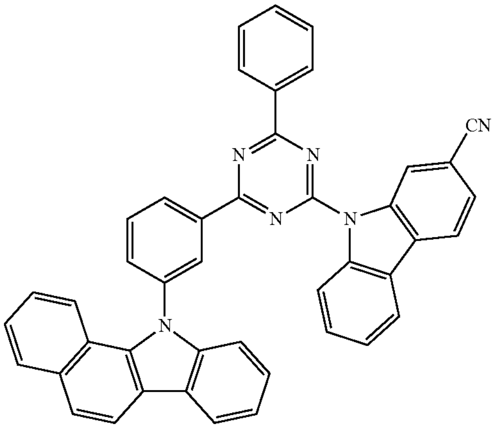

-continued
H_14
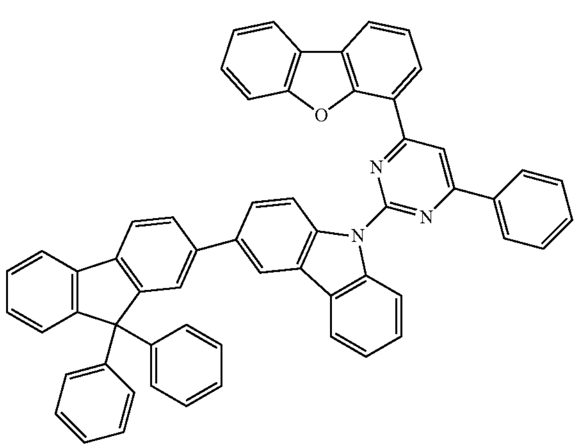
H_15
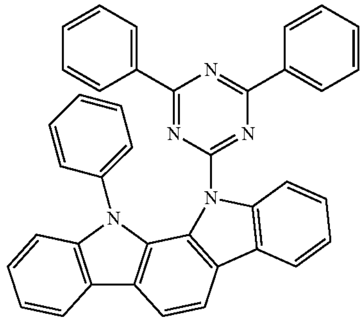
H_16
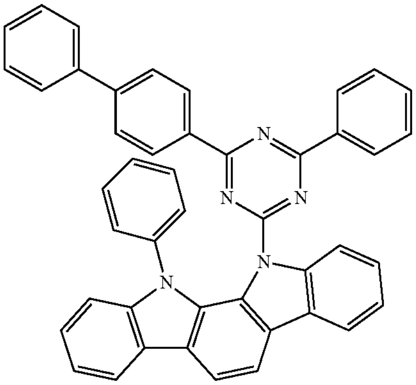
H_17
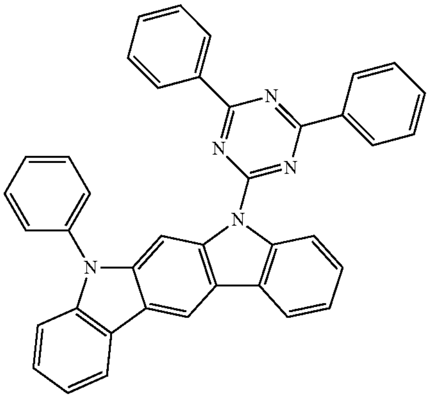
-continued
H_18
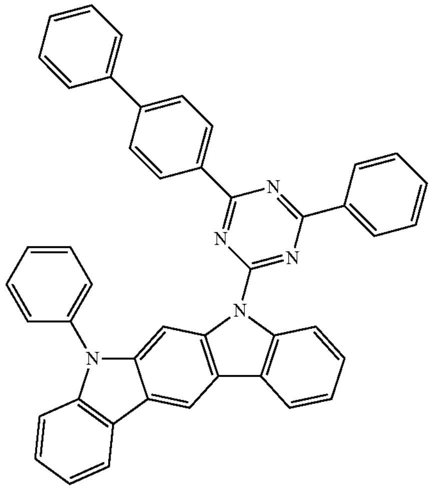
H_19
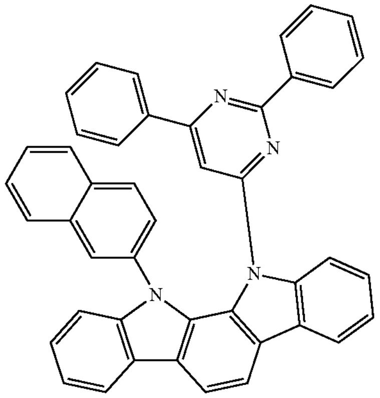
H_20
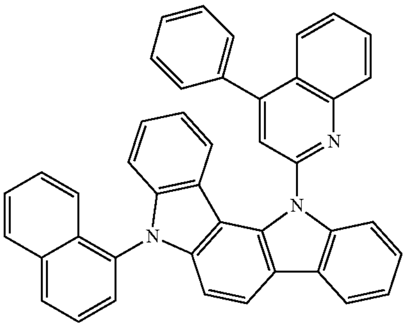
H_21
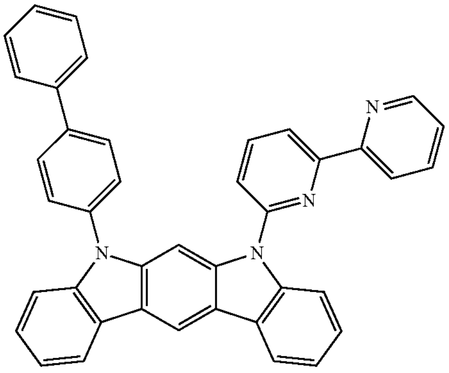

-continued
H_22
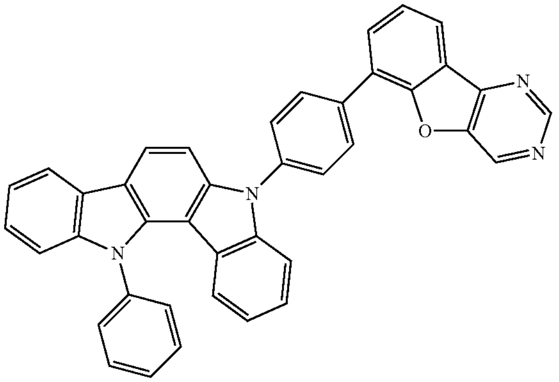
H_23
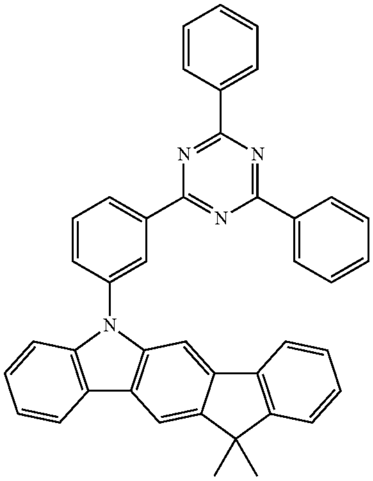
H_24
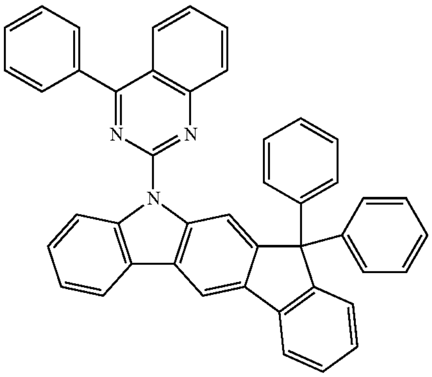
-continued
H_25
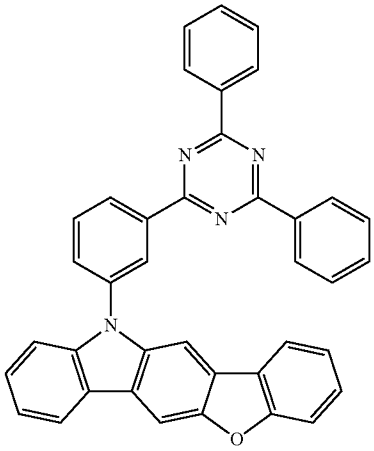
H_26
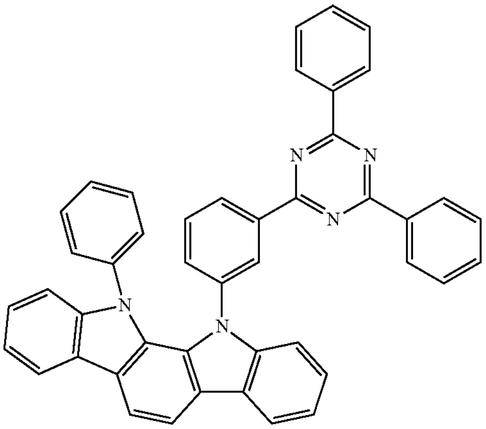
H_27
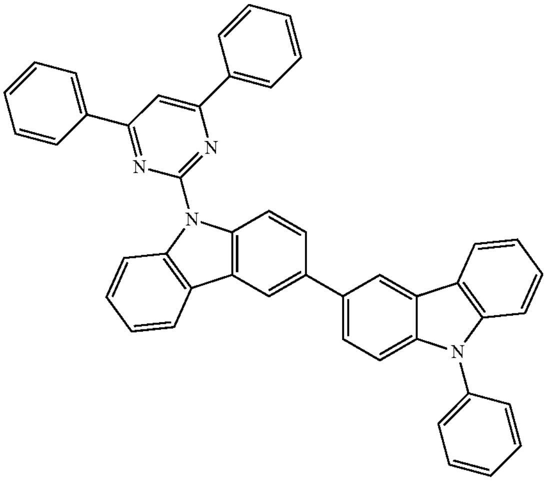

-continued
H_28
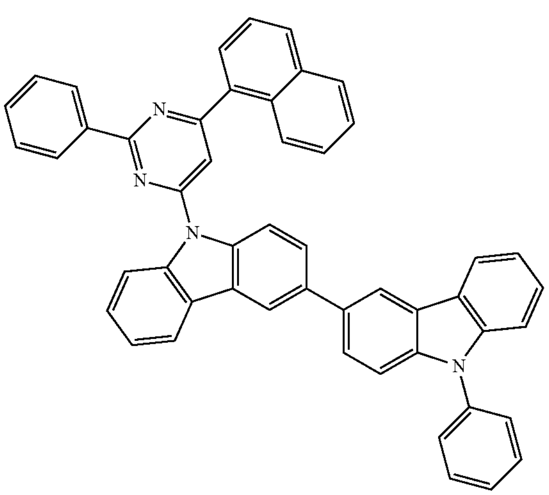
H_29
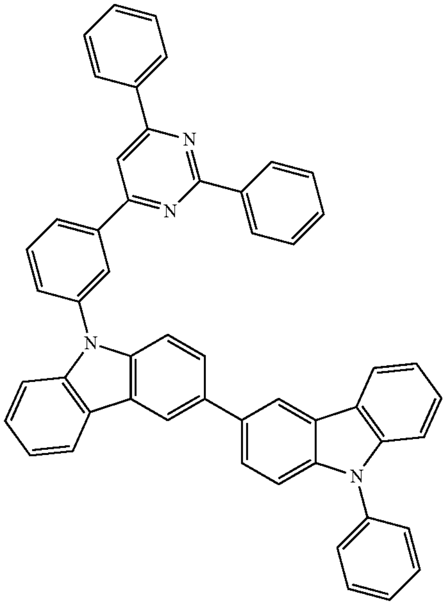
H_30
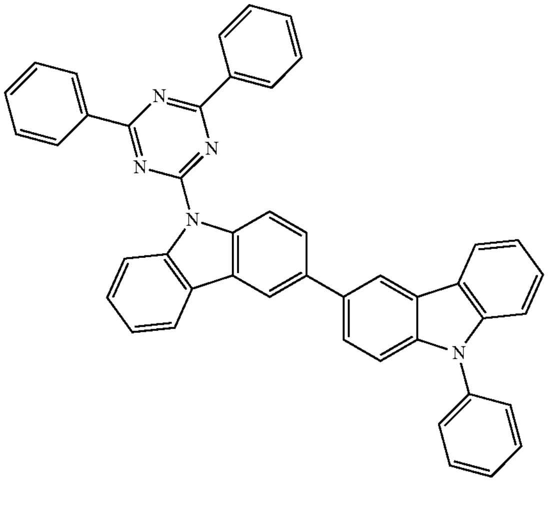
-continued
H_31
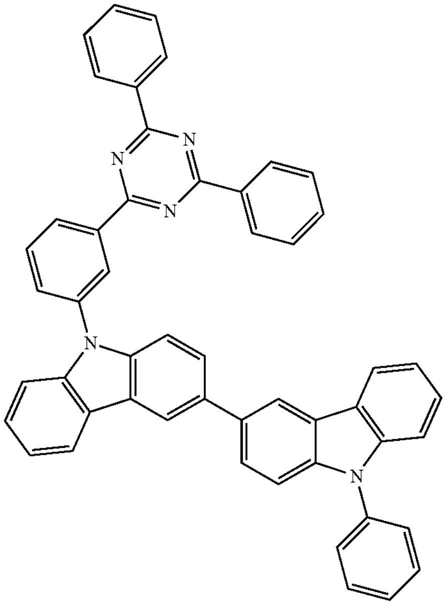
H_32
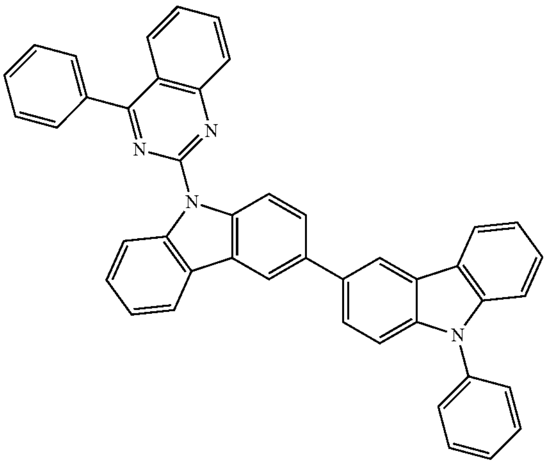
H_33
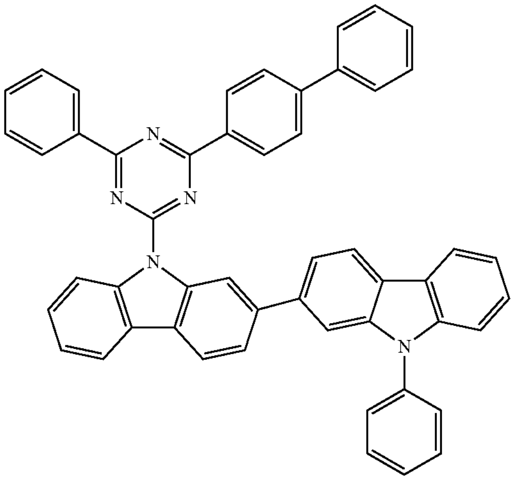

-continued

H_34

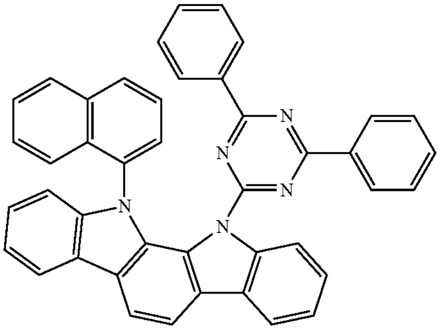

H_35

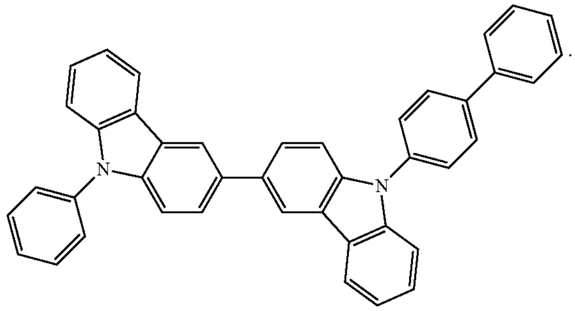

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the first-first dopant and the second-first dopant may each independently include an organometallic compound represented by Formula 401:

[Formula 401]

$M(L_{401})_{xc1}(L_{402})_{xc2}$

[Formula 402]

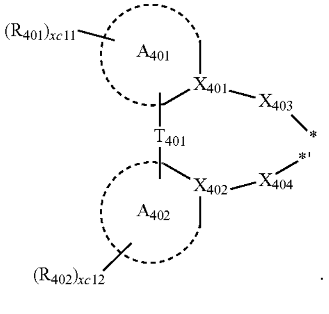

In Formulae 401 and 402,

M may be Ir or Pt, $L_{401}$ may be a ligand represented by Formula 402, and xc1 may be 1, 2, or 3, and when xc1 is 2 or more, two or more of $L_{401}$ may be identical to or different from each other, $L_{402}$ may be an organic ligand, and xc2 may be 0, 1, 2, 3, or 4, wherein, when xc2 is 2 or more, two or more of $L_{402}$ may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C($Q_{411}$)=, $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10,

* and *' in Formula 402 each indicate a binding site to M in Formula 401, and when M is Pt, a ligand of Formula 401 may essentially include a pyridine moiety.

In an embodiment, in Formula 402, $X_{401}$ may be nitrogen and $X_{402}$ may be carbon, or $X_{401}$ and $X_{402}$ may each be nitrogen.

In an embodiment, when xc1 in Formula 401 is 2 or more, two ring $A_{401}$(s) among two or more of $L_{401}$ may optionally be linked to each other via $T_{402}$, which may be a linking group, and two ring $A_{402}$(s) among two or more of $L_{401}$ may optionally be linked to each other via $T_{403}$, which may be a linking group. $T_{402}$ and $T_{403}$ may each be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

In the light-emitting device according to an embodiment, the first emission layer may include the first-first dopant, the second emission layer may include the second-first dopant, and the first emission layer and the second emission layer may each be appropriately located, so that the efficiency and lifespan of the device may be improved. However, since the first-first dopant and the second-first dopant have a wide full width at half maximum (FWHM), color purity and efficiency may be decreased, and charge imbalance due to hole-trapping characteristics may cause limitations in increasing efficiency.

Accordingly, specific combinations of the first host compound, the second host compound, the first-first dopant compound, the second-first dopant compound, the first-second dopant compound, and the second-second dopant compound may be required to resolve the above issues. The light-emitting device according to an embodiment has resolved such issues.

The phosphorescent dopant may include, for example, one of Compounds D1 to D37, or any combination thereof:
D1
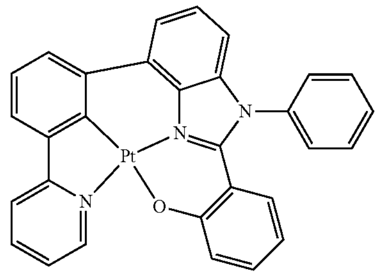
D2
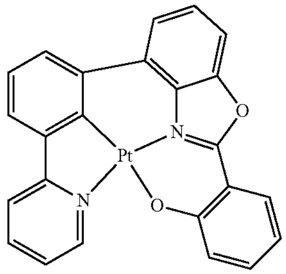
D3
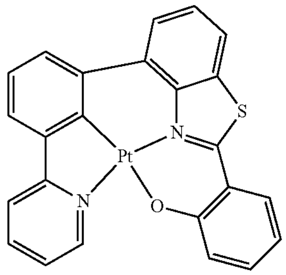
D4
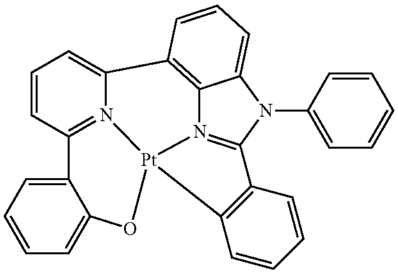
D5
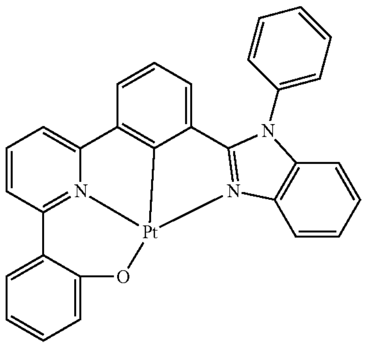
-continued
D6
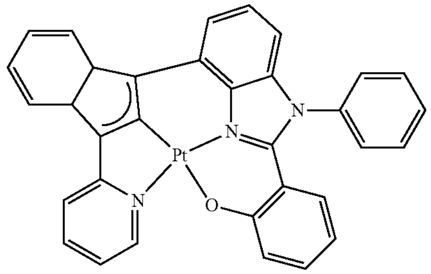
D7
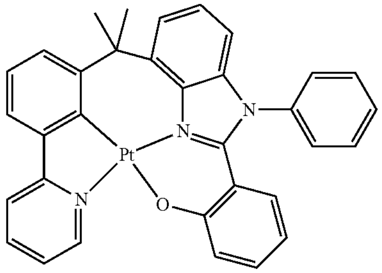
D8
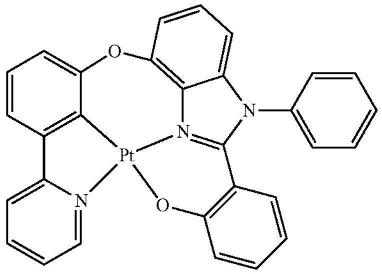
D9
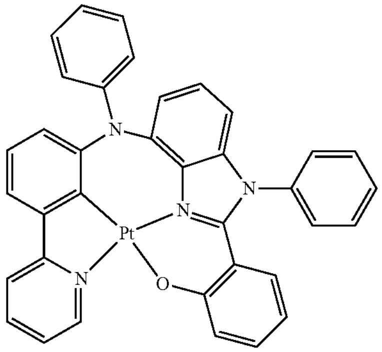
D10
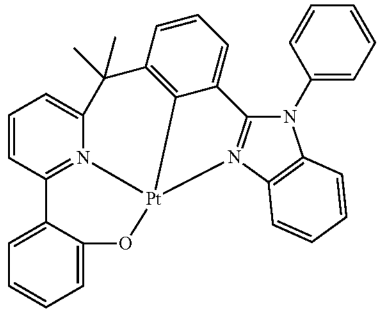

-continued
D11
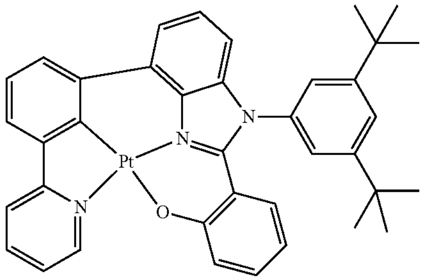
D12
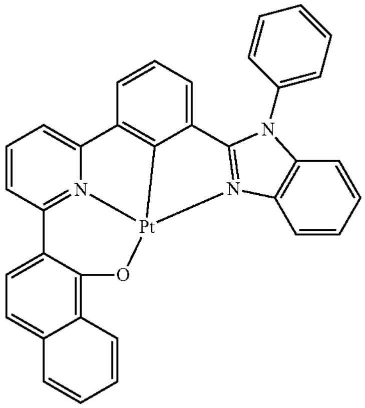
D13
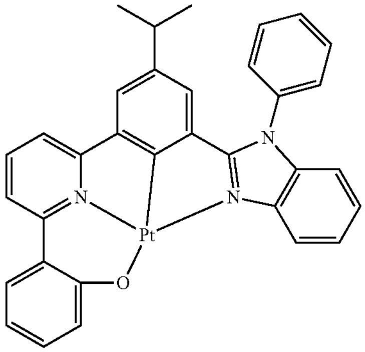
D14
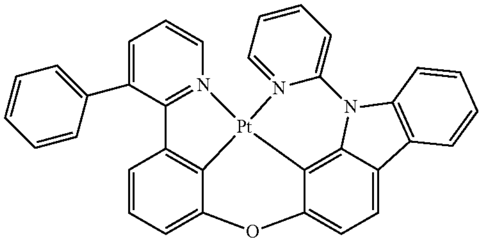
D15
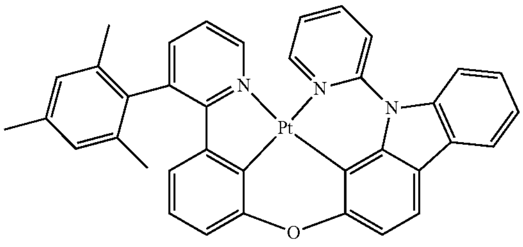
-continued
D16
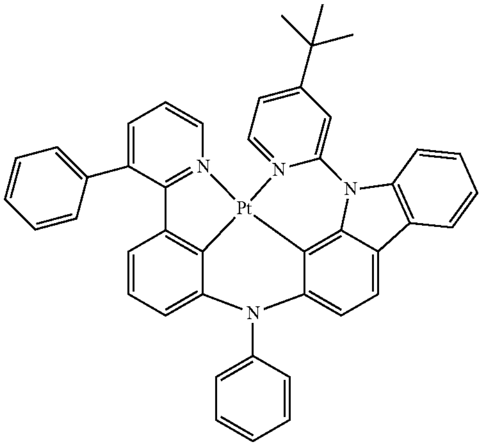
D17
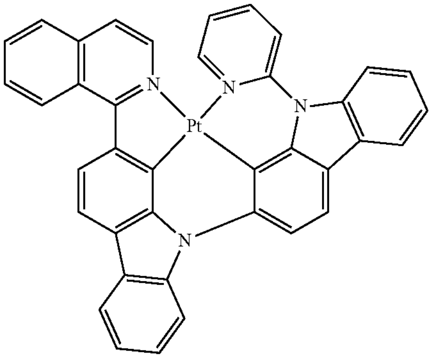
D18
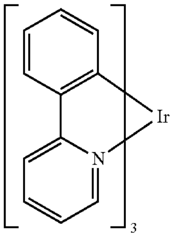
D19
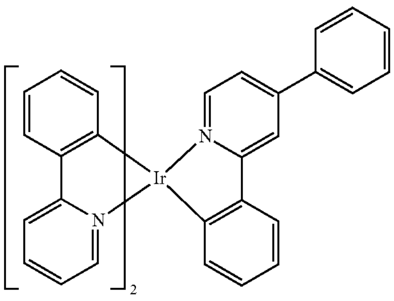

-continued
D20
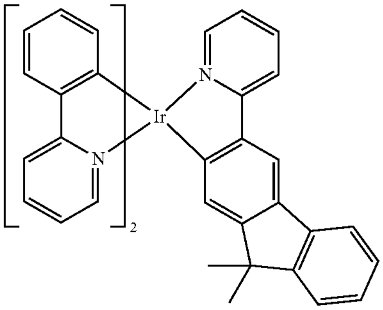
D21
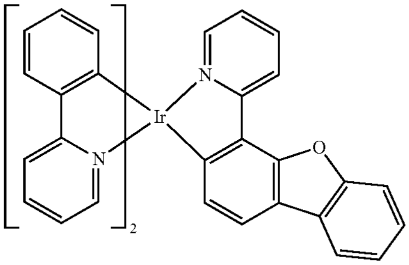
D22
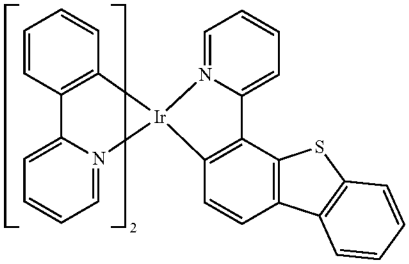
D23
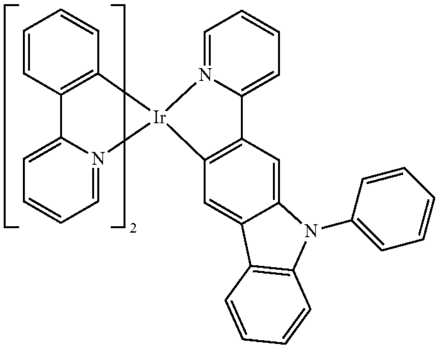
D24
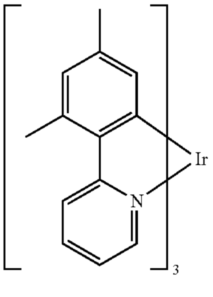
-continued
D25
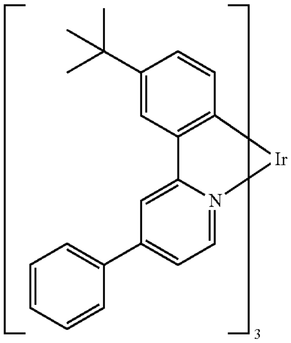
D26
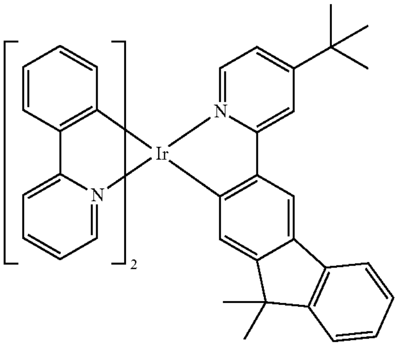
D27
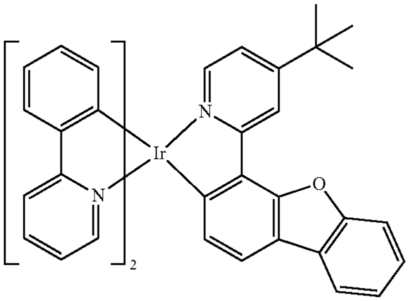
D28
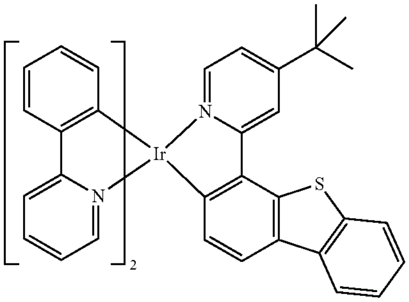

-continued

D29

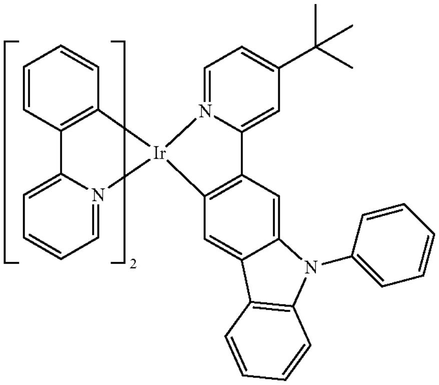

D30

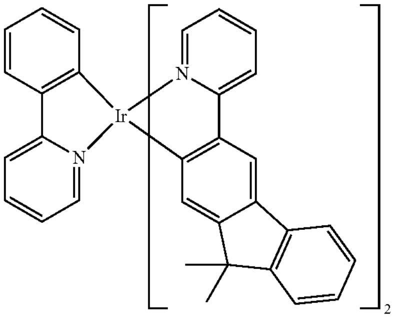

D31

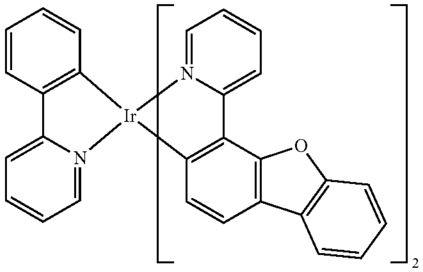

D32

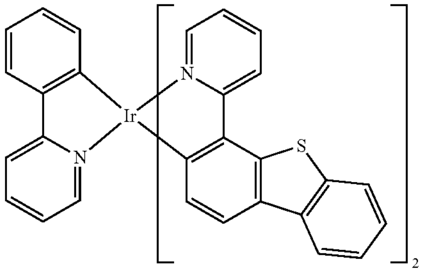

D33

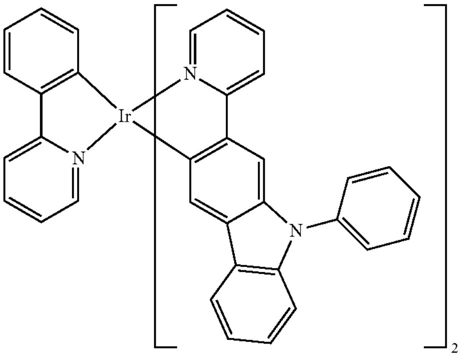

-continued

D34

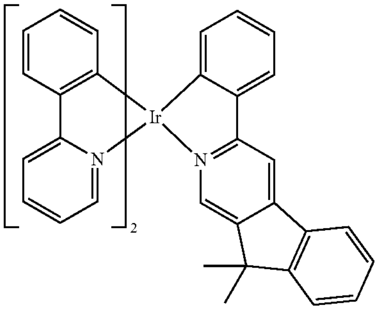

D35

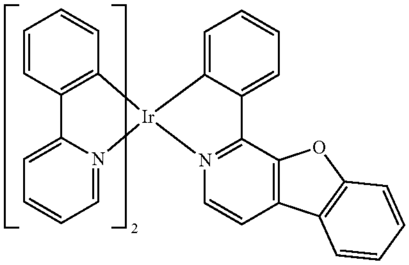

D36

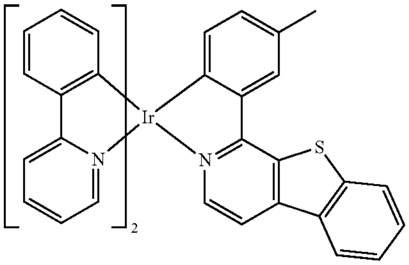

D37

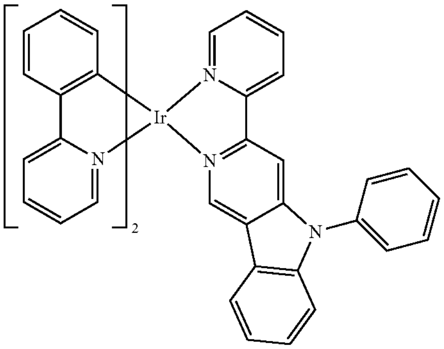

.

[Delayed Fluorescence Material]

The emission layer may include a delayed fluorescence material.

The delayed fluorescence material described herein may be selected from compounds capable of emitting delayed fluorescence based on a delayed fluorescence emission mechanism.

The delayed fluorescence material included in the emission layer may serve as a host or as a dopant depending on the type of other materials included in the emission layer.

In an embodiment, a difference between a triplet energy level (eV) of the delayed fluorescence material and a singlet energy level (eV) of the delayed fluorescence material may be in a range of 0 eV to about 0.5 eV. When the difference between the triplet energy level (eV) of the delayed fluorescence material and the singlet energy level (eV) of the delayed fluorescence material is satisfied within the range above, up-conversion from the triplet state to the singlet state of the delayed fluorescence materials may effectively occur, and thus, the light-emitting device 10 may have improved luminescence efficiency.

For example, the delayed fluorescence material may include: a material including at least one electron donor (for example, a π electron-rich $C_3$-$C_{60}$ cyclic group and the like, such as a carbazole group) and at least one electron acceptor (for example, a sulfoxide group, a cyano group, or a π electron-deficient nitrogen-containing $C_1$-$C_{60}$ cyclic group, and the like), a material including a $C_8$-$C_{60}$ polycyclic group including at least two cyclic groups condensed to each other while sharing boron (B), and the like.

In an embodiment, the first-second dopant and the second-second dopant may each independently be a boron-based compound having a multiple resonance structure, and may also have a structure including not only one boron atom but also two or more boron atoms. The first-second dopant and the second-second dopant may also have a structure of an indolocarbazole-based or dipyrrometheneboron difluoride (BODIPY)-based multiple resonance type.

In an embodiment, the first-second dopant and the second-second dopant may each independently include, for example, the following moiety:

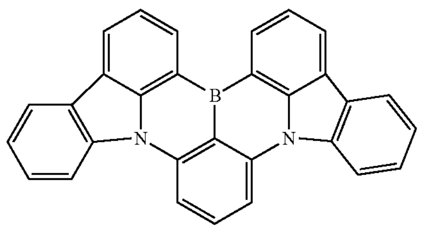

.

By including the above moiety, the first-second dopant and the second-second dopant may have the effects of suppressing molecular vibration and increasing electron density due to electron density rearrangement in an atomic unit. As compared with donor-acceptor type delayed fluorescence dopants of the related art, the first-second dopant and the second-second dopant may have high photoluminescence quantum yield (PLQY) characteristics, an energy difference ($\Delta E_{ST}$) between singlet and triplet excited states less than or equal to about 0.2 eV, a narrow FWHM, and Stokes' shift characteristics. The first-second dopant and the second-second dopant may be identical to or different from each other.

When the first-second dopant and/or the second-second dopant is used with a phosphorescent dopant, Forster energy transfer from the phosphorescent dopant to the first-second dopant and/or the second-second dopant may be maximized, and Dexter energy transfer from the phosphorescent dopant to the first-second dopant and/or the second-second dopant may be suppressed, so that improved optical and electrical performance compared to that of light-emitting devices of the related art may be secured.

In an embodiment, the first-second dopant and the second-second dopant may each independently include a t-butyl group. Since the first-second dopant and the second-second dopant include a t-butyl group, Dexter energy transfer may be suppressed, so that a decrease in efficiency of the light-emitting device may be prevented.

In an embodiment, the first-second dopant and the second-second dopant may each independently include at least one of Compounds MR1 to MR4:

MR1

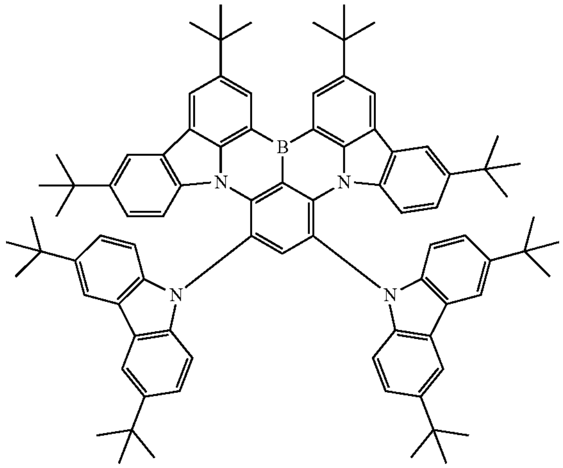

MR2

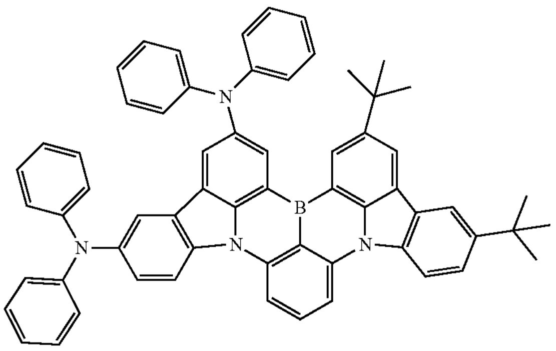

MR3

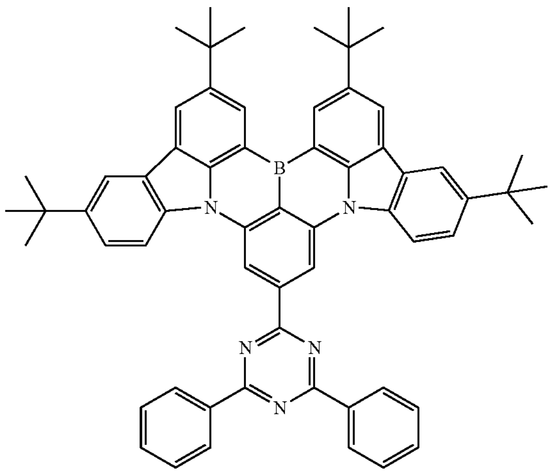

-continued

MR4

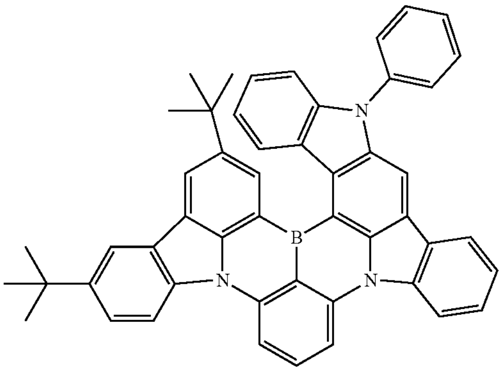

[Electron Transport Region in Interlayer 130]

The electron transport region may have a structure consisting of a layer consisting of a single material, a structure consisting of a layer including different materials, or a structure including multiple layers including different materials.

The electron transport region may include a hole-blocking layer, an electron transport layer, an electron injection layer, or any combination thereof.

For example, the electron transport region may have an electron transport layer/electron injection layer structure or a hole-blocking layer/electron transport layer/electron injection layer structure, wherein the layers of each structure may be stacked from the emission layer in its respective stated order, but the structure of the electron transport region is not limited thereto.

The electron transport region (for example, the hole-blocking layer or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21}. \qquad \text{[Formula 601]}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, in Formula 601, when xe11 is 2 or more, two or more of $Ar_{601}$ may be linked to each other via a single bond.

In embodiments, in Formula 601, $Ar_{601}$ may be a substituted or unsubstituted anthracene group.

In embodiments, the electron transport region may include a compound represented by Formula 601-1:

[Formula 601-1]

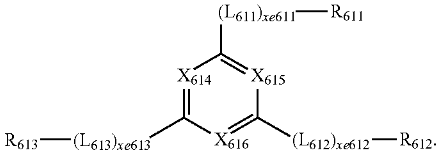

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may each be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, In Formulae 601 and 601-1, xe1 and xe611 to xe613 may each independently be 0, 1, or 2.

The electron transport region may include one of Compounds ET1 to ET47, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

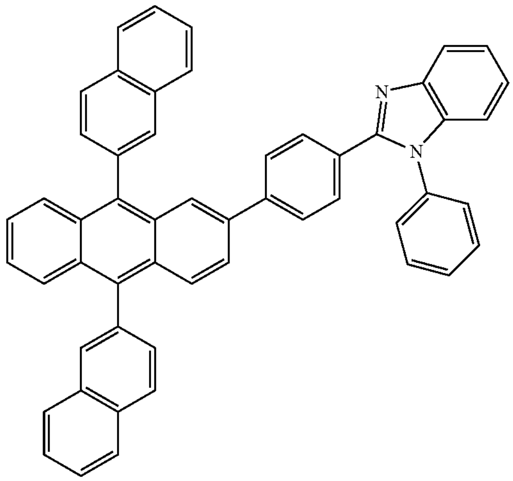

-continued
ET2
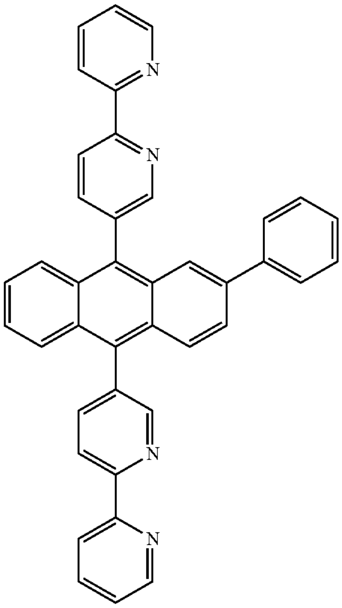
ET3
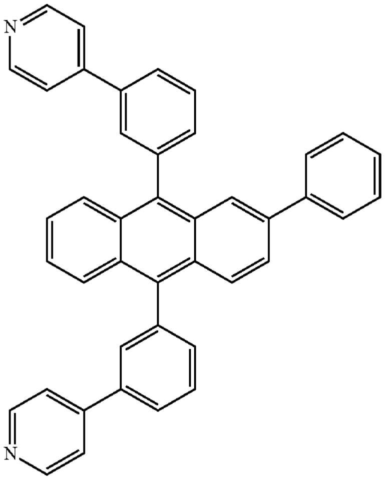
ET4
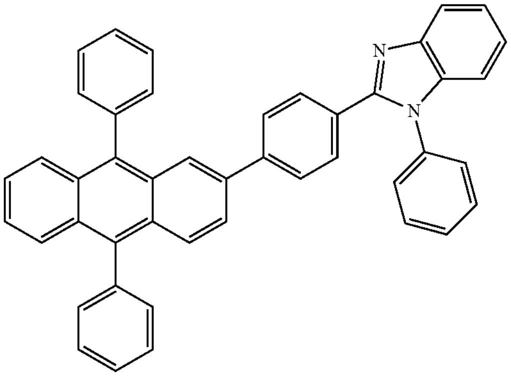
-continued
ET5
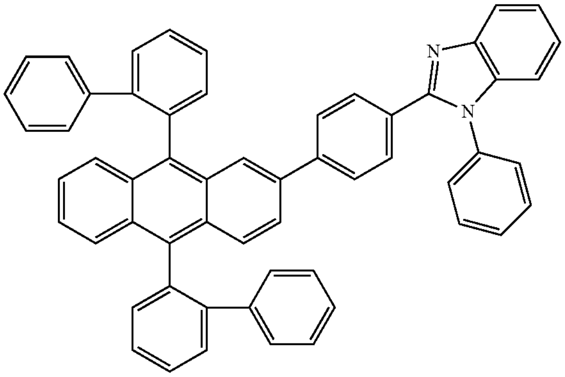
ET6
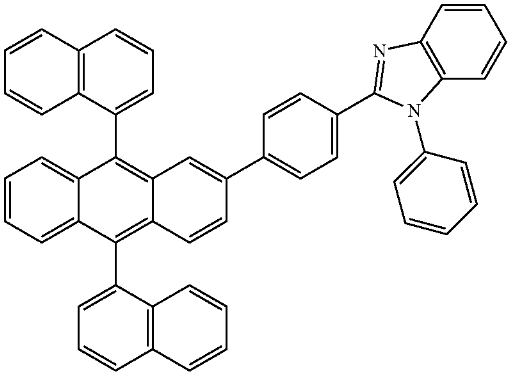
ET7
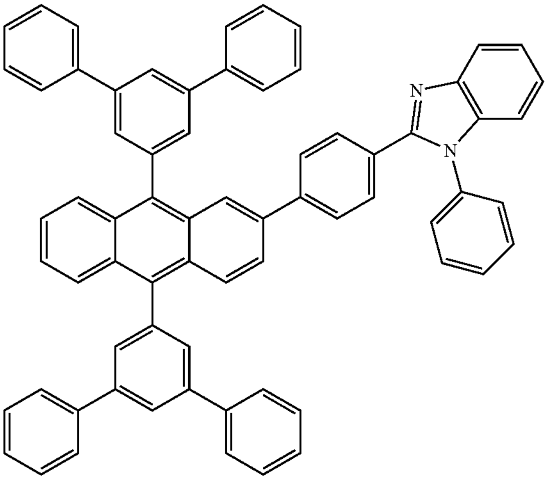

-continued
ET8
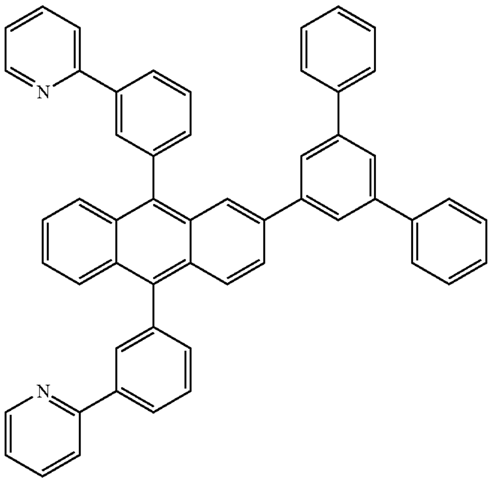
ET9
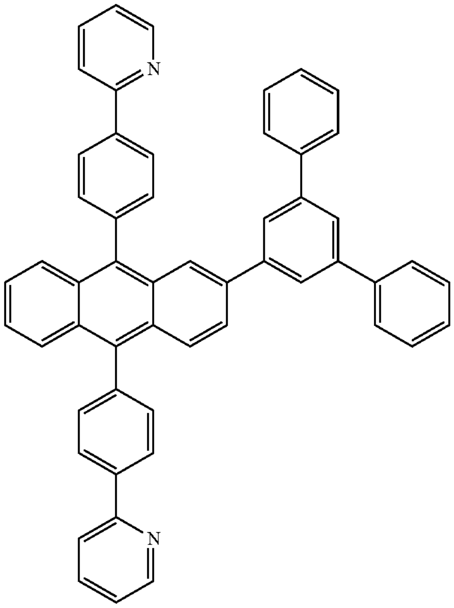
-continued
ET10
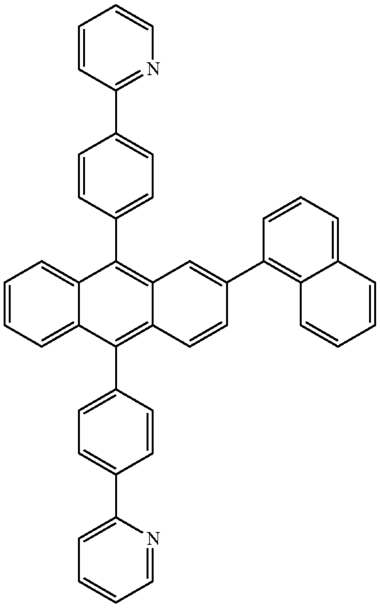
ET11
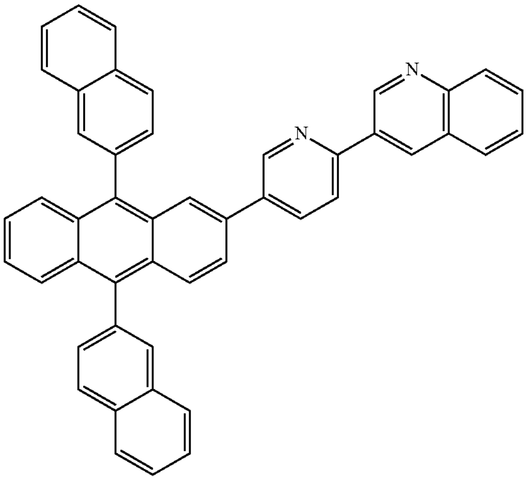
ET12
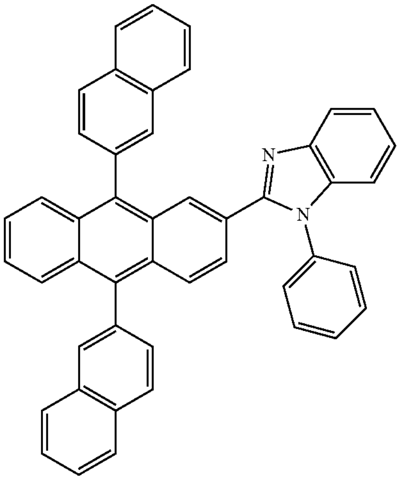

-continued
ET13
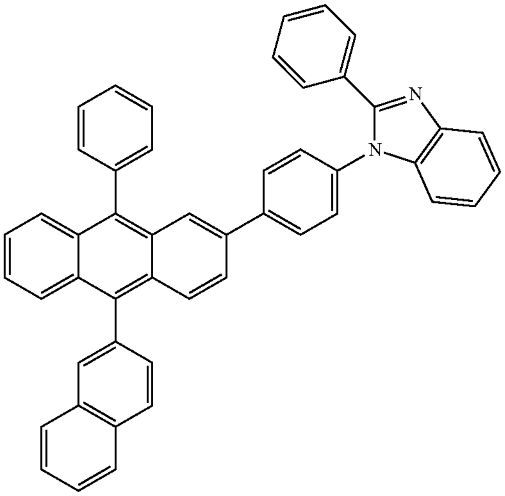
ET14
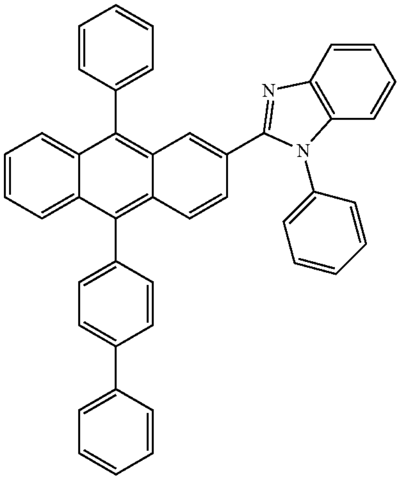
ET15
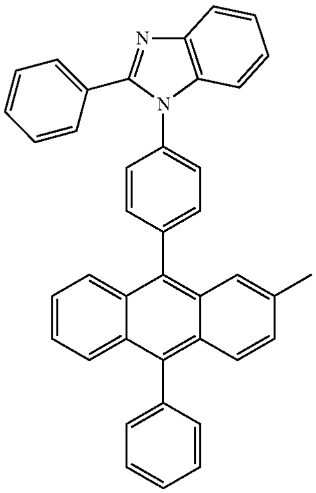
-continued
ET16
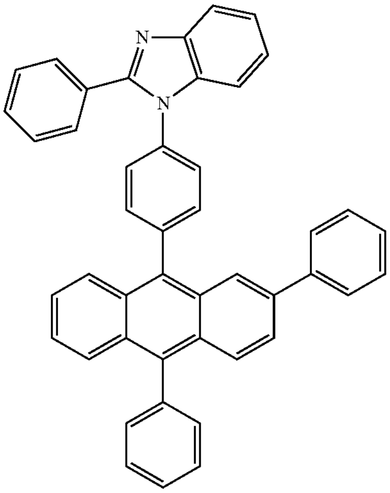
ET17
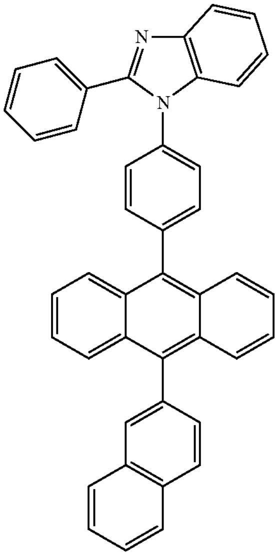
ET18
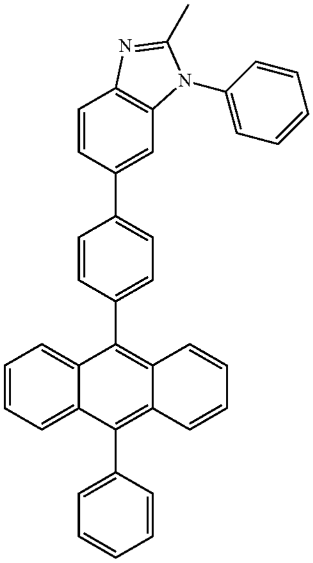

-continued
ET19
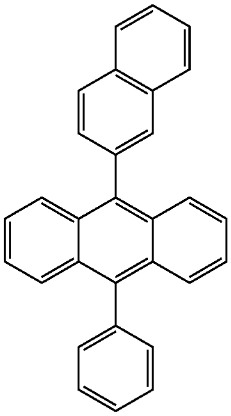
ET20
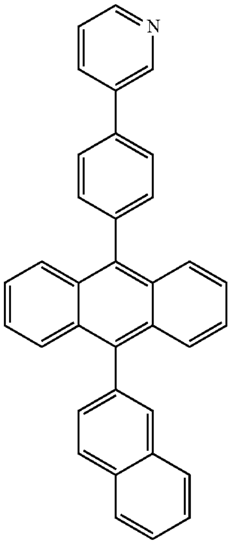
ET21
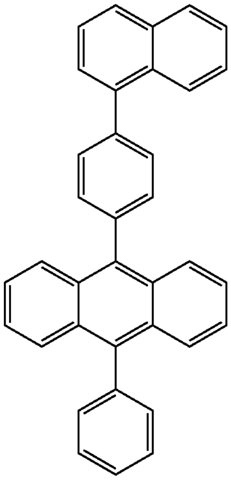
-continued
ET22
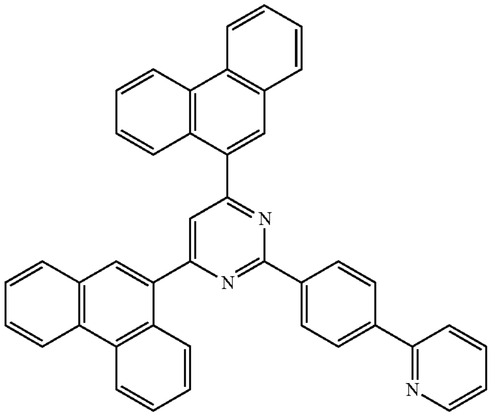
ET23
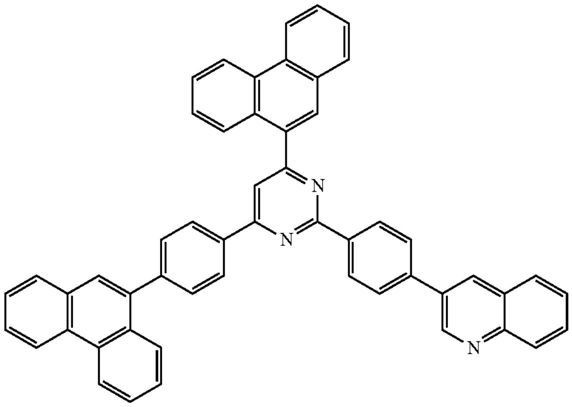
ET24
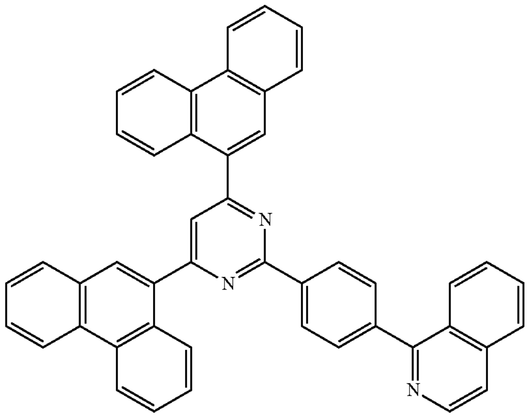

-continued
ET25
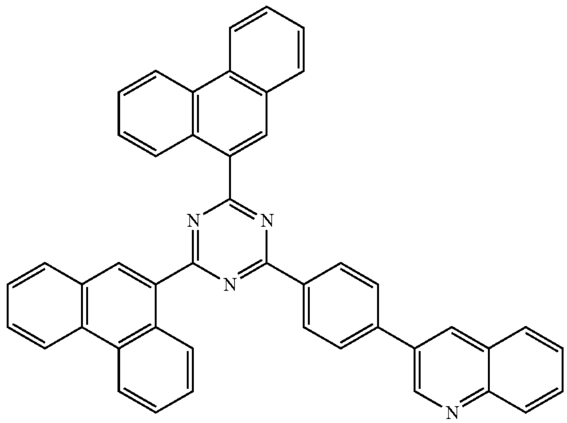
ET26
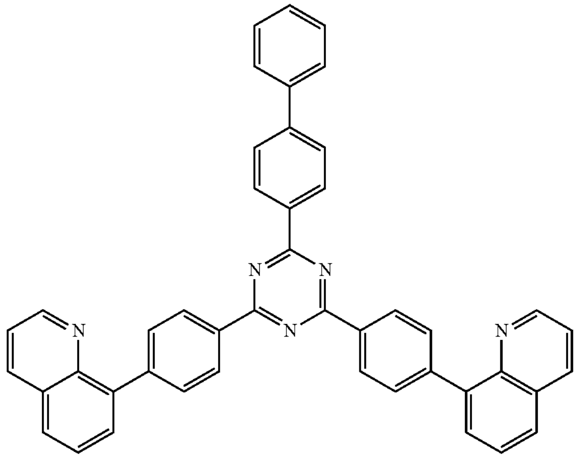
ET27
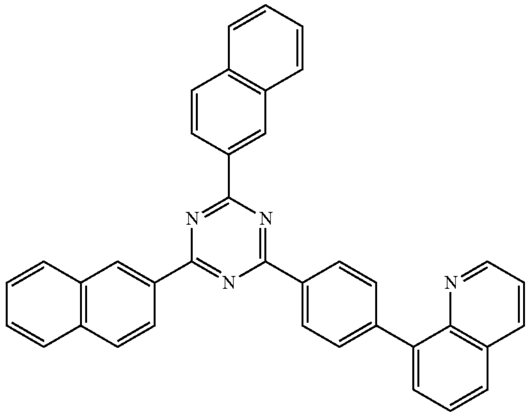
-continued
ET28
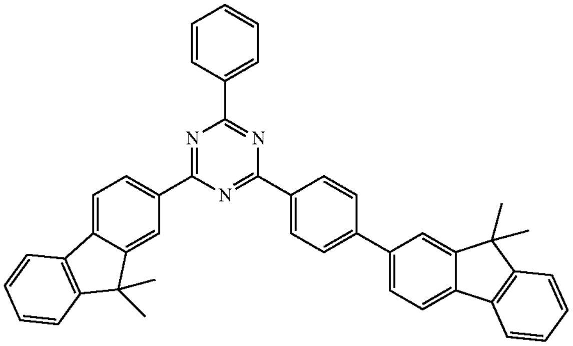
ET29
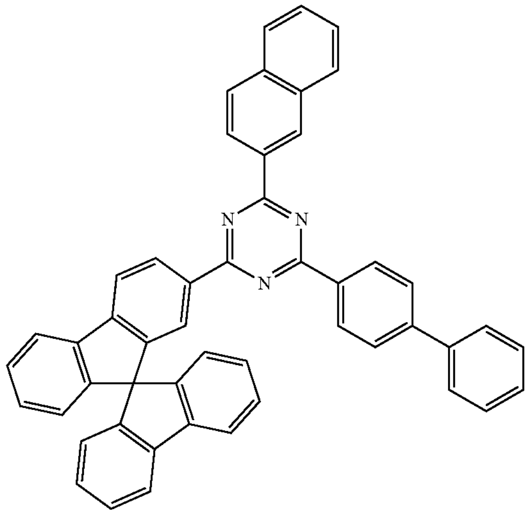
ET30
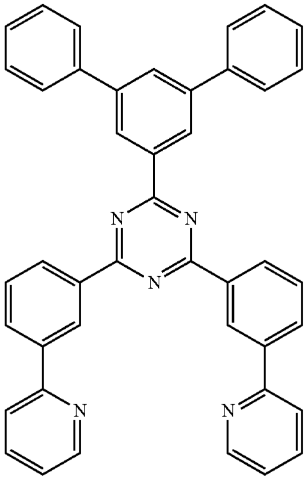

-continued
ET31
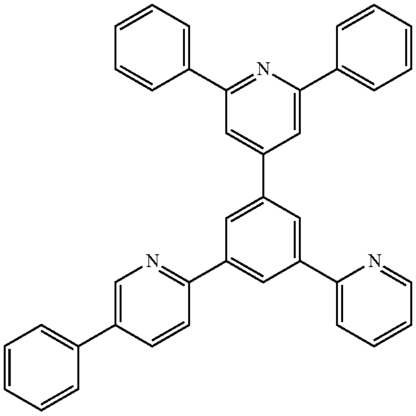
ET32
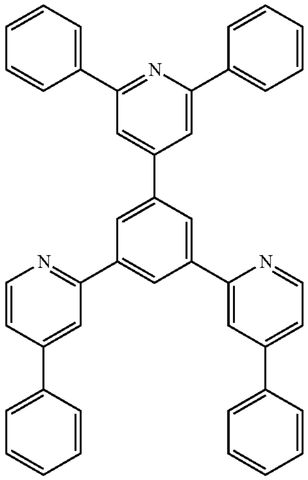
ET33
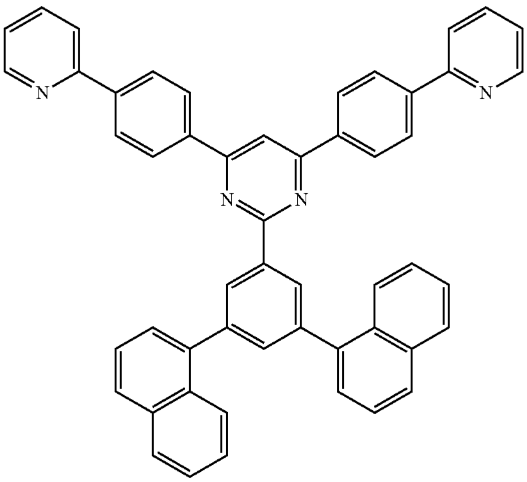
-continued
ET34
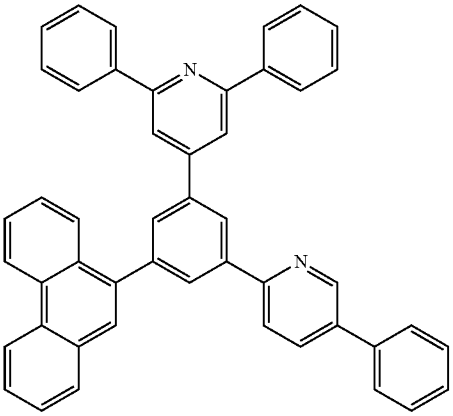
ET35
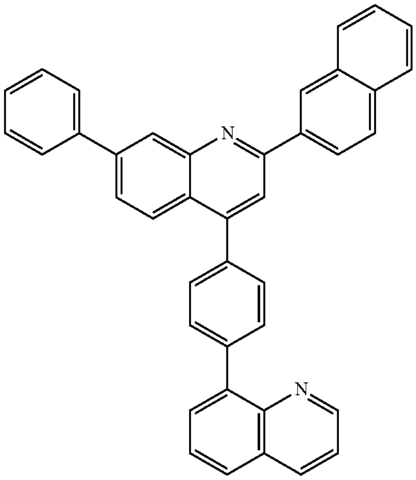
ET36
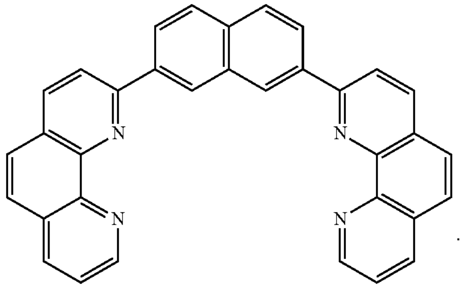
ET37
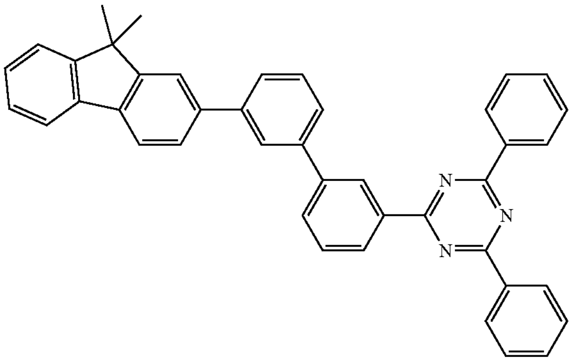

-continued
ET38
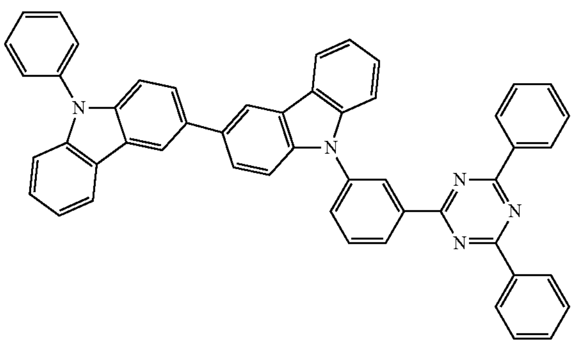
ET39
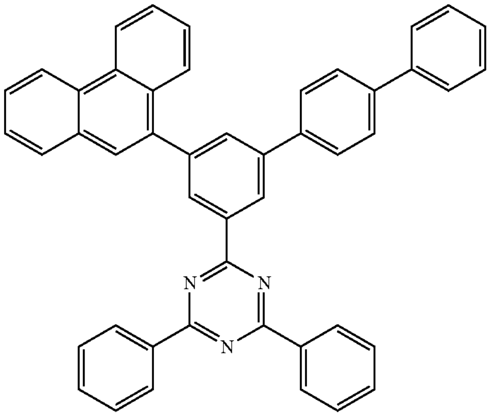
ET40
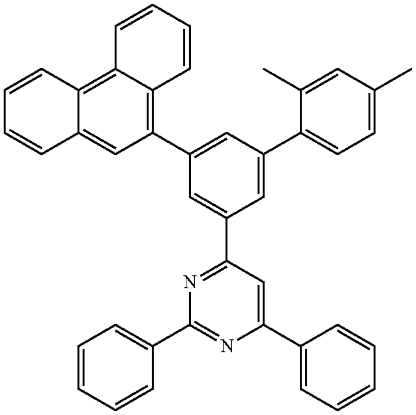
ET41
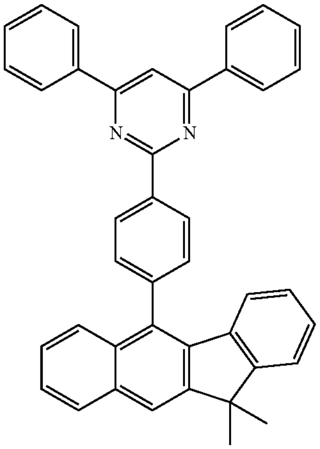
-continued
ET42
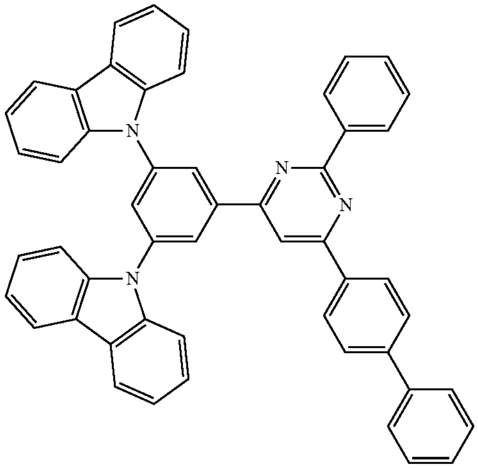
ET43
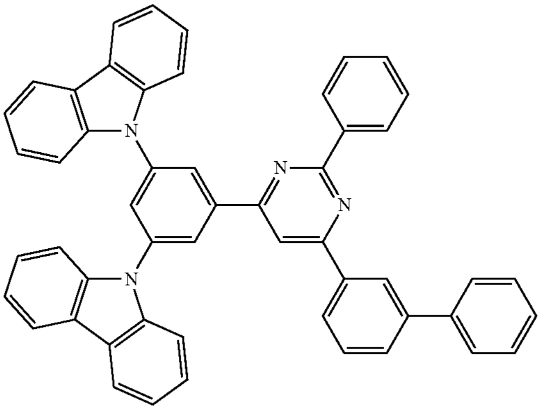
ET44
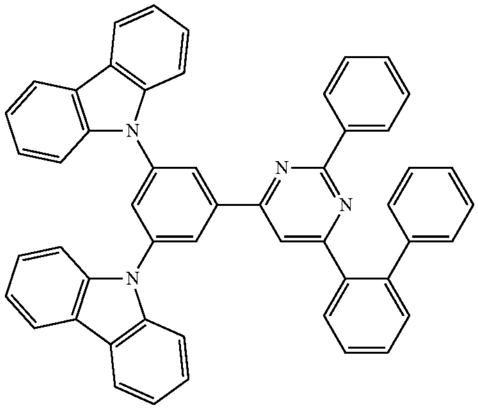
ET45
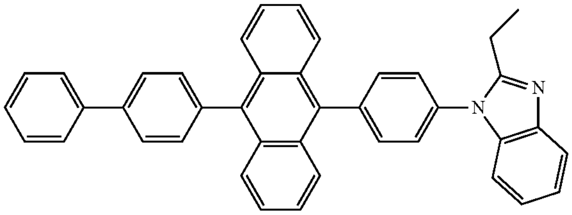

-continued

ET46

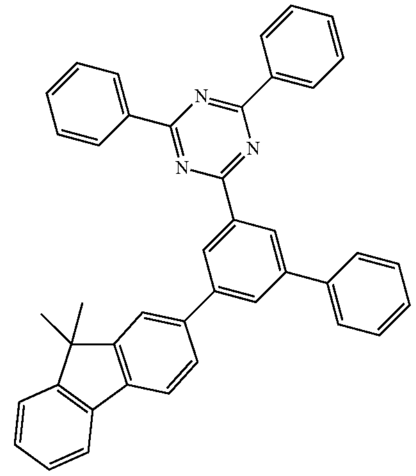

ET47

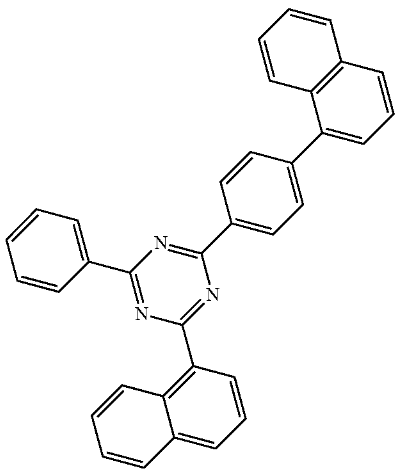

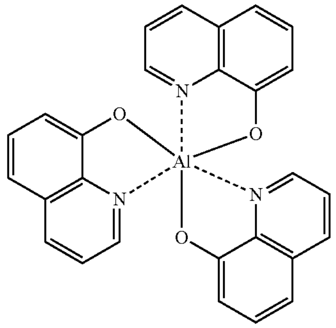

Alq3

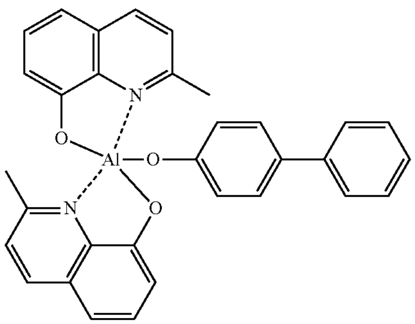

BAlq

-continued

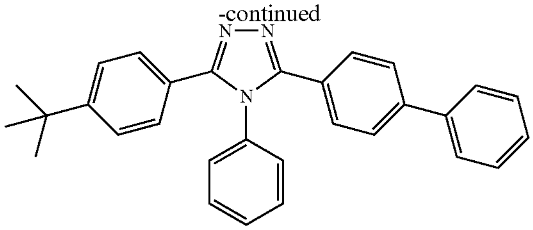

TAZ

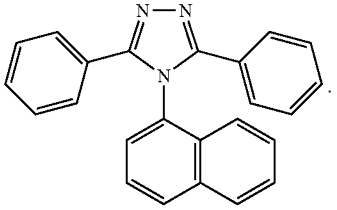

NTAZ

A thickness of the electron transport region may be in a range of about 100 Å to about 5,000 Å. For example, the thickness of the electron transport region may be in a range of about 160 Å to about 4,000 Å. When the electron transport region includes a hole-blocking layer, an electron transport layer, or any combination thereof, a thicknesses of the hole-blocking layer and the electron transport layer may each independently be in a range of about 20 Å to about 1,000 Å. For example, the thickness of the hole-blocking layer and the electron transport layer may each independently be in a range of about 30 Å to about 300 Å. A thickness of the electron transport layer may be in a range of about 100 Å to about 1,000 Å. For example, the thickness of the electron transport layer may be in a range of about 150 Å to about 500 Å. When the thicknesses of the hole-blocking layer and/or the electron transport layer are within the ranges described above, satisfactory electron-transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of an alkali metal complex may be a Li ion, a Na ion, a K ion, a Rb ion, or a Cs ion, and a metal ion of an alkaline earth metal complex may be a Be ion, a Mg ion, a Ca ion, a Sr ion, or a Ba ion. A ligand coordinated with the metal ion of an alkali metal complex or an alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or Compound ET-D2:

ET-D1

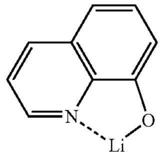

ET-D2

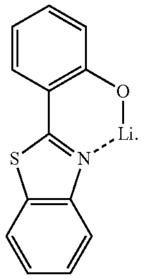

The electron transport region may include an electron injection layer that facilitates the injection of electrons from the second electrode 150. The electron injection layer may contact (e.g., directly contact) the second electrode 150.

The electron injection layer may have a structure consisting of a layer consisting of a single material, a structure consisting of a layer including different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, iodides, etc.), or tellurides of the alkali metal, the alkaline earth metal, and the rare earth metal, or any combination thereof.

The alkali metal-containing compound may include: an alkali metal oxide, such as $Li_2O$, $Cs_2O$, $K_2O$, and the like; alkali metal halides, such as LiF, NaF, CsF, KF, LiI, NaI, CsI, KI, and the like; or any combination thereof. The alkaline earth metal-containing compound may include an alkaline earth metal compound, such as BaO, SrO, CaO, $Ba_xSr_{1-x}O$ (wherein x is a real number satisfying $0<x<1$), $Ba_xCa_{1-x}O$ (wherein x is a real number satisfying $0<x<1$), and the like. The rare earth metal-containing compound may include $YbF_3$, $ScF_3$, $SC_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include: an alkali metal ion, an alkaline earth metal ion, or a rare earth metal ion and; a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

In an embodiment, the electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In an embodiment, the electron injection layer may consist of an alkali metal-containing compound (for example, an alkali metal halide), or the electron injection layer may consist of an alkali metal-containing compound (for example, an alkali metal halide); and an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the ranges described above, satisfactory electron injection characteristics may be obtained without a substantial increase in driving voltage.

[Second Electrode 150]

The second electrode 150 may be on the interlayer 130 having a structure as described above. The second electrode 150 may be a cathode, which is an electron injection electrode. When the second electrode 150 is a cathode, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layer structure or a multi-layer structure.

[Capping Layer]

In an embodiment, the light emitting device 10 may include a first capping layer outside the first electrode 110, and/or a second capping layer outside the second electrode 150. In an embodiment, the light-emitting device 10 may have a structure in which the first capping layer, the first electrode 110, the interlayer 130, and the second electrode 150 are stacked in the stated order, a structure in which the first electrode 110, the interlayer 130, the second electrode 150, and the second capping layer are stacked in the stated order, or a structure in which the first capping layer, the first electrode 110, the interlayer 130, the second electrode 150, and the second capping layer are stacked in the stated order.

Light generated in the emission layer of the interlayer 130 of the light-emitting device 10 may pass through the first electrode 110 which may be a semi-transmissive electrode or a transmissive electrode, and through the first capping layer to the outside. Light generated in the emission layer of the interlayer 130 of the light-emitting device 10 may pass through the second electrode 150 which may be a semi-transmissive electrode or a transmissive electrode, and through the second capping layer to the outside.

The first capping layer and the second capping layer may each increase external emission efficiency according to the principle of constructive interference. Accordingly, the light extraction efficiency of the light-emitting device 10 may be increased, so that the luminescence efficiency of the light-emitting device 10 may be improved.

The first capping layer and the second capping layer may each independently include a material having a refractive index equal to or greater than about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof.

In an embodiment, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include: one of Compounds HT28 to HT33; one of Compounds CP1 to CP6; β-NPB; or any combination thereof:

CP1

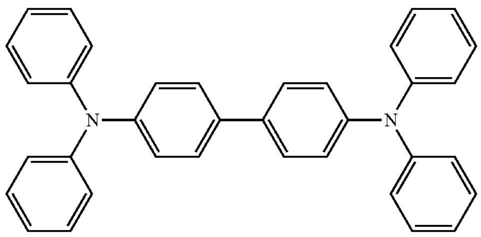

-continued

CP2

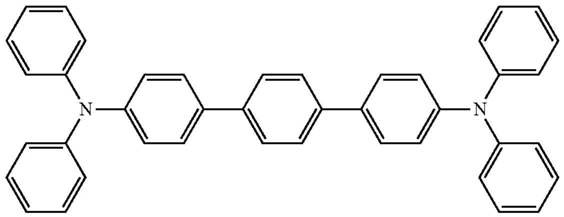

CP3

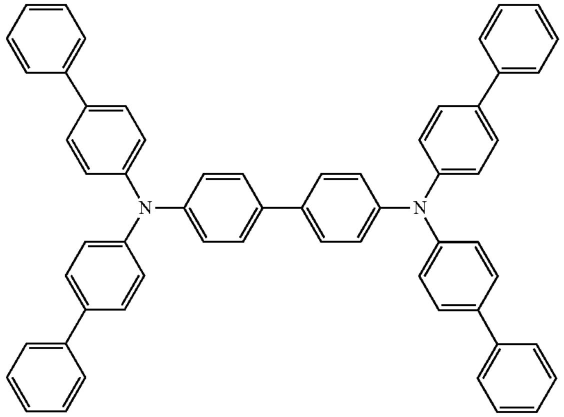

CP4

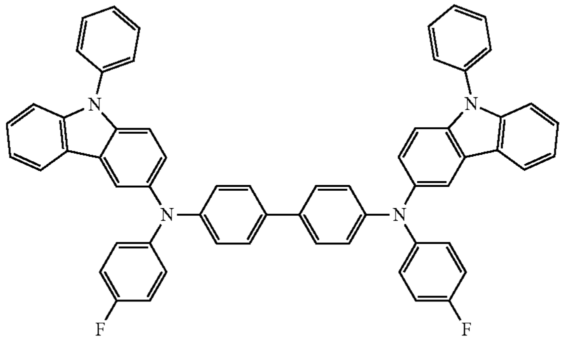

CP5

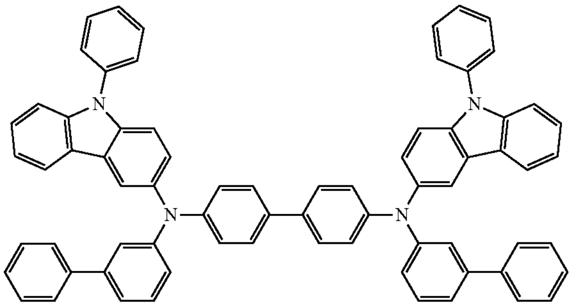

-continued

CP6

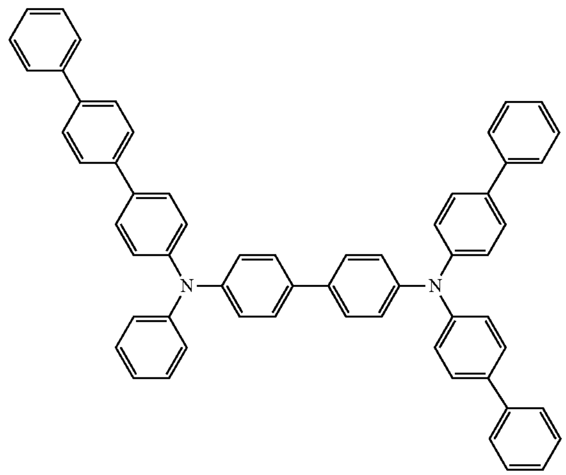

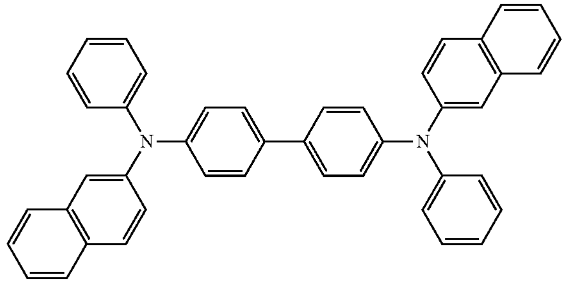

.

β-NPB

[Electronic Apparatus]

The light-emitting device may be included in various electronic apparatuses. For example, the electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be arranged in at least one traveling direction of light emitted from the light-emitting device. For example, the light emitted from the light-emitting device may be blue light. Details of the light-emitting device may be the same as described herein. In an embodiment, the color conversion layer may include a quantum dot.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be arranged between the subpixels to define each subpixel.

The color filter may further include color filter areas and light-shielding patterns arranged between the color filter areas, and the color conversion layer may further include color conversion areas and light-shielding patterns arranged between the color conversion areas.

The color filter areas (or the color conversion areas) may include a first area emitting first color light, a second area emitting second color light, and/or a third area emitting third color light, wherein the first color light, the second color light, and/or the third color light may each have different maximum emission wavelengths from one another. For example, the first color light may be red light, the second color light may be green light, and the third color light may be blue light. In an embodiment, the color filter areas (or the color conversion areas) may include quantum dots. In an embodiment, the first area may include a red quantum dot, the second area may include a green quantum dot, and the third area may not include a quantum dot. The first area, the second area, and/or the third area may each further include a scatterer.

In an embodiment, the light-emitting device may emit first light, the first area may absorb the first light to emit first-first color light, the second area may absorb the first light to emit second-first color light, and the third area may absorb the first light to emit third-first color light. In an embodiment, the first-first color light, the second-first color light, and the third-first color light may each have different maximum emission wavelengths. In an embodiment, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein any one of the source electrode and the drain electrode may be electrically connected to one of the first electrode and the second electrode of the light-emitting device.

The thin-film transistor may further include a gate electrode, a gate insulating film, and the like.

The active layer may include crystalline silicon, amorphous silicon, an organic semiconductor, an oxide semiconductor, and the like.

The electronic apparatus may further include a sealing portion for sealing the light-emitting device. The sealing portion may be arranged between the color filter and/or the color conversion layer and the light-emitting device. The sealing portion allows light from the light-emitting device to pass to the outside, and prevents ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin-film encapsulation layer, the electronic apparatus may be flexible.

Various functional layers may be further included on the sealing portion, in addition to the color filter and/or the color conversion layer, according to the use of the electronic apparatus. Examples of the functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments electronic thermometers, (for example, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 3:
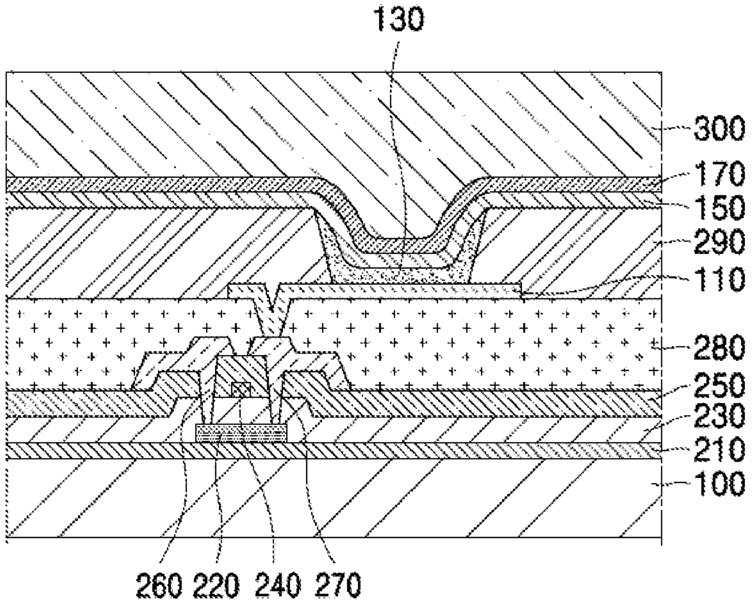
FIGS. 3 and 4 are each a schematic cross-sectional view of an electronic apparatus according to an embodiment.
Figure 4:
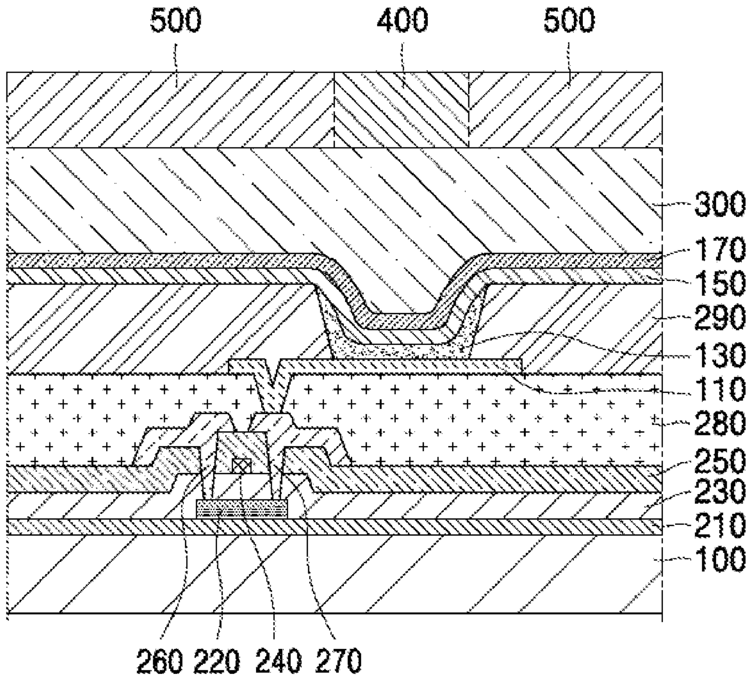

[Description of FIGS. 3 and 4]

FIG. 3 is a schematic cross-sectional view of an electronic apparatus according to an embodiment.

The electronic apparatus of FIG. 3 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be arranged on the substrate 100. The buffer layer 210 may prevent penetration of impurities through the substrate 100 and may provide a flat surface on the substrate 100.

A TFT may be arranged on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be arranged on the activation layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 and between the gate electrode 240 and the drain electrode 270, to insulate from one another.

The source electrode 260 and the drain electrode 270 may be arranged on the interlayer insulating film 250. The interlayer insulating film 250 and the gate insulating film 230 may be formed to expose a source region and a drain region of the active layer 220, and the source electrode 260 and the drain electrode 270 may respectively contact the exposed portions of the source region and the drain region of the active layer 220.

The TFT may be electrically connected to a light-emitting device to drive the light-emitting device, and may be covered and protected by a passivation layer 280. The passivation layer 280 may include an inorganic insulating film, an organic insulating film, or any combination thereof. A light-emitting device may be provided on the passivation layer 280. The light-emitting device may include the first electrode 110, the interlayer 130, and the second electrode 150.

The first electrode 110 may be arranged on the passivation layer 280. The passivation layer 280 may be arranged to expose a certain region of the drain electrode 270, not fully covering the drain electrode 270. The first electrode 110 may be electrically connected to the exposed region of the drain electrode 270.

A pixel-defining film 290 including an insulating material may be arranged on the first electrode 110. The pixel-defining film 290 may expose a region of the first electrode 110, and the interlayer 130 may be formed in the exposed region of the first electrode 110. The pixel-defining film 290 may be a polyimide-based organic film or a polyacrylic-based organic film. Although not shown in FIG. 3, at least some layers of the interlayer 130 may extend beyond the upper portion of the pixel-defining film 290 and may thus be provided in the form of a common layer.

The second electrode 150 may be arranged on the interlayer 130, and a capping layer 170 may be further included on the second electrode 150. The capping layer 170 may be formed to cover the second electrode 150.

The encapsulation portion 300 may be arranged on the capping layer 170. The encapsulation portion 300 may be arranged on a light-emitting device to protect the light-emitting device from moisture or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, etc.), an epoxy-based resin (for example, aliphatic glycidyl ether (AGE), etc.), or any combination thereof; or a combination of the inorganic film and the organic film.

FIG. 4 is a schematic cross-sectional view of an electronic apparatus according to another embodiment.

The electronic apparatus of FIG. 4 may differ from the electronic apparatus of FIG. 3, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 4 may be a tandem light-emitting device.

Figure 5:
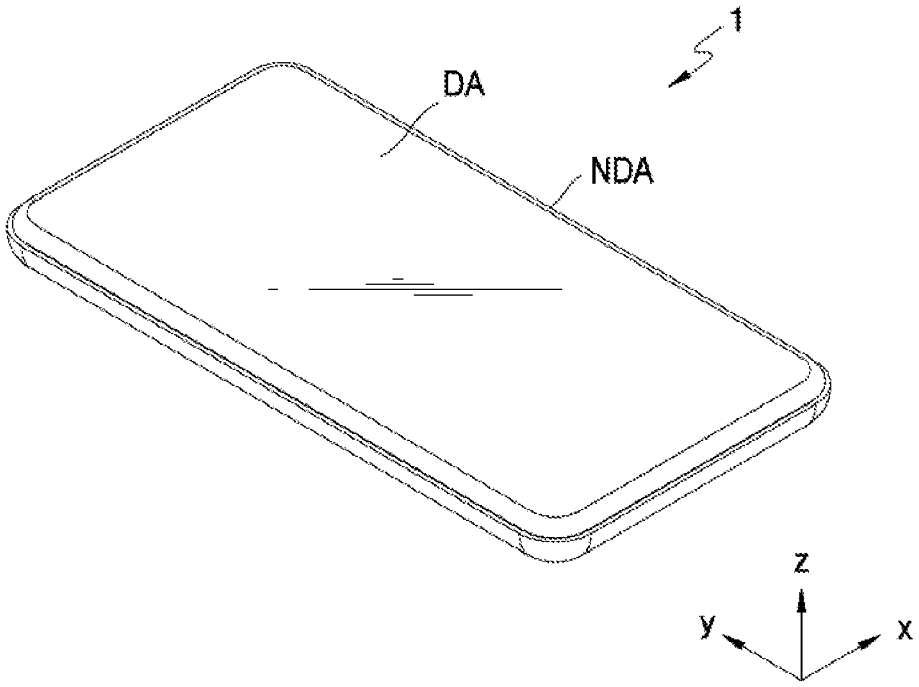
FIG. 5 is a schematic perspective view of electronic equipment including a light-emitting device according to an embodiment.

[Description of FIG. 5]

FIG. 5 is a schematic perspective view of electronic equipment 1 including a light-emitting device according to an embodiment.

The electronic equipment 1 may be an apparatus that displays a moving image or a still image, and may include a portable electronic equipment, such as a mobile phone, a smart phone, a tablet personal computer (PC), a mobile communication terminal, an electronic notebook, an electronic book, a portable multimedia player (PMP), a navigation device, or an ultra-mobile PC (UMPC), as well as various products, such as a television, a laptop, a monitor, a billboard, or an Internet of things (IOT). The electronic equipment 1 may be such a product above or may be a part thereof. The electronic equipment 1 may be a wearable device, such as a smart watch, a watch phone, a glasses-type display, or a head mounted display (HMD), or a part of the wearable device. However, embodiments are not limited thereto.

For example, the electronic equipment 1 may include an instrument panel of a vehicle, a center information display (CID) arranged on a center fascia or a dashboard of a vehicle, a room mirror display replacing a side mirror of a vehicle, an entertainment display for a rear seat of a vehicle, or a display arranged on the back of a front seat of a vehicle. FIG. 5 illustrates a case in which the electronic equipment 1 is a smart phone for convenience of explanation.

The electronic equipment 1 may include a display area DA and a non-display area NDA outside the display area DA. A display apparatus may implement an image through a two-dimensional array of pixels that are arranged in the display area DA.

The non-display area NDA is an area that does not display an image, and may surround the display area DA. A driver for providing electrical signals or power to display devices arranged in the display area DA may be arranged in the non-display area NDA. A pad, which is an area to which an electronic device or a printed circuit board may be electrically connected, may be arranged in the non-display area NDA.

In the electronic equipment 1, a length in an x-axis direction and a length in a y-axis direction may be different from each other. In an embodiment, as shown in FIG. 5, a length in the x-axis direction may be shorter than a length in the y-axis direction. In embodiments, a length in the x-axis direction may be the same as a length in the y-axis direction. In embodiments, a length in the x-axis direction may be longer than a length in the y-axis direction.

[Description of FIGS. 6 and 7A to 7C]

Figure 6:
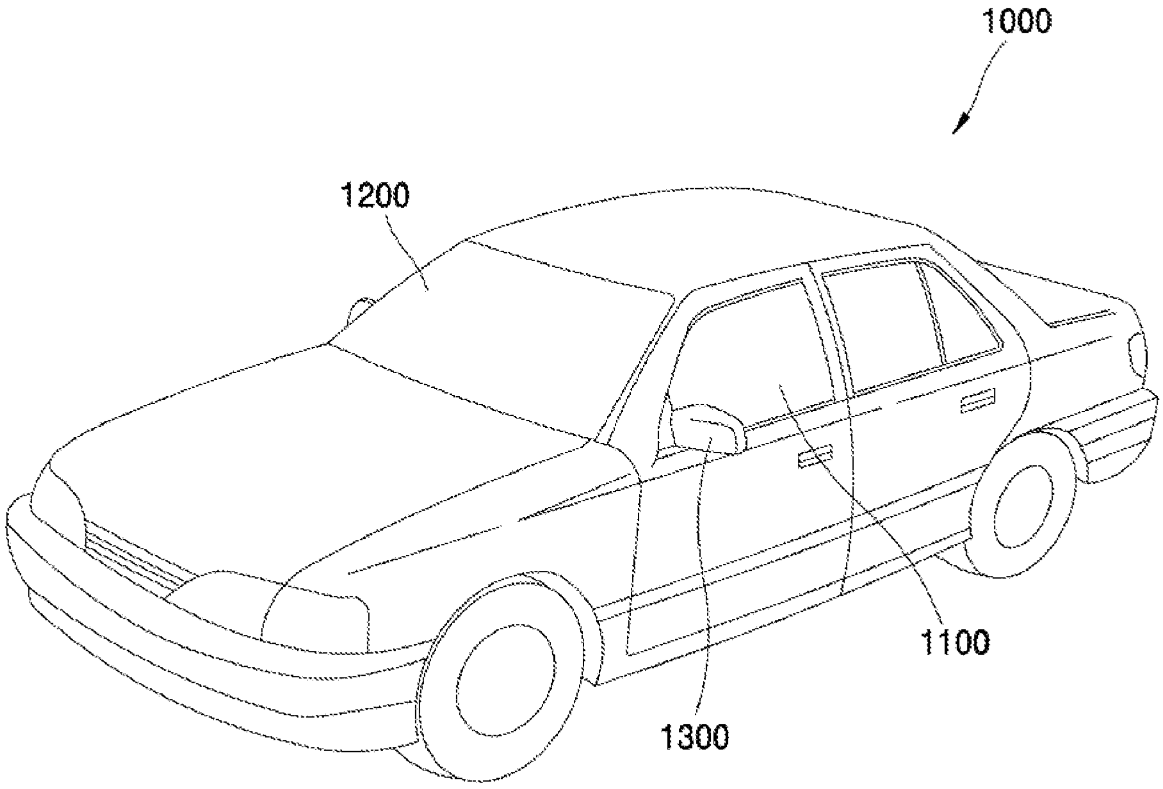
FIG. 6 is a schematic perspective view of an exterior of a vehicle as electronic equipment including a light-emitting device according to an embodiment.
Figure 7A:
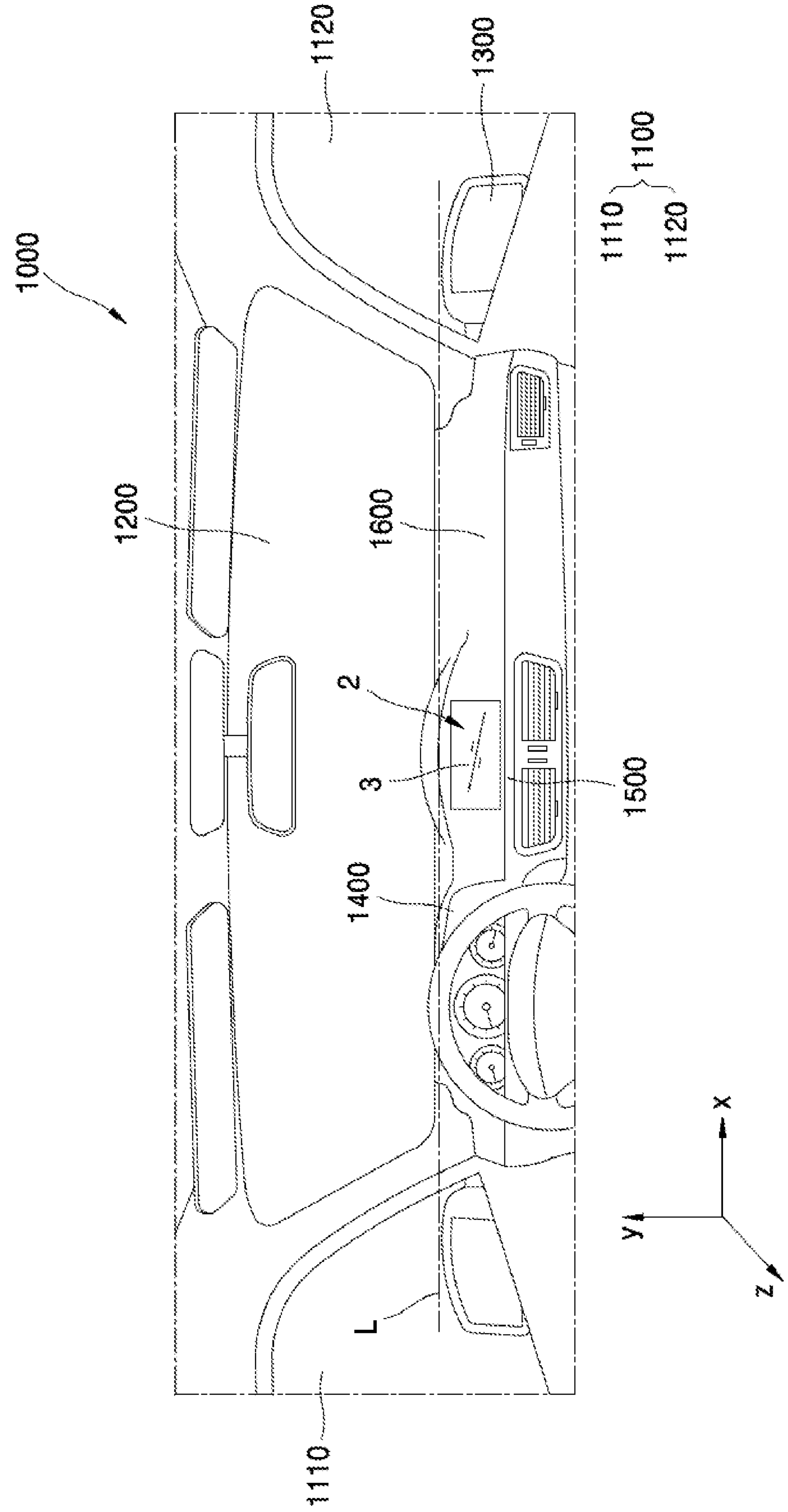
FIGS. 7A to 7C are each a schematic diagram of an interior of a vehicle according to one or more embodiments.
Figure 7B:
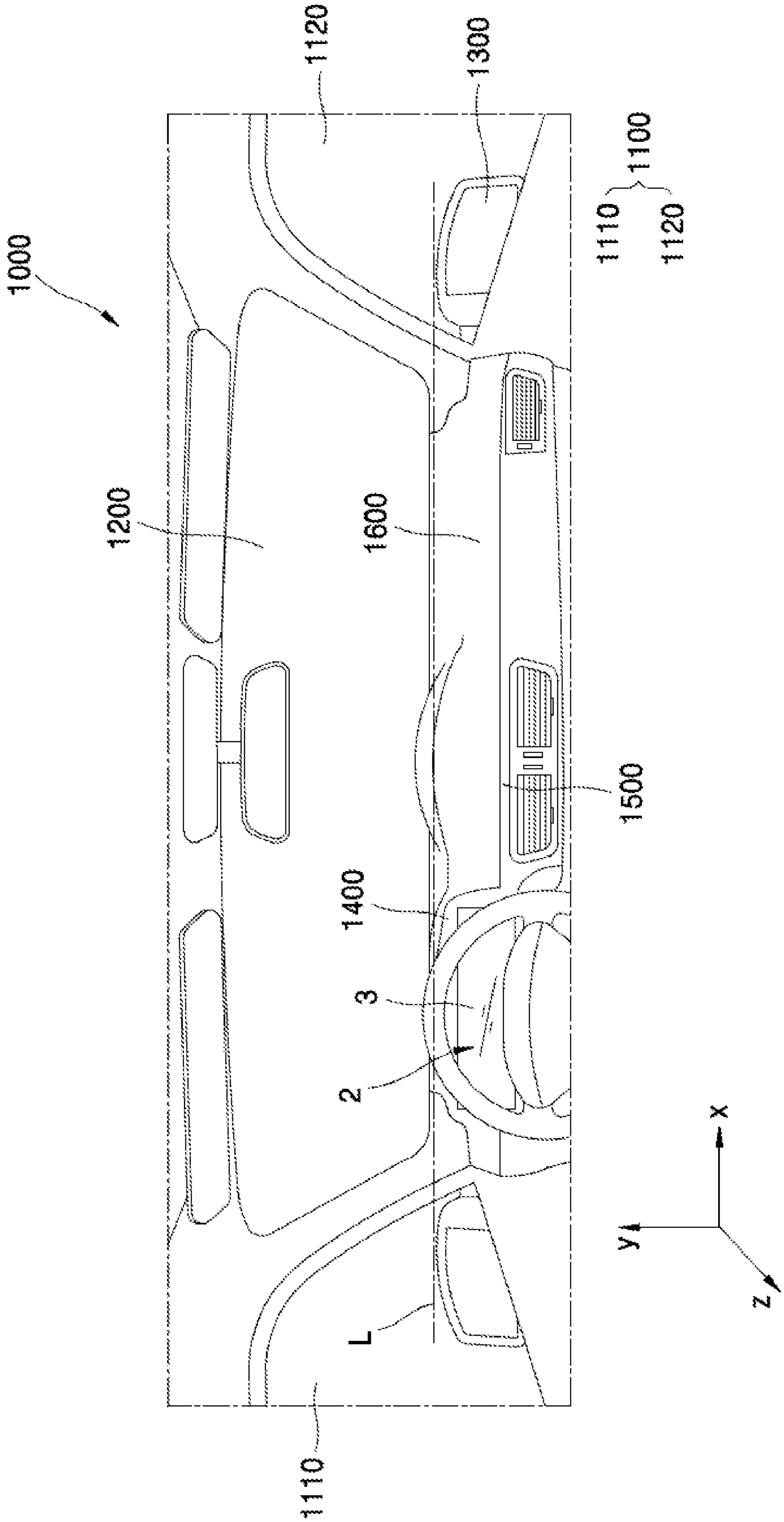
Figure 7C:
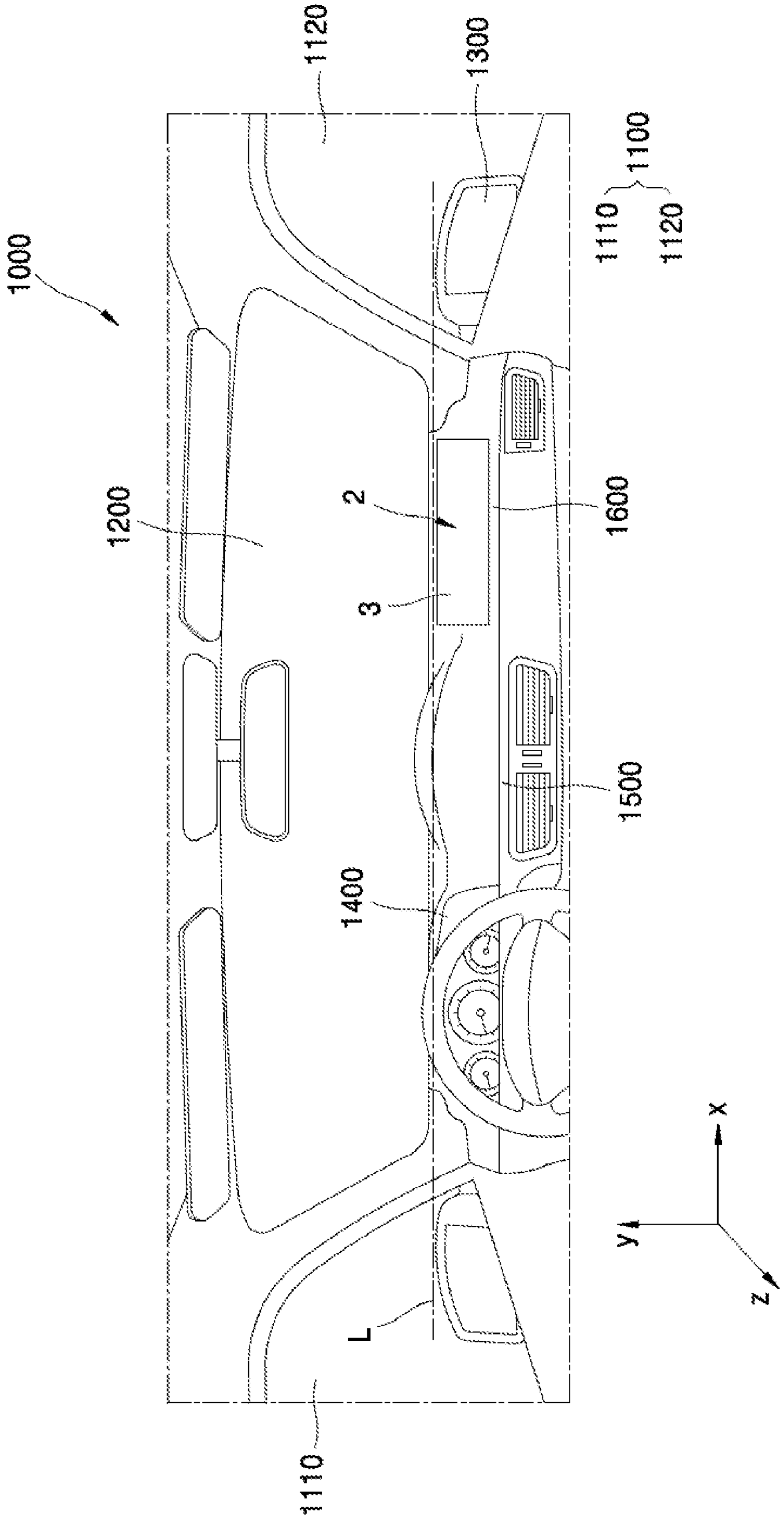

FIG. 6 is a schematic perspective view of an exterior of a vehicle 1000 as electronic equipment including a light-emitting device according to an embodiment. FIGS. 7A to 7C are each a schematic diagram of an interior of the vehicle 1000 according to embodiments.

Referring to FIGS. 6 and 7A to 7C, the vehicle 1000 may refer to various apparatuses for moving a subject to be transported, such as a human, an object, or an animal, from a departure point to a destination point. Examples of vehicle 1000 may include a vehicle traveling on a road or a track, a vessel moving over the sea or a river, an airplane flying in the sky using the action of air, and the like.

The vehicle 1000 may travel on a road or a track. The vehicle 1000 may move in a direction according to rotation of at least one wheel. For example, the vehicle 1000 may include a three-wheeled or four-wheeled vehicle, a construction machine, a two-wheeled vehicle, a prime mover apparatus, a bicycle, and a train running on a track.

The vehicle 1000 may include a body having an interior and an exterior, and a chassis that is a portion excluding the body in which mechanical apparatuses necessary for driving are installed. The exterior of the vehicle body may include a front panel, a bonnet, a roof panel, a rear panel, a trunk, a pillar provided at a boundary between doors, and the like. The chassis of the vehicle 1000 may include a power-generating apparatus, a power-transmitting apparatus, a driving apparatus, a steering apparatus, a braking apparatus, a suspension apparatus, a transmission apparatus, a fuel apparatus, front and rear wheels, left and right wheels, and the like.

The vehicle 1000 may include a side window glass 1100, a front window glass 1200, a side mirror 1300, a cluster 1400, a center fascia 1500, a passenger seat dashboard 1600, and a display apparatus 2.

The side window glass 1100 and the front window glass 1200 may be partitioned by a pillar arranged between the side window glass 1100 and the front window glass 1200.

The side window glass 1100 may be installed on the side of the vehicle 1000. In an embodiment, the side window glass 1100 may be installed on a door of the vehicle 1000. Multiple side window glasses 1100 may be provided and may face each other. In an embodiment, the side window glass 1100 may include a first side window glass 1110 and a second side window glass 1120. In an embodiment, the first side window glass 1110 may be arranged adjacent to the cluster 1400 and the second side window glass 1120 may be arranged adjacent to the passenger seat dashboard 1600.

In an embodiment, the side window glasses 1100 may be spaced apart from each other in an x-direction or a −x-direction. For example, the first side window glass 1110 and the second side window glass 1120 may be spaced apart from each other in the x-direction or the −x-direction. For example, an imaginary straight line L connecting the side window glasses 1100 to each other may extend in the x-direction or the −x-direction. For example, the imaginary straight line L connecting the first side window glass 1110 and the second side window glass 1120 to each other may extend in the x-direction or the −x-direction.

The front window glass 1200 may be installed in the front of the vehicle 1000. The front window glass 1200 may be arranged between the side window glasses 1100 facing each other.

The side mirror 1300 may provide a view of the rear of the vehicle 1000. The side mirror 1300 may be installed on the exterior of the body. In an embodiment, multiple side mirrors 1300 may be provided. Any one of the side mirrors 1300 may be arranged outside the first side window glass 1110. Another one of the plurality of side mirrors 1300 may be arranged outside the second side window glass 1120.

The cluster 1400 may be arranged in front of the steering wheel. The cluster 1400 may include a tachometer, a speedometer, a coolant thermometer, a fuel gauge, a turn signal indicator, a high beam indicator, a warning light, a seat belt warning light, an odometer, a hodometer, an automatic shift selector indicator, a door open warning light, an engine oil warning light, and/or a low fuel warning light.

The center fascia 1500 may include a control panel on which buttons for adjusting an audio apparatus, an air conditioning apparatus, and a seat heater may be arranged. The center fascia 1500 may be arranged on one side of the cluster 1400.

The passenger seat dashboard 1600 may be spaced apart from the cluster 1400 with the center fascia 1500 arranged therebetween. In an embodiment, the cluster 1400 may be arranged to correspond to a driver seat (not shown), and the passenger seat dashboard 1600 may be arranged to correspond to a passenger seat (not shown). In an embodiment, the cluster 1400 may be adjacent to the first side window glass 1110, and the passenger seat dashboard 1600 may be adjacent to the second side window glass 1120.

In an embodiment, the display apparatus 2 may include a display panel 3, and the display panel 3 may display an image. The display apparatus 2 may be arranged inside the vehicle 1000. In an embodiment, the display apparatus 2 may be arranged between the side window glasses 1100 facing each other. The display apparatus 2 may be arranged on at least one of the cluster 1400, the center fascia 1500, and the passenger seat dashboard 1600.

The display apparatus 2 may include an organic light-emitting display apparatus, an inorganic light-emitting display apparatus, a quantum dot display apparatus, and the like. Hereinafter, an organic light-emitting display apparatus including the organic light-emitting device according to an embodiment will be described as an example of the display apparatus 2. However, various types of display apparatuses as described above may be used in embodiments.

Referring to FIG. 7A, the display apparatus 2 may be arranged on the center fascia 1500. In an embodiment, the display apparatus 2 may display navigation information. In an embodiment, the display apparatus 2 may display audio, video, or information regarding vehicle settings.

Referring to FIG. 7B, the display apparatus 2 may be arranged on the cluster 1400. When the display apparatus 2 is arranged on the cluster 1400, the cluster 1400 may display driving information and the like through the display apparatus 2. For example, the cluster 1400 may digitally implement driving information. The digital cluster 1400 may display vehicle information and driving information as images. For example, a needle and a gauge of a tachometer and various warning light icons may be displayed by a digital signal.

Referring to FIG. 7C, the display apparatus 2 may be arranged on the passenger seat dashboard 1600. The display apparatus 2 may be embedded in the passenger seat dashboard 1600 or arranged on the passenger seat dashboard 1600. In an embodiment, the display apparatus 2 arranged on the passenger seat dashboard 1600 may display an image related to information displayed on the cluster 1400 and/or information displayed on the center fascia 1500. In embodiments, the display apparatus 2 arranged on the passenger seat dashboard 1600 may display information that is different from the information displayed on the cluster 1400 and/or the information displayed on the center fascia 1500.

[Manufacturing Method]

Respective layers included in the hole transport region, the emission layer, and respective layers included in the electron transport region may be formed in a certain region by using suitable methods selected from vacuum deposition, spin coating, casting, Langmuir-Blodgett (LB) deposition, ink-jet printing, laser-printing, laser-induced thermal imaging, and the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

When respective layers included in the hole transport region, the emission layer, and respective layers included in the electron transport region are formed by spin coating, the spin coating may be performed at a coating speed of about 2,000 rpm to about 5,000 rpm and at a heat treatment temperature of about 80° C. to about 200° C., depending on a material to be included in a layer to be formed and the structure of a layer to be formed.

Definitions of Substituents

The term "$C_3$-$C_{60}$ carbocyclic group" as used herein may be a cyclic group consisting of carbon atoms as the only ring-forming atom and having 3 to 60 carbon atoms, and the term "$C_1$-$C_{60}$ heterocyclic group" as used herein may be a cyclic group that has 1 to 60 carbon atoms and further has, in addition to a carbon atom, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, a $C_1$-$C_{60}$ heterocyclic group may have 3 to 61 ring-forming atoms.

The term "cyclic group" as used herein may be a $C_3$-$C_{60}$ carbocyclic group or a $C_1$-$C_{60}$ heterocyclic group.

The term "π electron-rich $C_3$-$C_{60}$ cyclic group" as used herein may be a cyclic group that has 3 to 60 carbon atoms and may not include *—N═*' as a ring-forming moiety, and the term "π electron-deficient nitrogen-containing $C_1$-$C_{60}$ cyclic group" as used herein may be a heterocyclic group that has 1 to 60 carbon atoms and may include *—N═*' as a ring-forming moiety.

In embodiments, a $C_3$-$C_{60}$ carbocyclic group may be a T1 group or a group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), a $C_1$-$C_{60}$ heterocyclic group may be a T2 group, a group in which two or more T2 groups are condensed with each other, or a group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), a π electron-rich $C_3$-$C_{60}$ cyclic group may be a T1 group, a group in which two or more T1 groups are condensed with each other, a T3 group, a group in which two or more T3 groups are condensed with each other, or a group in which at least one T3 group and at least one T1 group are condensed with each other (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), a π electron-deficient nitrogen-containing $C_1$-$C_{60}$ cyclic group may be a T4 Group, a group in which two or more T4 groups are condensed with each other, a group in which at least one T4 group and at least one T1 group are condensed with each other, a group in which at least one T4 group and at least one T3 group are condensed with each other, or a group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.).

The T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group.

The T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group.

The T3 group may be a furan group, a thiophene group, a 1H-pyrrole group, a silole group, or a borole group.

The T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group," "$C_3$-$C_{60}$ carbocyclic group," "$C_1$-$C_{60}$ heterocyclic group," "π electron-rich $C_3$-$C_{60}$ cyclic group," or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of a monovalent $C_3$-$C_{60}$ carbocyclic group or a monovalent $C_1$-$C_{60}$ heterocyclic group may include a $C_5$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of a divalent $C_3$-$C_{60}$ carbocyclic group or a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein may be a linear or branched aliphatic hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, and the like. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of the $C_2$-$C_{60}$ alkyl group, and examples thereof may include an ethenyl group, a propenyl group, a butenyl group, and the like. The term "$C_2$-$C_{60}$ alkenylene group" as used herein refers to a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of the $C_2$-$C_{60}$ alkyl group, and examples thereof may include an ethynyl group, a propynyl group, and the like. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —$O(A_{101})$ (wherein $A_{101}$ may be a $C_1$-$C_{60}$ alkyl group), and examples thereof may include a methoxy group, an ethoxy group, an isopropyloxy group, and the like.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantyl group, a norbornyl group (or a bicyclo[2.2.1] heptyl group), a bicyclo[1.1.1]pentyl group, a bicyclo[2.1.1] hexyl group, a bicyclo[2.2.2]octyl group, and the like. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has 3 to 10 carbon atoms and at least one carbon-carbon double bond in the ring thereof and no aromaticity, and examples thereof may include a cyclopentenyl group, a cyclohexenyl group, a cycloheptenyl group, and the like. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group that has 1 to 10 carbon atoms, at least one heteroatom as a ring-forming atom, in addition to carbon atoms, and at least one double bond in the ring thereof. Examples of a $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of a $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of a $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, and the like. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of a monovalent non-aromatic condensed polycyclic group may include an indenyl group, a fluorenyl group, a spiro-bifluorenyl group, a benzofluorenyl group, an indenophenanthrenyl group, an indeno anthracenyl group, and the like. The term "divalent non-aromatic condensed polycyclic group" as used herein may be a divalent group having a same structure as the monovalent non-aromatic condensed polycyclic group.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of a monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl a group, a benzofurodibenzofuranyl group, benzofurodibenzothiophenyl group, a benzothienodibenzothiophenyl group, and the like. The term "divalent non-aromatic condensed heteropolycyclic group" as used herein may be a divalent group having a same structure as the monovalent non-aromatic condensed heteropolycyclic group.

The term "$C_6$-$C_{60}$ aryloxy group" as used herein may be a group represented by —O($A_{102}$) (wherein $A_{102}$ may be a $C_6$-$C_{60}$ aryl group), and the term "$C_6$-$C_{60}$ arylthio group" as used herein may be a group represented by —S($A_{103}$) (wherein $A_{103}$ may be a $C_6$-$C_{60}$ aryl group).

The term "$C_7$-$C_{60}$ arylalkyl group" as used herein may be a group represented by -($A_{104}$)($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

In the specification, the group "$R_{10a}$" may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$) ($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$).

In the specification, $Q_1$ to $Q_3$, $Q_{11}$ to $Q_{13}$, $Q_{21}$ to $Q_{23}$, and $Q_{31}$ to $Q_{33}$ may each independently be:

hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein may be any atom other than a carbon atom or a hydrogen atom. Examples of a heteroatom may include O, S, N, P, Si, B, Ge, Se, and any combination thereof.

In the specification, examples of a "third-row transition metal" as used herein may include hafnium (Hf), tantalum (Ta), tungsten (W), rhenium (Re), osmium (Os), iridium (Ir), platinum (Pt), gold (Au), and the like.

In the specification, the term "Ph" refers to a phenyl group, the term "Me" refers to a methyl group, the term "Et" refers to an ethyl group, the terms "ter-Bu" or "But" each refer to a tert-butyl group, and the term "OMe" refers to a methoxy group.

The term "biphenyl group" as used herein may be a "phenyl group substituted with a phenyl group." For example, the "biphenyl group" may be a substituted phenyl group having a $C_6$-$C_{60}$ aryl group as a substituent.

The term "terphenyl group" as used herein may be a "phenyl group substituted with a biphenyl group." For example, the "terphenyl group" may be a substituted phenyl group having, as a substituent, a $C_6$-$C_{60}$ aryl group substituted with a $C_6$-$C_{60}$ aryl group.

The maximum number of carbon atoms as described within the definition of substituents is only an example. For example, the maximum number of 60 carbon atoms in the $C_1$-$C_{60}$ alkyl group is only an example, and the definition of an alkyl group may equally apply to a $C_1$-$C_{20}$ alkyl group. The same may apply to other cases.

The symbols * and *' as used herein, unless defined otherwise, each refer to a binding site to a neighboring atom in a corresponding formula.

Hereinafter, a compound and light-emitting device according to embodiments will be described in detail with reference to Examples and Comparative Examples.

EXAMPLES

Manufacture of Light-Emitting Devices

Example 1

A glass substrate (anode, ITO 300 Å/Ag 50 Å/ITO 300 Å) was cut to a size of 50 mm×50 mm×0.7 mm, cleaned by sonication with isopropyl alcohol and pure water each for 5 minutes, cleaned by irradiation of ultraviolet rays and exposure of ozone thereto for 30 minutes, and loaded onto a vacuum deposition apparatus.

HT3 was vacuum-deposited on the substrate to form a first hole transport layer having a thickness of 120 nm. HT47 was vacuum-deposited thereon to form a second hole transport layer having a thickness of 30 nm.

H_26 as a first host, D1 as a first-first dopant, and MR1 as a first-second dopant were co-deposited thereon to form a first emission layer having a thickness of 5 nm (wherein the respective amounts of D1 and MR1 were 10 wt % and 1 wt %, each based on 100 wt % of the host).

H_30 as a second host, D18 as a second-first dopant, and MR1 as a second-second dopant were co-deposited on the first emission layer to form a second emission layer having a thickness of 30 nm (wherein the respective amounts of D18 and MR1 were 10 wt % and 1 wt %, each based on 100 wt % of the host).

ET46 was deposited on the second emission layer to form a first electron transport layer having a thickness of 5 nm.

ET47 and LiQ (at a weight ratio of 5:5) were deposited on the first electron transport layer to form a second electron transport layer having a thickness of 20 nm. LiQ was deposited thereon to form an electron injection layer having a thickness of 1 nm.

MgAg was vacuum-deposited thereon to form a cathode having a thickness of 10 nm (wherein the doping ratio of Mg was 5 wt %), and CP1 was deposited thereon to form a capping layer having a thickness of 700 Å, thereby completing the manufacture of a light-emitting device.

Examples 2 to 8

Light-emitting devices were manufactured in the same manner as in Example 1, except that the first emission layer and the second emission layer were formed to have corresponding thicknesses shown in Table 1 by using corresponding compounds shown in Table 1.

Comparative Examples 1 to 4

Light-emitting devices were manufactured in the same manner as in Example 1, except that the first emission layer was formed to have a corresponding thickness shown in Table 1 by using a corresponding compound shown in Table 1 (the second emission layer was not formed).

Comparative Examples 5 and 6

Light-emitting devices were manufactured in the same manner as in Example 1, except that the first emission layer and the second emission layer were formed to have corresponding thicknesses shown in Table 1 by using corresponding compounds shown in Table 1.

HT3

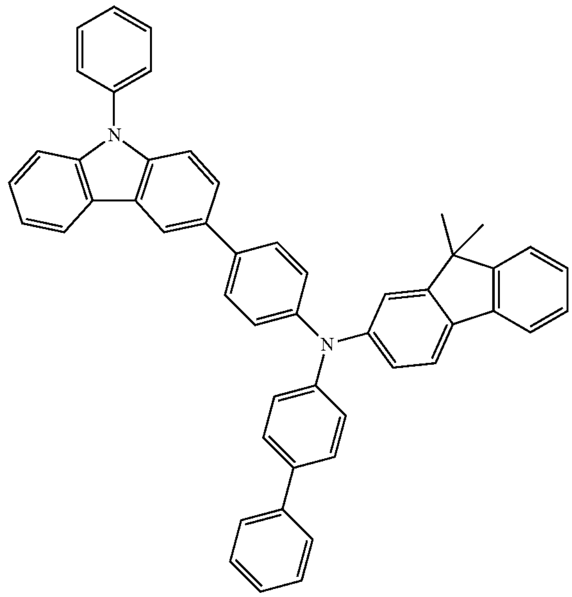

HT47

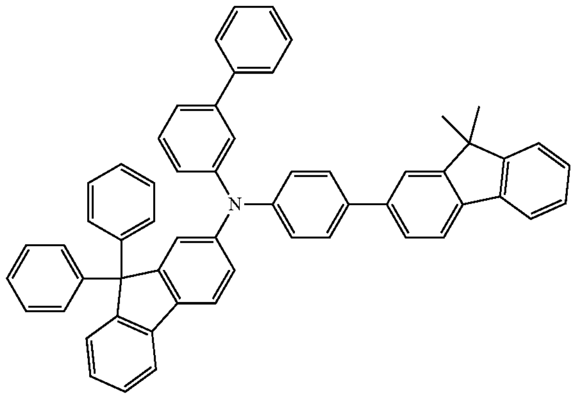

-continued

H_26

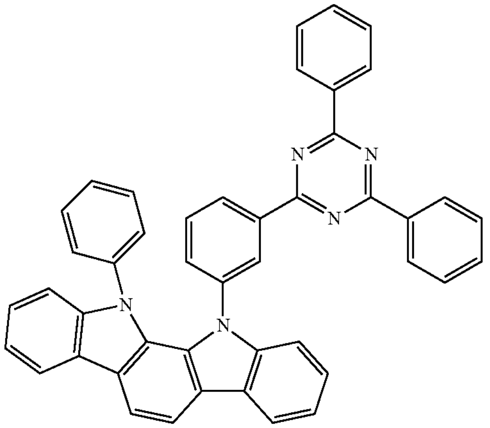

H_30

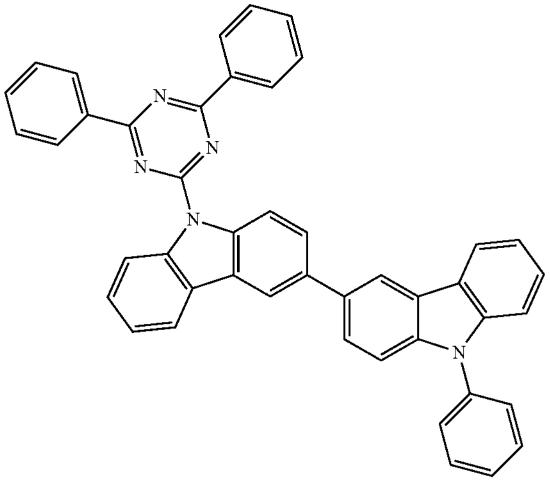

H_34

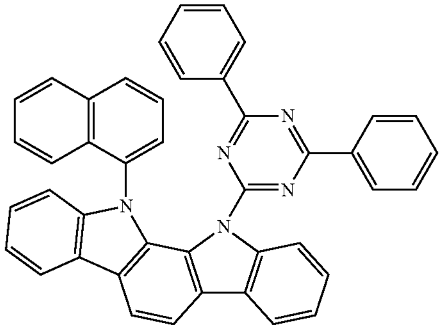

H_35

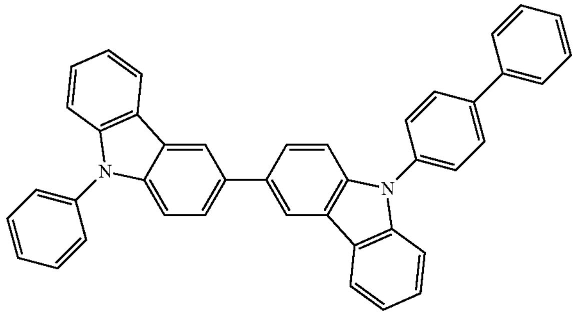

-continued

D1

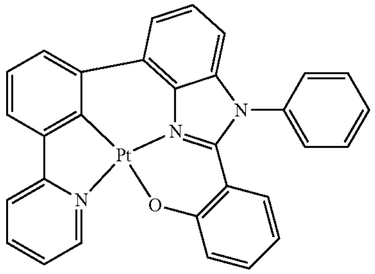

D18

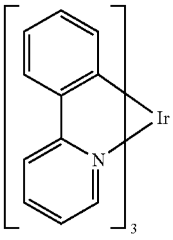

ET46

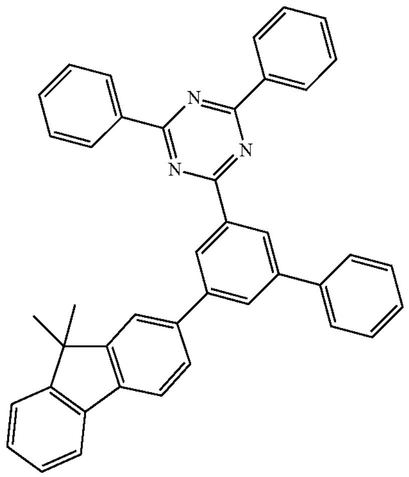

ET47

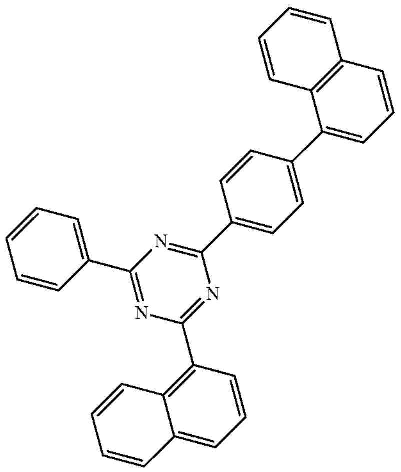

-continued

MR1

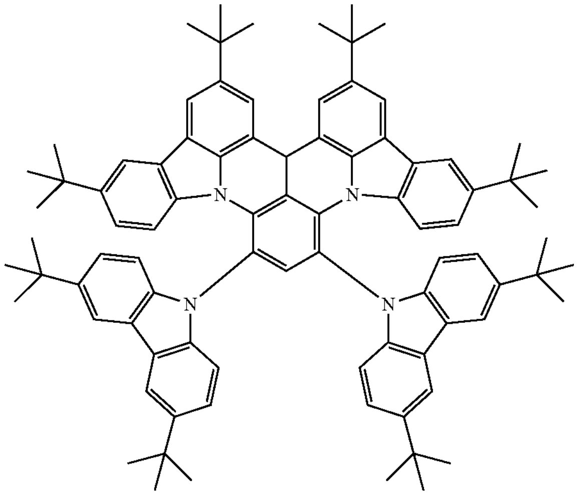

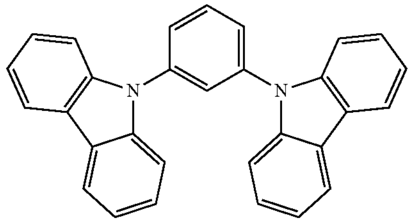

mCP

TABLE 1

| | First emission layer (first host:first-first dopant:first-second dopant) | Second emission layer (second host:second-first dopant:second-second dopant) |
|---|---|---|
| Example 1 | H_26:D1:MR1 (5 nm) | H_30:D18:MR1 (30 nm) |
| Example 2 | H_26:D1:MR1 (10 nm) | H_30:D18:MR1 (25 nm) |
| Example 3 | H_26:D1:MR1 (5 nm) | H_26:D18:MR1 (30 nm) |
| Example 4 | H_26:D1:MR1 (10 nm) | H_26:D18:MR1 (25 nm) |
| Example 5 | H_30:D1:MR1 (5 nm) | H_30:D18:MR1 (30 nm) |
| Example 6 | H_30:D1:MR1 (10 nm) | H_30:D18:MR1 (25 nm) |
| Example 7 | Host3:D1:MR1 (5 nm) | Host3:D18:MR1 (30 nm) |
| Example 8 | Host3:D1:MR1 (10 nm) | Host3:D18:MR1 (25 nm) |
| Comparative Example 1 | Host3:D1(35 nm) | X |
| Comparative Example 2 | H_26:D1:MR1 (35 nm) | X |
| Comparative Example 3 | H_30:D18:MR1 (35 nm) | X |
| Comparative Example 4 | Host3:D1:MR1 (35 nm) | X |
| Comparative Example 5 | H_26:D1:MR1 (25 nm) | H_30:D18:MR1 (10 nm) |
| Comparative Example 6 | mCP:D1:MR1 (15 nm) | mCP:D18:MR1 (15 nm) |

Host3: pre-mixed host of H_34 and H_35 (weight ratio of 5:5)

To evaluate the characteristics of the light-emitting devices manufactured according to Examples 1 to 8 and Comparative Examples 1 to 6, the driving voltage, efficiency, and lifespan thereof at a current density of 20 $mA/cm^2$ were measured, and the results are shown in Table 2.

The efficiency of the light-emitting devices was measured by using a measurement device C9920-2-12 manufactured by Hamamatsu Photonics Inc.

TABLE 2

| | Driving voltage | Efficiency | Lifespan |
|---|---|---|---|
| Example 1 | 105% | 120% | 170% |
| Example 2 | 105% | 119% | 195% |
| Example 3 | 100% | 125% | 185% |
| Example 4 | 93% | 120% | 205% |
| Example 5 | 98% | 120% | 175% |
| Example 6 | 96% | 120% | 180% |
| Example 7 | 98% | 120% | 210% |
| Example 8 | 92% | 130% | 235% |
| Comparative Example 1 | 100% | 100% | 100% |
| Comparative Example 2 | 115% | 105% | 85% |
| Comparative Example 3 | 105% | 100% | 75% |
| Comparative Example 4 | 100% | 115% | 140% |
| Comparative Example 5 | 107% | 120% | 125% |
| Comparative Example 6 | 115% | 95% | 75% |

Referring to Table 2, it was confirmed that the light-emitting devices of Examples 1 to 8 had superior efficiency and lifespan to those of the light-emitting devices of Comparative Examples 1 to 6.

To maximize the luminescence efficiency of a device, it may be important to configure a device which has excellent charge balance and in which excitons are well preserved in an emission layer. In the light-emitting device according to an embodiment, holes and electrons may effectively meet in two emission layers to form excitons, and the occurrence of leakage current due to the flow of holes or electrons to adjacent layers may be prevented, and thus, a decrease in luminescence efficiency and luminescence lifespan may be prevented.

Manufacture of HODs

The relative hole-trapping ability of the emission layers of the light-emitting devices of Table 1 may be evaluated by manufacturing HODs and measuring the current-voltage thereof (an HOD is a device that does not emit light).

HOD1 was manufactured to have the following structure.

ITO (0.5 mm)/HT3 (120 nm)/HT47 (30 nm)/H_26:D1:MR1 (35 nm)/HAT-CN (10 nm)/Mg:Ag (80 nm)

Respective amounts of D1 and MR1:10 wt % and 1 wt %, based on 100 wt % of H_26

Doping ratio of Mg:5 wt %

HOD2 was manufactured to have the following structure.

ITO (0.5 mm)/HT3 (120 nm)/HT47 (30 nm)/H_26:D18:MR1 (35 nm)/HAT-CN (10 nm)/Mg:Ag (80 nm)

Respective amounts of D18 and MR1:10 wt % and 1 wt %, based on 100 wt % of H_26

Doping ratio of Mg:5 wt %

Voltage changes according to current changes for HOD1 and HOD2 were measured, and the results are shown in FIG. 1.

Referring to FIG. 1, it was confirmed that HOD2 including an emission layer using an Ir-based dopant had a higher voltage than HOD1 including an emission layer using a Pt-based dopant (at 10 $mA/cm^2$).

From these results, it was confirmed that, in the light-emitting device according to an embodiment, the hole-trapping ability of the second emission layer [including an Ir-based dopant] is greater than the hole-trapping ability of the first emission layer [including a Pt-based dopant].

According to embodiments, a light-emitting device may exhibit improved results in terms of efficiency and lifespan, as compared with devices of the related art.

Embodiments have been disclosed herein, and although terms are employed, they are used and are to be interpreted in a generic and descriptive sense only and not for the purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A light-emitting device comprising:
- a first electrode;
- a second electrode facing the first electrode; and
- an interlayer between the first electrode and the second electrode, wherein
- the interlayer comprises an emission layer,
- the emission layer comprises a first emission layer and a second emission layer,
- the first emission layer comprises:
  - a first host and a first-first dopant; or
  - a first host, a first-first dopant, and a first-second dopant,
- the second emission layer comprises:
  - a second host and a second-first dopant; or
  - a second host, a second-first dopant, and a second-second dopant,
- the emission layer comprises the first-second dopant and/or the second-second dopant,
- the first emission layer and the second emission layer directly contact each other,
- the first-first dopant and the second-first dopant each independently comprise an organometallic compound,
- the first-second dopant and the second-second dopant each independently comprise a delayed fluorescence dopant comprising boron and nitrogen, and
- a thickness of the second emission layer is greater than a thickness of the first emission layer.

2. The light-emitting device of claim 1, wherein a hole-trapping ability of the second emission layer is greater than a hole-trapping ability of the first emission layer.

3. The light-emitting device of claim 1, wherein a metal of the organometallic compound is Pt or Ir.

4. The light-emitting device of claim 1, wherein
- the first electrode is an anode,
- the second electrode is a cathode,
- the interlayer further comprises a hole transport region between the first electrode and the emission layer, and
- the hole transport region comprises a hole injection layer, a hole transport layer, an electron-blocking layer, or a combination thereof.

5. The light-emitting device of claim 1, wherein
- the first electrode is an anode,
- the second electrode is a cathode,
- the interlayer further comprises an electron transport region between the second electrode and the emission layer, and
- the electron transport region comprises a hole-blocking layer, an electron transport layer, an electron injection layer, or a combination thereof.

6. The light-emitting device of claim 1, wherein the emission layer emits green light.

7. The light-emitting device of claim 1, wherein the first host and the second host are each independently a single host or a mixed host.

8. The light-emitting device of claim 1, wherein the first host and the second host are each independently a hole-transporting host, an electron-transporting host, or a bipolar host.

9. The light-emitting device of claim 1, wherein a thickness of the first emission layer is in a range of about 1 nm to about 20 nm, and a thickness of the second emission layer is in a range of about 20 nm to about 35 nm.

10. The light-emitting device of claim 1, wherein a weight ratio of the first host to the second host is in a range of about 1:9 to about 9:1.

11. The light-emitting device of claim 1, wherein an amount of the first-second dopant and an amount of the second-second dopant are each independently in a range of about 0.1 wt % to about 2.5 wt %.

12. The light-emitting device of claim 1, wherein the first host and the second host each independently comprise a compound represented by Formula 301, Formula 301-1, or Formula 301-2:

$$[Ar_{301}]_{xb11}\text{-}[(L_{301})_{xb1}\text{-}R_{301}]_{xb21} \quad \text{[Formula 301]}$$

wherein in Formula 301, $Ar_{301}$ and $L_{301}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 is 1, 2, or 3, xb1 is an integer from 0 to 5, $R_{301}$ is hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 is an integer from 1 to 5, and $Q_{301}$ to $Q_{303}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof,

[Formula 301-1]

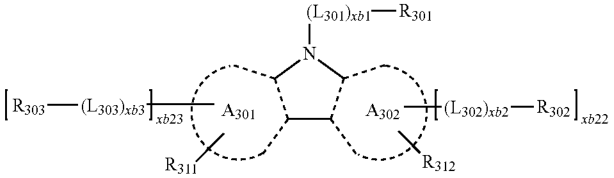

[Formula 301-2]

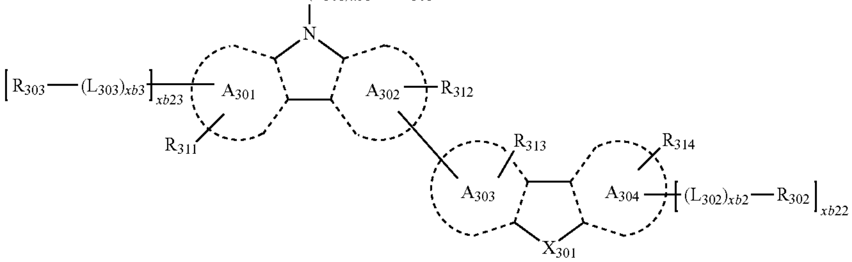

wherein in Formulae 301-1 and 301-2, ring $A_{301}$ to ring $A_{304}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ is O, S, N-[$(L_{304})_{xb4}$-$R_{304}$], $C(R_{304})(R_{305})$, or $Si(R_{304})(R_{305})$, xb22 and xb23 are each independently 0, 1, or 2, $L_{301}$ to $L_{304}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb1 to xb4 are each independently an integer from 0 to 5, $R_{301}$ to $R_{305}$ and $R_{311}$ to $R_{314}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, $Q_{301}$ to $Q_{303}$ are each the same as described in Formula 301, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or $Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_{11}$ to $Q_{13}$, $Q_{21}$ to $Q_{23}$, and $Q_{31}$ to $Q_{33}$ are each independently:

hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

13. The light-emitting device of claim 1, wherein an amount of the first-first dopant and an amount of the second-first dopant are each independently in a range of about 5.0 wt % to about 15.0 wt %.

14. The light-emitting device of claim 1, wherein the first-first dopant and the second-first dopant each independently comprise an organometallic compound represented by Formula 401:

[Formula 401]

$$M(L_{401})_{xc1}(L_{402})_{xc2}$$

[Formula 402]

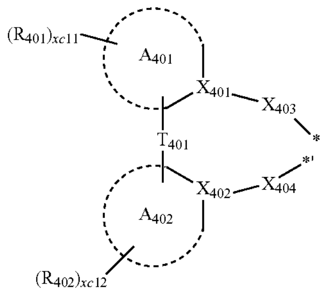

wherein in Formulae 401 and 402,

M is Ir or Pt, $L_{401}$ is a ligand represented by Formula 402, xc1 is 1, 2, or 3, when xc1 is 2 or more, two or more of $L_{401}$ are identical to or different from each other, $L_{402}$ is an organic ligand, xc2 is 0, 1, 2, 3, or 4, when xc2 is 2 or more, two or more of $L_{402}$ are identical to or different from each other, $X_{401}$ and $X_{402}$ are each independently nitrogen or carbon, ring $A_{401}$ and ring $A_{402}$ are each independently a $C_3$-$C_{60}$ carbocyclic group or a $C_1$-$C_{60}$ heterocyclic group, T401 is a single bond, —O—, —S—, —C(=O)—, —$N(Q_{411})$—, —$C(Q_{411})(Q_{412})$-, —$C(Q_{411})$=$C(Q_{412})$-, —$C(Q_{411})$=, or =C=, $X_{403}$ and $X_{404}$ are each independently a chemical bond, O, S, $N(Q_{413})$, $B(Q_{413})$, $P(Q_{413})$, $C(Q_{413})(Q_{414})$, or $Si(Q_{413})(Q_{414})$, $R_{401}$ and $R_{402}$ are each independently hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, or —$P(=O)(Q_{401})(Q_{402})$, $Q_{411}$ to $Q_{414}$ and $Q_{401}$ to $Q_{403}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, xc11 and xc12 are each independently an integer from 0 to 10,

* and *' in Formula 402 each indicate a binding site to M in Formula 401, when M is Pt, a ligand of Formula 401 comprises a pyridine moiety, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or a combination thereof; or $Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_{11}$ to $Q_{13}$, $Q_{21}$ to $Q_{23}$, and $Q_{31}$ to $Q_{33}$ are each independently:

hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

15. The light-emitting device of claim 1, wherein the first-second dopant and the second-second dopant each independently comprise the following moiety:

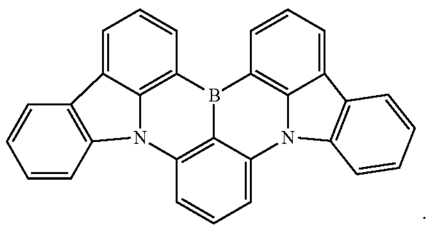 [SMILES: c1cc2c3c(c1)-n1c4ccccc4c4cccc(c41)B3c1cccc3c4ccccc4n-2c13]

16. The light-emitting device of claim 1, wherein the first-second dopant and the second-second dopant each independently comprise a t-butyl group.

17. An electronic apparatus comprising the light-emitting device of claim 1.

18. The electronic apparatus of claim 17, further comprising:

a thin-film transistor, wherein the thin-film transistor comprises a source electrode and a drain electrode, and the first electrode of the light-emitting device is electrically connected to the source electrode or the drain electrode.

19. The electronic apparatus of claim 18, further comprising a color filter, a color conversion layer, a touch screen layer, a polarizing layer, or a combination thereof.

20. An electronic equipment comprising the light-emitting device of claim 1, wherein the electronic equipment is a flat panel display, a curved display, a computer monitor, a medical monitor, a television, a billboard, an indoor light, an outdoor light, a signal light, a head-up display, a fully transparent display, a partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality display, an augmented reality display, a vehicle, a video wall with multiple displays tiled together, a theater screen, a stadium screen, a phototherapy device, or a signboard.

* * * * *